(12) United States Patent
Zhu et al.

(10) Patent No.: US 12,108,656 B2
(45) Date of Patent: Oct. 1, 2024

(54) EFFICIENT AND STABLE P-I-N STRUCTURED PEROVSKITE SOLAR CELLS

(71) Applicant: Alliance for Sustainable Energy, LLC, Golden, CO (US)

(72) Inventors: Kai Zhu, Littleton, CO (US); Qi Jiang, Golden, CO (US); Jinhui Tong, Wuhan (CN)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 18/321,136

(22) Filed: May 22, 2023

(65) Prior Publication Data

US 2023/0380266 A1  Nov. 23, 2023

Related U.S. Application Data

(60) Provisional application No. 63/344,265, filed on May 20, 2022.

(51) Int. Cl.
| | |
|---|---|
| *H10K 85/50* | (2023.01) |
| *C09K 11/02* | (2006.01) |
| *H10K 30/40* | (2023.01) |
| *H10K 30/50* | (2023.01) |
| *H10K 30/85* | (2023.01) |
| *H10K 71/20* | (2023.01) |

(52) U.S. Cl.
CPC ............ *H10K 85/50* (2023.02); *C09K 11/025* (2013.01); *H10K 30/40* (2023.02); *H10K 30/50* (2023.02); *H10K 30/85* (2023.02); *H10K 71/20* (2023.02)

(58) Field of Classification Search
CPC ........ H10K 85/50; H10K 30/85; H10K 30/50; H10K 30/40; H10K 71/20; C09K 11/025
See application file for complete search history.

(56) References Cited

PUBLICATIONS

Niu et al., "Advances in Dion-Jacobson phase two-dimensional metal halide perovskite solar cells", Nanophotonics 2021; 10(8): 2069-2102. (Year: 2021).*

Li et al., "Two-Dimensional Dion-Jacobson Hybrid Lead Iodide Perovskites with Aromatic Diammonium Cations", J. Am. Chem. Soc. 2019, 141, 12880-12890. (Year: 2019).*

Li et al., Supporting Information for "Two-dimensional Dion-Jacobson Hybrid Lead Iodide Perovskites with Aromatic Diammonium Cations", J. Am. Chem. Soc. 2019, 141, 12880-12890. (Year: 2019).*

(Continued)

*Primary Examiner* — Tae-Sik Kang
(74) *Attorney, Agent, or Firm* — Michael A. McIntyre

(57) ABSTRACT

The present disclosure relates to a composition that includes a perovskite having a surface, where the surface includes a pyridine compound. In some embodiments of the present disclosure, the pyridine compound may include an amine functional group. In some embodiments of the present disclosure, the pyridine compound may be selected from a group that includes N(2-methylpyridine)A, N(3-methylpyridine)A, N(4-(methyl)pyridine)A, N(3-(2-ethyl)pyridine)A, and N(4-(2-ethyl)pyridine)A, where A is a cation, and the pyridine compound has an ionic radius larger than 10 Å.

14 Claims, 37 Drawing Sheets

(56) References Cited

PUBLICATIONS

Yusoff et al., "Passivation and process engineering approaches of halide perovskite films for high efficiency and stability perovskite solar cells", Energy Environ. Sci., 2021, Accepted Manuscript, Published on Apr. 9, 2021, pp. 1-138. (Year: 2021).*

Al-Ashouri, A. et al., "Conformal monolayer contacts with lossless interfaces for perovskite single junction and monolithic tandem solar cells," Energy & Environmental Science, vol. 12, 2019, 14 pages.

Azmi, R. et al., "Damp heat-stable perovskite solar cells with tailored-dimensionality 2D/3D heterojunctions," Science, vol. 376, 2022, 6 pages.

Cao, Q. et al., "Efficient and stable inverted perovskite solar cells with very high fill factors via incorporation of star-shaped polymer," Science Advances, vol. 7, Jul. 7, 2021, 12 pages.

Chen, C. et al., "Arylammonium-Assisted Reduction of the Open-Circuit Voltage Deficit in Wide-Bandgap Perovskite Solar Cells: The Role of Suppressed Ion Migration," ACS Energy Letters, vol. 5, 2020, 9 pages.

Chen, S. et al., "Iodine reduction for reproducible and high-performance perovskite solar cells and modules," Science Advances, vol. 7, Mar. 3, 2021, 7 pages.

Choi, H. et al., "Conjugated polyelectrolyte hole transport layer for inverted-type perovskite solar cells," Nature Communications, 6:7348, Jun. 17, 2015, 6 pages.

Christians, J.A. et al., "Tailored interfaces of unencapsulated perovskite solar cells for >1,000 hour operational stability," Nature Energy, vol. 3, Jan. 2018, 7 pages.

Degani, M. et al., "23.7% Efficient inverted perovskite solar cells by dual interfacial modification," Science Advances, vol. 7, Dec. 1, 2021, 10 pages.

Gharibzadeh, S. et al., "Two birds with one stone: dual grain-boundary and interface passivation enables >22% efficient inverted methylammonium-free perovskite solar cells," Energy & Environmental Science, vol. 14, 2021, 9 pages.

Hsiao, Ming-Chuan et al., "Bidentate chelating ligands as effective passivating materials for perovskite light-emitting diodes," Phys. Chem. Chem. Phys., vol. 21, 2019, 7 pages.

Jang, Y-W et al., "Intact 2D/3D halide junction perovskite solar cells via solid-phase in-plane growth," Nature Energy, vol. 6, Jan. 2021, 12 pages.

Jiang, Q. et al., "Enhanced electron extraction using SnO2 for high-efficiency planar-structure HC(NH2)2PbI3-based perovskite solar cells," Nature Energy, vol. 2, Nov. 14, 2016, 7 pages.

Jung, E.H. et al., "Efficient, stable and scalable perovskite solar cells using poly (3-hexylthiophene)," Nature Letter, vol. 567, Mar. 28, 2019, 19 pages.

Kim, G. et al., "Impact of strain relaxation on performance of α-formamidinium lead iodide perovskite solar cells," Science, vol. 370, Oct. 2, 2020, 6 pages.

Kim, M. et al., "Conformal quantum dot-SnO2 layers as electron transporters for efficient perovskite solar cells," Science, vol. 375, Jan. 21, 2022, 6 pages.

Li, F. et al., "Regulating Surface Termination for Efficient Inverted Perovskite Solar Cells with Greater Than 23% Efficiency," Journal of American Chemical Society, vol. 142, 2020, 9 pages.

Li, G. et al., "Efficient and Stable 2D@3D/2D Perovskite Solar Cells Based on Dual Optimization of Grain Boundary and Interface," ACS Energy Letters, vol. 6, 2021, 10 pages.

Li, X. et al., "Two-Dimensional Dion-Jacobson Hybrid Lead Iodide Perovskites With Aromatic Diammonium Cations," Journal of the American Chemical Society, vol. 141, 2019, 11 pages.

Li, X. et al., "Three-Dimensional Lead Iodide Perovskitoid Hybrids with High X-ray Photoresponse," Journal of the American Chemical Society, vol. 142, 2020, 13 pages.

Li, X. et al., "Bismuth/Silver-Based Two-Dimensional Iodide Double and One-Dimensional Bi Perovskites: Interplay between Structural and Electronic Dimensions," Chemistry of Materials, vol. 33, 2021, 11 pages.

Li, X. et al., "Constructing heterojunctions by surface sulfidation for efficient inverted perovskite solar cells," Science, vol. 375, 2022, 5 pages.

Li, Y. et al., "4-(Aminoethyl)pyridine as a Bifunctional Spacer Cation for Efficient and Stable 2D Ruddlesden-Popper Perovskite Solar Cells," Applied Materials & Interfaces, vol. 11, 2019, 8 pages.

Luo, D. et al., "Enhanced photovoltage for inverted planar heterojunction perovskite solar cells," Science, vol. 360, 2018, 6 pages.

Min, H. et al., "Perovskite solar cells with atomically coherent interlayers on SnO2 electrodes," Nature, vol. 598, Oct. 21, 2021, 20 pages.

Saliba, M. et al., "Incorporation of rubidium cations into perovskite solar cells improves photovoltaic performance," Science, vol. 354, Issue 6309, Oct. 14, 2016, 5 pages.

Wu, X. et al., "Efficient perovskite solar cells via surface passivation by a multifunctional small organic ionic compound," Journal of Materials Chemistry A, vol. 8, 2020, 10 pages.

Xiao, C. et al., "Junction Quality of SnO2-Based Perovskite Solar Cells Investigated by Nanometer-Scale Electrical Potential Profiling," ACS Applied Materials & Interfaces, vol. 9, 2017, 8 pages.

Yang, S. et al., "Stabilizing halide perovskite surfaces for solar cell operation with wide-bandgap lead oxysalts," Science, vol. 365, 2019, 7 pages.

Zheng, X. et al., "Defect passivation in hybrid perovskite solar cells using quaternary ammonium halide anions and cations," Nature Energy, vol. 2, 2017, 9 pages.

Zhu, H. et al., "Synergistic Effect of Fluorinated Passivator and Hole Transport Dopant Enables Stable Perovskite Solar Cells with an EfficiencyNeaer 24%," Journal of the American Chemical Society, vol. 143, 2021, 7 pages.

* cited by examiner

A B X

A

α-ABX$_3$

B

β-ABX$_3$

C

γ-ABX$_3$

A

B

EFFICIENT AND STABLE P-I-N STRUCTURED PEROVSKITE SOLAR CELLS

CROSS-REFERENCE TO RELATED APPLICATIONS

This application claims priority from U.S. Provisional Patent Application Nos. 63/344,265 filed on May 20, 2022, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

BACKGROUND

During the past decade, perovskite solar cells (PSCs) have been widely studied as a promising alternative photovoltaic (PV) technology with rapid progress in device performance. Currently, the record single-junction PSC efficiencies are all based on n-i-p cell architectures, which are associated with the fully optimized electron transport layer (ETL) and high-quality, lower-bandgap (~1.5 eV) perovskite absorber. However, the standard doped hole transport layer (HTL) in the n-i-p structure presents a challenge for simultaneously achieving both high efficiency and excellent operational reliability. The p-i-n (or inverted) cell structure represents another commonly studied PSC architecture, an attractive option for PSC commercialization owing to its low-temperature processing and compatibility with large-scale fabrication. However, at present, the certified power conversion efficiency (PCE) based on stabilized power output is 22.62% for p-i-n, in comparison to 25.7% for n-i-p, while a third-party-verified current density-voltage (J-V) measurement has reached 23.5% for p-i-n. This performance gap is large, and the p-i-n PSC is far from being optimized. Thus, significant efforts are required to accelerate p-i-n PSC development to its full potential for various applications.

SUMMARY

An aspect of the present disclosure is a composition that includes a perovskite having a surface, where the surface includes a pyridine compound. In some embodiments of the present disclosure, the pyridine compound may include an amine functional group. In some embodiments of the present disclosure, the pyridine compound may be selected from a group that includes N(2-methylpyridine)A, N(3-methylpyridine)A, N(4-(methyl)pyridine)A, N(3-(2-ethyl)pyridine)A, and N(4-(2-ethyl)pyridine)A, where A is a cation, and the pyridine compound has an ionic radius larger than 10 Å.

In some embodiments of the present disclosure, A may be selected from the group of methylammonium, ethylammonium, diethylammonium, guanidinium, and/or formamidinium. In some embodiments of the present disclosure, the pyridine compound may include at least one of N(2-methylpyridine)formamidinium, N(3-methylpyridine)formamidinium, N(4-(methyl)pyridine)formamidinium, N(3-(2-ethyl)pyridine)formamidinium, and/or N(4-(2-ethyl)pyridine)formamidinium.

In some embodiments of the present disclosure, the pyridine compound may include at least one of

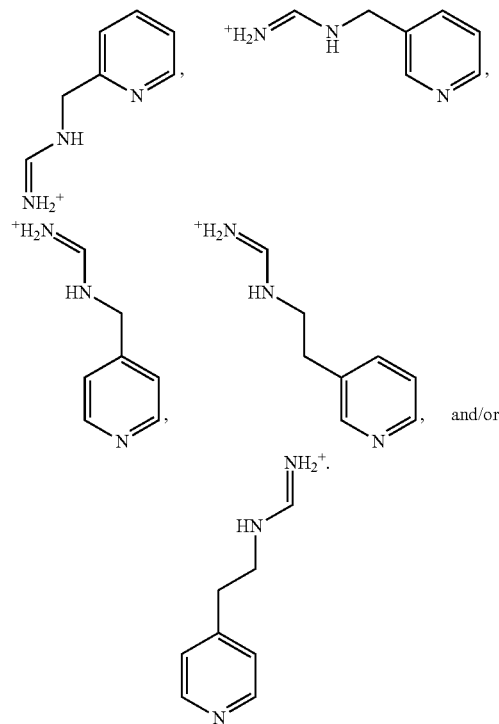

In some embodiments of the present disclosure, the presence of the pyridine compound may be determined by proton nuclear magnetic resonance ($^1$H-NMR) spectroscopy. In some embodiments of the present disclosure, the surface may be n-type as determined by at least one of X-ray photoelectron spectroscopy (XPS) and/or ultraviolet photoelectron spectroscopy (UPS).

In some embodiments of the present disclosure, the perovskite may have the shape of a layer. In some embodiments of the present disclosure, the layer may have a thickness between 50 nm and 5000 nm. In some embodiments of the present disclosure, the thickness may be between 30 nm and 1000 nm. In some embodiments of the present disclosure, the pyridine compound may be present at the surface of the perovskite layer as a layer. In some embodiments of the present disclosure, pyridine compound layer may have a thickness greater than 5 Å.

In some embodiments of the present disclosure, the surface may have a surface roughness of less than or equal to 1 nm, as measured over a length scale between 10 nm and 20 nm, as measured by atomic force microscopy (AFM). In some embodiments of the present disclosure, the surface may have a surface potential fluctuation of less than 20 mV, as measured over a length scale between 10 nm and 20 nm, as measured by Kelvin probe force microscopy (KPFM). In some embodiments of the present disclosure, the perovskite may include at least one of a three-dimensional (3-D) network, a two-dimensional (2-D) network, a one-dimensional (1-D), and/or a zero-dimensional (0-D) network.

An aspect of the present disclosure is a device that includes a perovskite layer; and an electron transfer layer (ETL), where the surface of the perovskite layer forms an interface with the ETL, the surface includes a pyridine compound, and the surface has a surface roughness less than or equal to 1 nm, as measured over a length scale between 10 nm and 20 nm, as measured by atomic force microscopy (AFM). In some embodiments of the present disclosure, the surface may be characterized by surface potential fluctuations of less than 20 mV, as measured over a length scale between 10 nm and 20 nm.

An aspect of the present disclosure method that includes treating a surface of a perovskite layer with an amine-functionalized pyridine, where the treating reduces at least one of the surface roughness of the surface as measured by atomic force microscopy (AFM) and/or the surface potential fluctuations as measured by Kelvin probe force microscopy (KPFM). In some embodiments of the present disclosure, the surface roughness may be less than or equal to 1 nm, as measured over a length scale between 10 nm and 20 nm.

BRIEF DESCRIPTION OF THE DRAWINGS

Some embodiments are illustrated in referenced figures of the drawings. It is intended that the embodiments and figures disclosed herein are to be considered illustrative rather than limiting.

REFERENCE NUMBERS

Figure 1A:
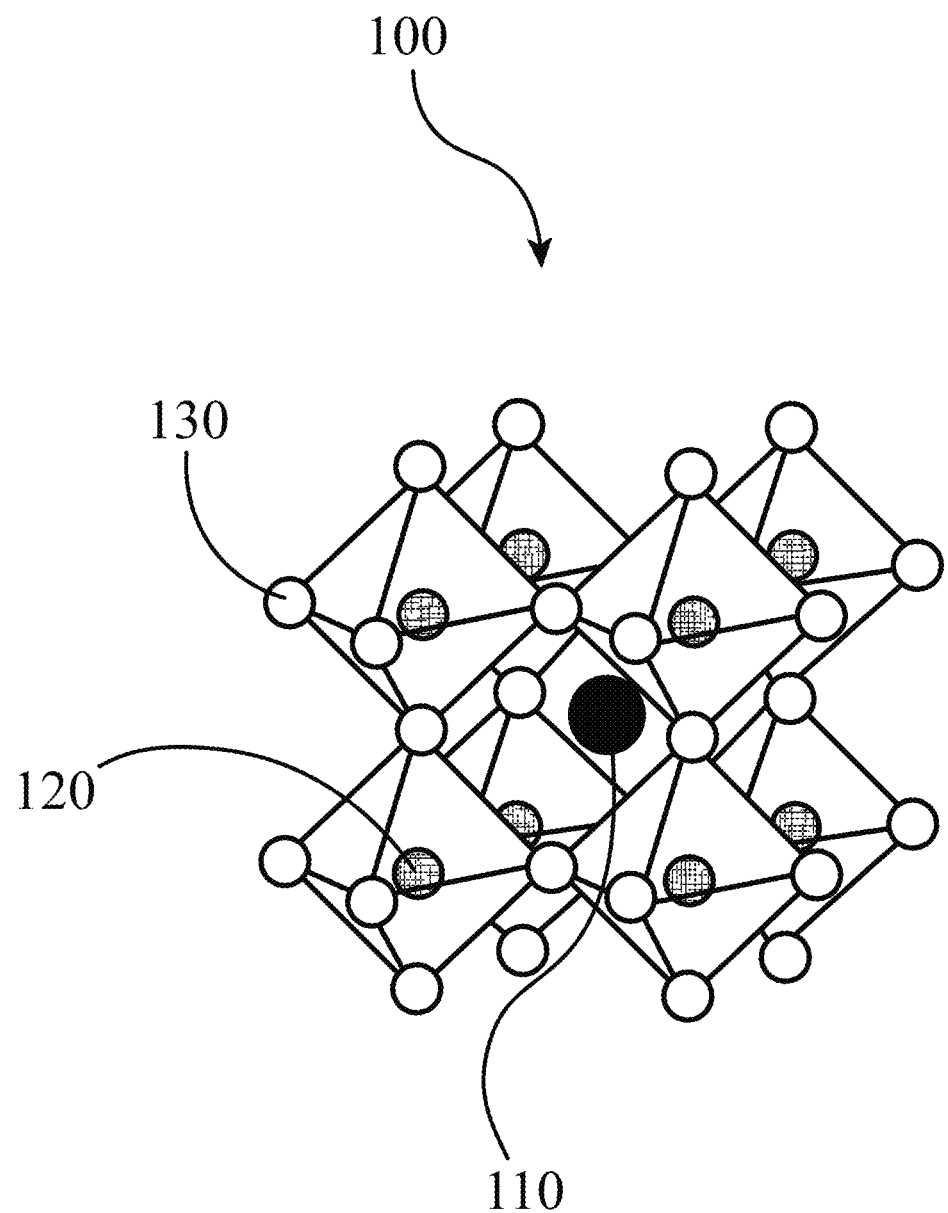
FIGS. 1A and 1B illustrate a perovskite in a corner-sharing, cubic phase arrangement, according to some embodiments of the present disclosure.

100 . . . perovskite
110 . . . A-cation
120 . . . B-cation
130 . . . X-anion
500 . . . device
510 . . . first electrode
520 . . . hole transport layer (HTL)
530 . . . perovskite layer
540 . . . surface/interface
550 . . . electron transport layer (ETL)
560 . . . second electrode

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

Figure 1B:
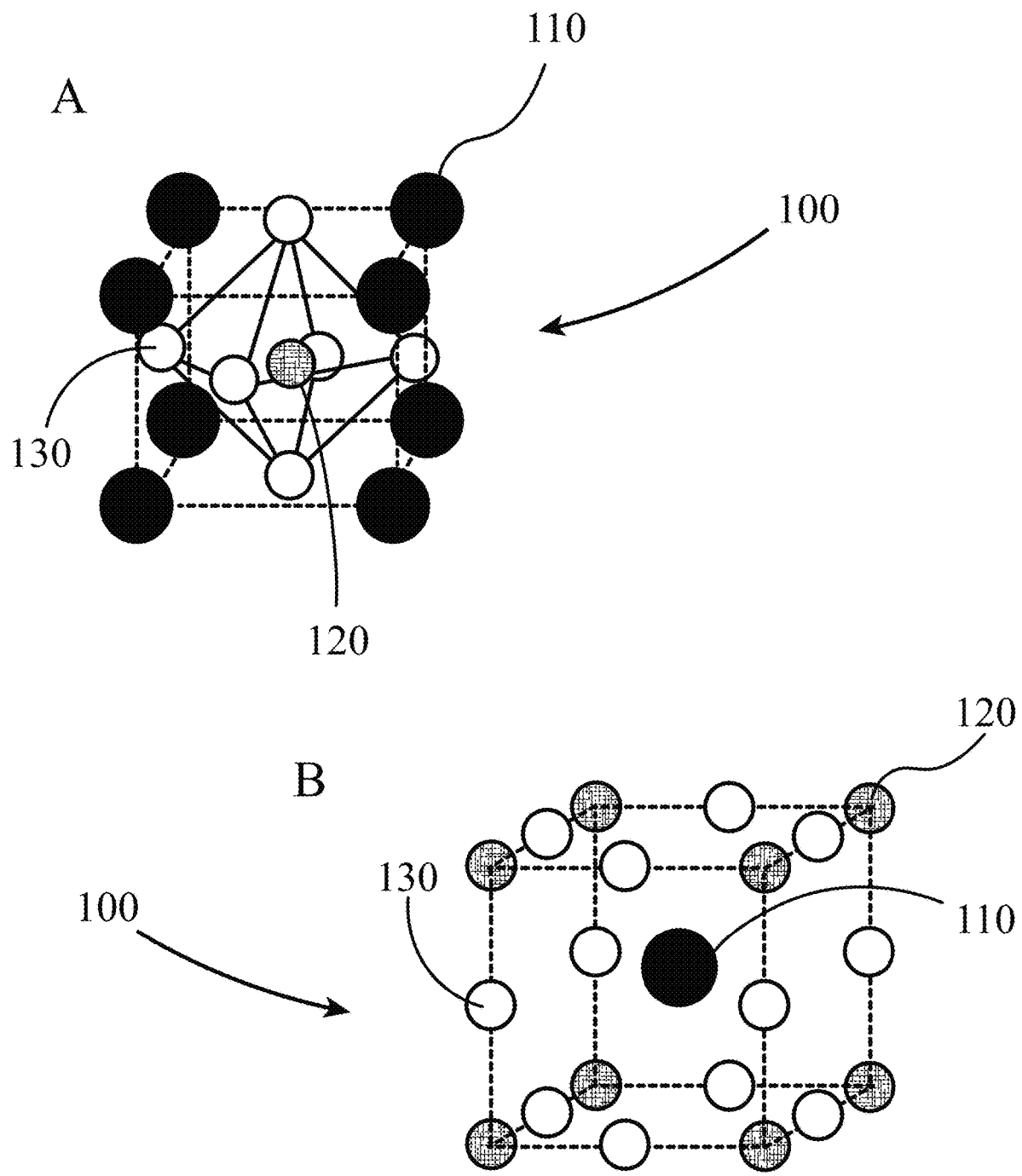

In general, the term "perovskite" refers to compositions having a network of corner-sharing $BX_6$ octahedra resulting in the general stoichiometry of $ABX_3$. FIGS. 1A and 1B illustrate that perovskites 100, for example metal halide perovskites, may organize into a three-dimensional (3D) cubic crystalline structures (i.e., α-phase or α-$ABX_3$) constructed of a plurality of corner-sharing $BX_6$ octahedra. In the general stoichiometry for a perovskite, $ABX_3$, X (130) is an anion and A (110) and B (120) are cations, typically of different sizes. FIG. 1A illustrates that a perovskite 100 having an α-phase structure may be further characterized by eight $BX_6$ octahedra surrounding a central A-cation 110, where each octahedra is formed by six X-anions 130 surrounding a central B-cation 120 and each of the octahedra are linked together by "corner-sharing" of anions, X (130).

Panel A of FIG. 1B provides another visualization of a perovskite 100 in the α-phase, also referred to as the cubic phase. This is because, as shown in FIG. 1B, a perovskite in the α-phase may be visualized as a cubic unit cell, where the B-cation 120 is positioned at the center of the cube, an A-cation 110 is positioned at each corner of the cube, and an X-anion 130 is face-centered on each face of the cube. Panel B of FIG. 1B provides another visualization of the cubic unit cell of an α-phase perovskite, where the B-cation 120 resides at the eight corners of a cube, while the A-cation 110 is located at the center of the cube and with 12 X-anions 130 centrally located between B-cations 120 along each edge of the unit cell. For both unit cells illustrated in FIG. 1B, the A-cations 110, the B-cations 120, and the X-anions 130 balance to the general formula $ABX_3$ of a perovskite, after accounting for the fractions of each atom shared with neighboring unit cells. For example, referring to Panel A of FIG. 1B, the single B-cation 120 atom is not shared with any of the neighboring unit cells. However, each of the six X-anions 130 is shared between two unit cells, and each of the eight A-cations 110 is shared between eight unit cells. So, for the unit cell shown in Panel A of FIG. 1B, the stoichiometry simplifies to B=1, A=8*0.125=1, and X=6*0.5=3, or $ABX_3$. Similarly, referring again to Panel B of FIG. 1B, since the A-cation is centrally positioned, it is not shared with any of the unit cells neighbors. However, each of the 12 X-anions 130 is shared between four neighboring unit cells, and each of the eight B-cations 120 is shared between eight neighboring unit cells, resulting in A=1, B=8*0.125=1, and X=12*0.25=3, or $ABX_3$. Referring again to Panel B of FIG. 1B, the X-anions 130 and the B-cations 120 of a perovskite in the α-phase are aligned along an axis; e.g., where the angle at the X-anion 130 between two neighboring B-cations 120 is exactly 180 degrees, referred to herein as the tilt angle. However, as shown in FIG. 2A, a perovskite 100 may assume other corner-sharing crystalline phases having tilt angles not equal to 180 degrees.

Figure 2A:
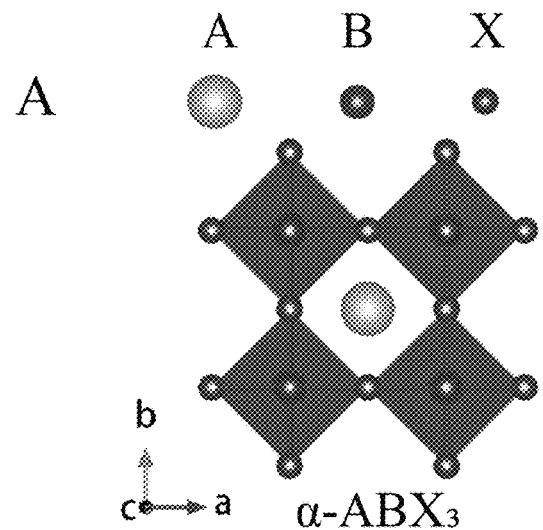
FIG. 2A illustrates three possible corner-sharing phases for perovskites, Panel A cubic phase (i.e., $\alpha$-ABX$_3$), Panel B a tetragonal crystalline phase (i.e., $\beta$-ABX$_3$), and Panel C an orthorhombic crystalline phase (i.e., $\gamma$-ABX$_3$), according to some embodiments of the present disclosure.
Figure 2A:
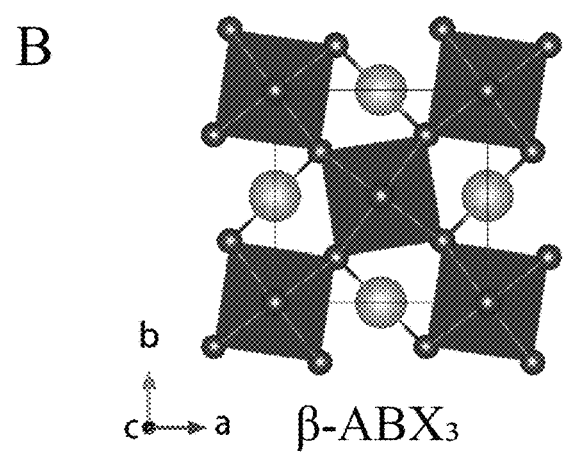
Figure 2A:
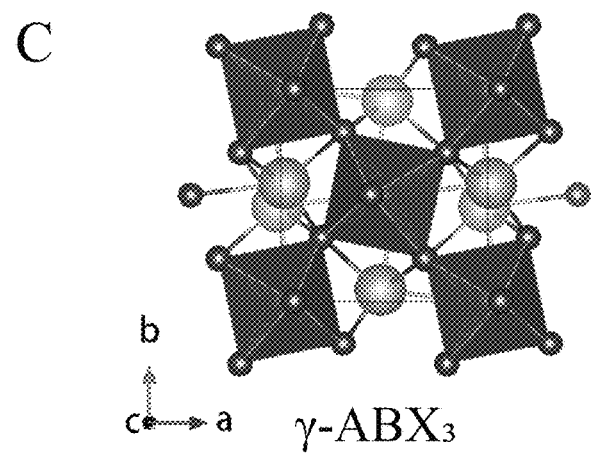

FIG. 2A illustrates that a perovskite can assume other crystalline forms while still maintaining the criteria of an $ABX_3$ stoichiometry with neighboring $BX_6$ octahedra maintaining X anion (130) corner-sharing. Thus, in addition to α-$ABX_3$ perovskites (in the cubic phase) having a tilt angle of 180 degrees, shown in Panel A of FIG. 2A, a perovskite may also assume a tetragonal crystalline phase (i.e., β-$ABX_3$) (see Panel B of FIG. 2A) and/or an orthorhombic crystalline phase (i.e., γ-$ABX_3$) (see Panel C of FIG. 2A), where the adjacent octahedra are tilted relative to the reference axes a, b, and c.

Figure 2B:
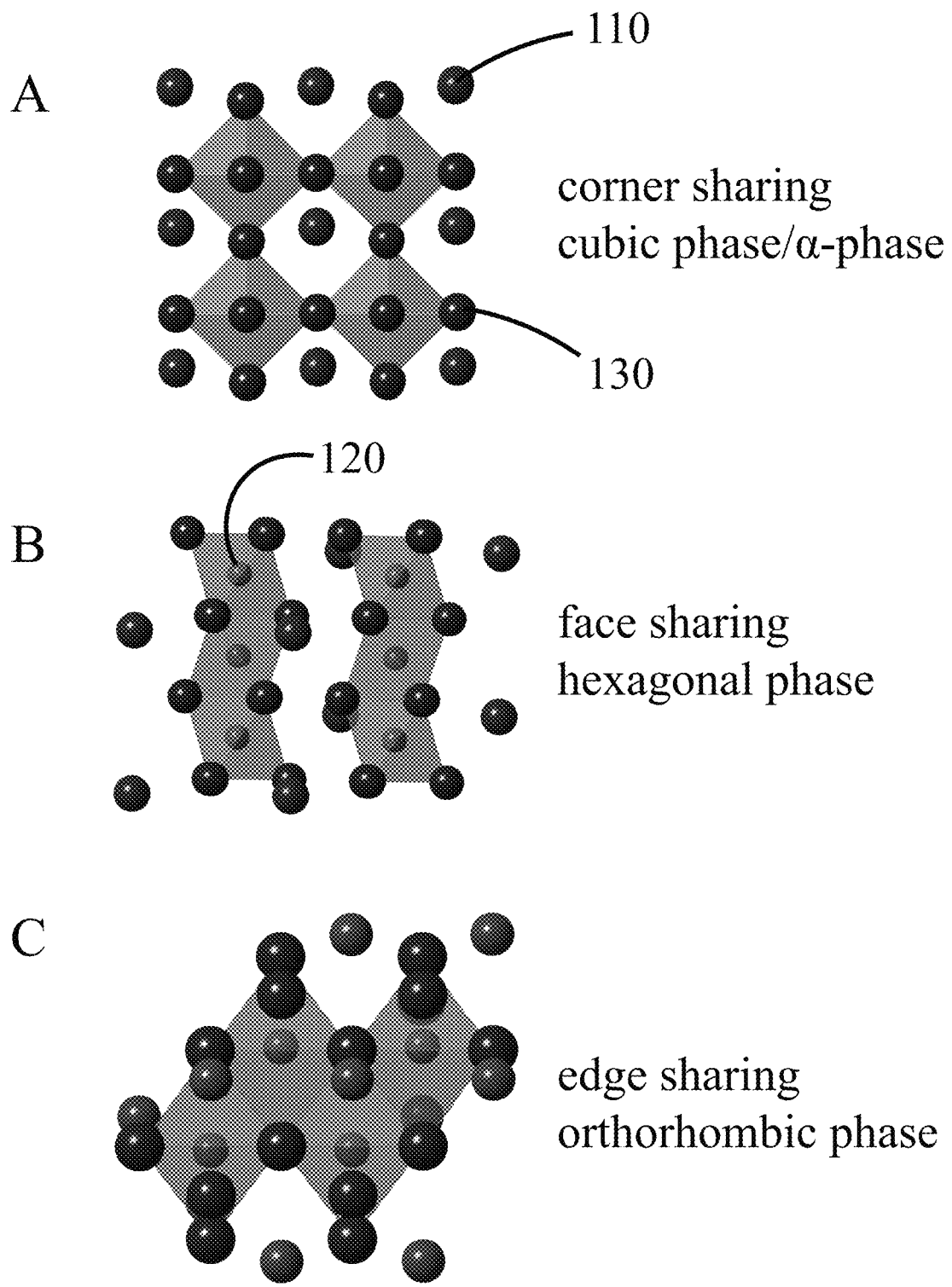
FIG. 2B illustrates a perovskite in one of the three possible phases, the cubic phase (i.e., $\alpha$-phase), compared to two non-perovskite phases (i.e., non-corner sharing), according to some embodiments of the present disclosure.

FIG. 2B illustrates that the elements used to construct a perovskite, as described above, A-cations 110, B-cations 120, and X-anions 130, may result in 3D non-perovskite structures; i.e., structures where neighboring $BX_6$ octahedra are not X-anion 130 corner-sharing and/or do not have a unit structure that simplifies to the $ABX_3$ stoichiometry. Referring to FIG. 2B, Panel A illustrates a perovskite in the cubic phase, i.e., α-$ABX_3$, compared to a non-perovskite structure constructed of face-sharing $BX_6$ octahedra resulting in a hexagonal crystalline structure (see Panel B of FIG. 2B) and a non-perovskite structure constructed of edge-sharing $BX_6$ octahedra resulting in an orthorhombic crystalline structure (see Panel C of FIG. 2B).

Figure 3:
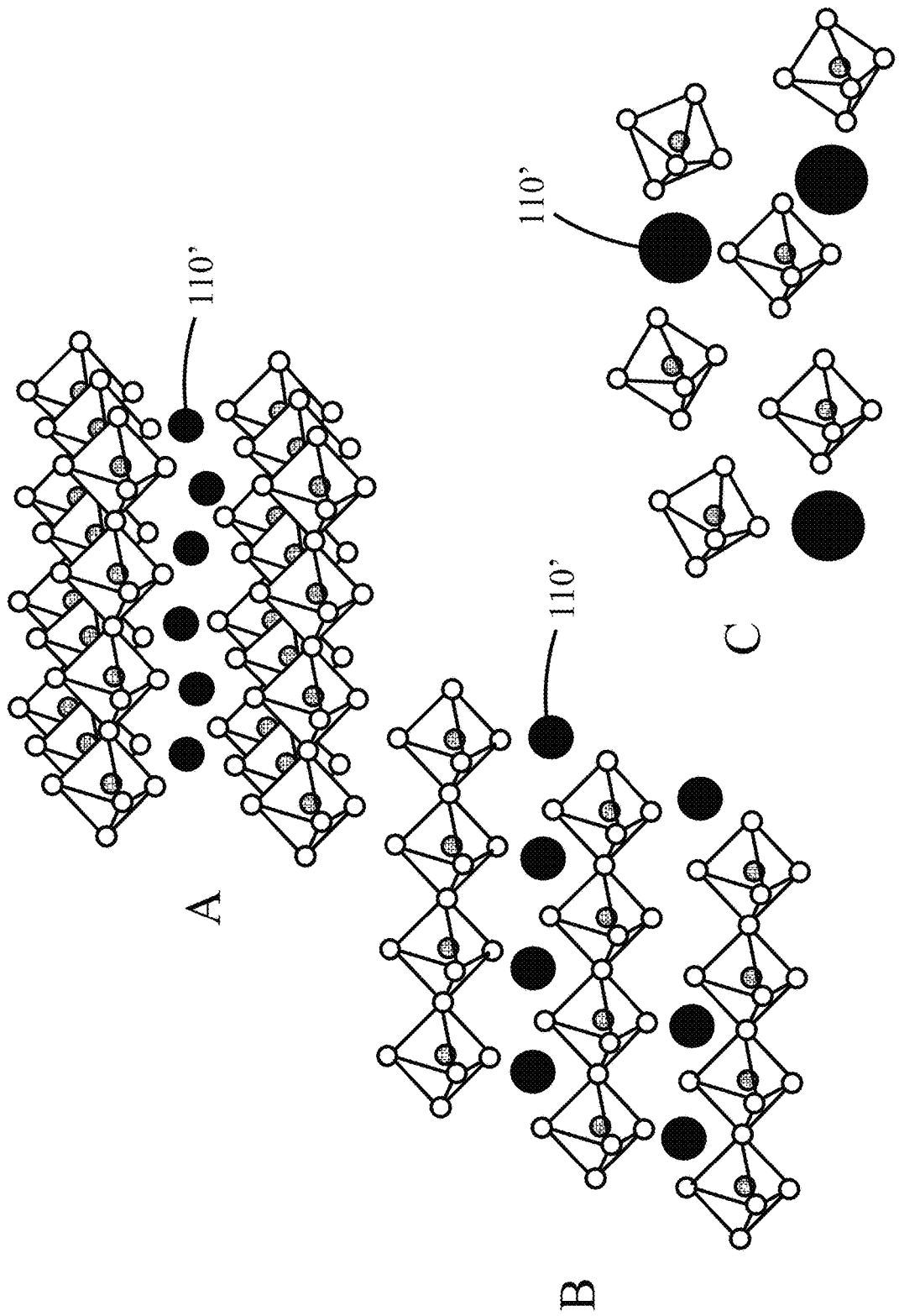
FIG. 3 illustrates 2D, 1D, and 0D perovskite-like structures, in Panels A, B, and C, respectively, according to some embodiments of the present disclosure.

Further, referring now to FIG. 3, the elements used to construct a perovskite, as described above, A-cations 110, B-cations 120, and X-anions 130, may result in non-3D (i.e., lower dimensional structures) perovskite-like structures such as two-dimensional (2D) structures, one-dimensional (1D) structures, and/or zero-dimensional (0D) structures. As shown in FIG. 3, such lower dimensional, perovskite-like structures still include the $BX_6$ octahedra, and depending on the dimensionality, e.g., 2D or 1D, may still maintain a degree of X-anion corner-sharing. However, as shown in FIG. 3, the X-anion 130 corner-sharing connectivity of neighboring octahedra of such lower dimensional structures, i.e., 2D, 1D, and 0D, is disrupted by intervening A-cations 110. Such a disruption of the neighboring octahedra, can be achieved by, among other things, varying the size of the intervening A-cations 110.

Referring to Panel A of FIG. 3, a 3D perovskite may be transformed to a 2D perovskite-like structure, 1D perovskite-like structure, and/or 0D perovskite-like structure. Where the degree of X-anion 130 corner sharing decreases and the stoichiometry changes according to the formula $(A')_m(A)_{n-1}B_nX_{3n+1}$, where monovalent (m=2) or divalent (m=1) A' cations 110' can intercalate between the X-anions of 2D perovskite-like sheets. Referring to Panel B of FIG. 3, 1D perovskite-like structures are constructed by $BX_6$ octahedral chained segments spatially isolated from each other by surrounding bulky organic A'-cations 110', leading to bulk assemblies of paralleled octahedral chains. Referring to Panel C of FIG. 3, typically, the 0D perovskite-like structures are constructed of isolated inorganic octahedral clusters and surrounded by small A'-cations 110', which may be connected via hydrogen bonding. In general, as n approaches infinity the structure is a pure 3D perovskite and when n is equal to 1, the structure is a pure 2D perovskite-like structure. More specifically, when n is greater than 10 the structure is considered to be essentially a 3D perovskite material and when n is between 1 and 5, inclusively, the structure is considered substantially a 2D perovskite-like material. For simplification, as used herein the term "perovskite" will refer to each of the structures illustrated in FIGS. 1A through 3, unless specified otherwise.

In some embodiments of the present invention, the A-cation 110 may include a nitrogen-containing organic compound such as an alkyl ammonium compound. The B-cation 120 may include a metal and the X-anion 130 may include a halogen. Additional examples for the A-cation 110 include organic cations and/or inorganic cations, for example Cs, Rb, K, Na, Li, and/or Fr. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium ($CH_3NH_3^+$), ethylammonium ($CH_3CH_2NH_3^+$), propylammonium ($CH_3CH_2CH_2NH_3^+$), butylammonium ($CH_3CH_2CH_2CH_2NH_3^+$), formamidinium ($NH_2CH=NH_2^+$), hydrazinium, acetylammonium, dimethylammonium, imidazolium, guanidinium, benzylammonium, phenethylammonium, butylammonium and/or any other suitable nitrogen-containing or organic compound. In other examples, an A-cation 110 may include an alkylamine. Thus, an A-cation 110 may include an organic component with one or more amine groups. For example, an A-cation 110 may be an alkyl diamine halide such as formamidinium ($CH(NH_2)_2$). Thus, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Examples of metal B-cations 120 include, for example, lead, tin, germanium, and or any other 2+ valence state metal that can charge-balance the perovskite 100. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 130 include halogens: e.g., fluorine, chlorine, bromine, iodine and/or astatine. In some cases, the perovskite halide may include more than one X-anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cation 120, and X-anion 130 may be selected within the general formula of $ABX_3$ to produce a wide variety of perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite 100 may have more than one halogen element, where the various halogen elements are present in non-integer quantities; e.g., x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure. As described herein, the A-cation 110 of a perovskite 100, may include one or more A-cations, for example, one or more of cesium, FA, MA, etc. Similarly, the B-cation 120 of a perovskite 100, may include one or more B-cations, for example, one or more of lead, tin, germanium, etc. Similarly, the X-anion 130 of a perovskite 100 may include one or more anions, for example, one or more halogens (e.g., at least one of I, Br, Cl, and/or F), thiocyanate, and/or sulfur. Any combination is possible provided that the charges balance.

For example, a perovskite having the basic crystal structure illustrated in FIGS. 1A and 1B, in at least one of a cubic, orthorhombic, and/or tetragonal structure, may have other compositions resulting from the combination of the cations having various valence states in addition to the 2+ state and/or 1+ state described above for lead and alkyl ammonium cations; e.g., compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B^{3+}X_6$, with an example of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations.

The present disclosure relates to, among other things, methods for manufacturing high performance and stable p-i-n (i.e., inverted) perovskite-containing solar cells by modifying the surface of a perovskite and/or the interface resulting from the depositing of another layer onto a perovskite layer. Specifically, shown herein is that treating the surface of a perovskite layer with an amine-functionalized pyridine molecule can significantly improve the surface characteristics, including morphology, of the perovskite surface. The improved surface morphology of the perovskite subsequently results in the formation of a better performing interface upon deposition of a layer onto the treated perovskite surface, for example an electron transfer layer (ETL). As shown herein, this modifying may be achieved by applying a liquid solution containing the amine-functionalized pyridine molecule onto the perovskite layer, followed by a heat-treating step until dry; e.g., until substantially or all of the liquid solution has been removed (evaporated). In some embodiments of the present disclosure, an amine-functionalized pyridine molecule may be applied using a vapor-phase technique. For example, a solution with an exemplary amine-functionalized pyridine molecule, 3-(aminomethyl)pyridine (3-APy) diluted with toluene (0.1 mM) was spin-coated on the perovskite surface at 5000 r.p.m. for 30 seconds, followed by annealing at 70° C. for 5 minutes, resulting in a perovskite with a treated surface. In some embodiments of the present disclosure, atomic layer deposition (ALD) may be used to regulate the amount of an amine-functionalized pyridine molecule (e.g., 3-APy) vapor provided to a surface of a perovskite layer.

Figure 4:
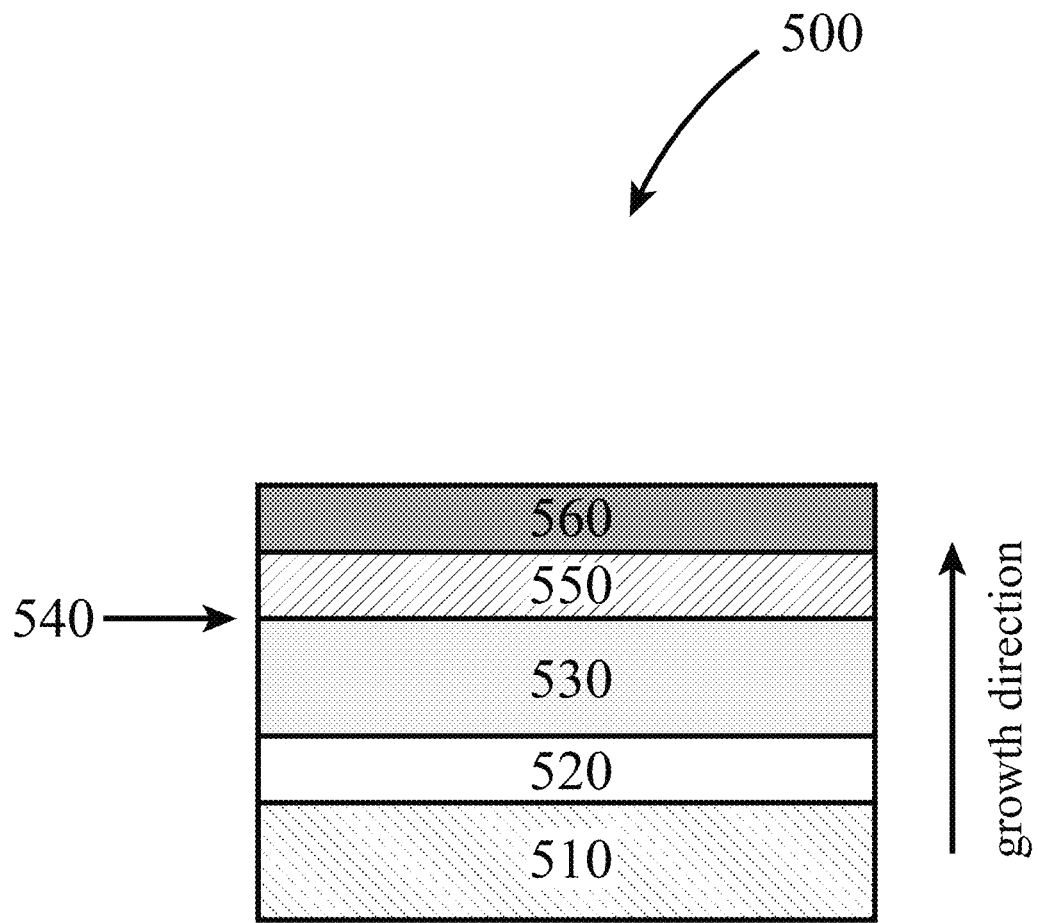
FIG. 4 illustrates a device fabricated using methods like those described herein, according to some embodiments of the present disclosure.

FIG. 4 illustrates an exemplary device 500, e.g., a solar cell, constructed of several layers. This device 500 includes a perovskite layer 530 positioned between a hole transport layer (HTL) 520 and an electron transport layer (ETL) 550. A treated perovskite surface 540, which becomes one of two surfaces forming an interface upon depositing the ETL 550 onto the treated perovskite is indicated by the horizontal arrow, with the ETL providing the second of the two surfaces forming the interface. In some embodiments of the present disclosure, the amine-functionalized pyridine molecule may react with at least one of the two surfaces, such that new species are formed at the interface. In addition, the device 500 may include a first electrode 510 and a second electrode 550, with the HTL 520 positioned between the perovskite layer 530 and the first electrode 510 and the ETL 540 positioned between the perovskite layer 530 and the second electrode 560. The growth direction is indicated by the vertical arrow, starting with the depositing of the HTL 520 onto the first electrode 510 and concluding with the depositing of the second electrode 560 onto the ETL 550.

Structure 1 illustrates a generalized structure for an amine-functionalized pyridine, which may be used to treat the surface of a perovskite layer, as described herein.

Structure 1

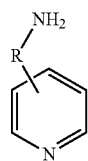

In some embodiments of the present disclosure, the R group of Structure 1 may include a hydrocarbon chain. In some embodiments of the present disclosure, the R group may be a straight hydrocarbon chain or a branched hydrocarbon chain. In some embodiments of the present disclosure, the R group may be a saturated hydrocarbon chain or an unsaturated hydrocarbon chain. In some embodiments of the present disclosure, the R group may be a hydrocarbon chain having between 1 and 20 carbon atoms. In some embodiments of the present disclosure, the R group may include, in addition to carbon and hydrogen, another element including at least one of nitrogen or oxygen. In some embodiments of the present disclosure, the R group may simply be a covalent bond linking the aromatic ring to the amine group. In some embodiments of the present disclosure, the R group may be —$CH_2$—.

In some embodiments of the present disclosure, an amine functionalize pyridine may include at least one of 2-(aminomethyl)pyridine (2-APy), 3-(aminomethyl)pyridine (3-APy), 4-(aminomethyl)pyridine (4-APy), 3-(2-aminoethyl)pyridine (3-AEPy), and/or 4-(2-aminoethyl)pyridine (4-AEPy). Each of these molecules are shown in Scheme 1 below.

Scheme 1

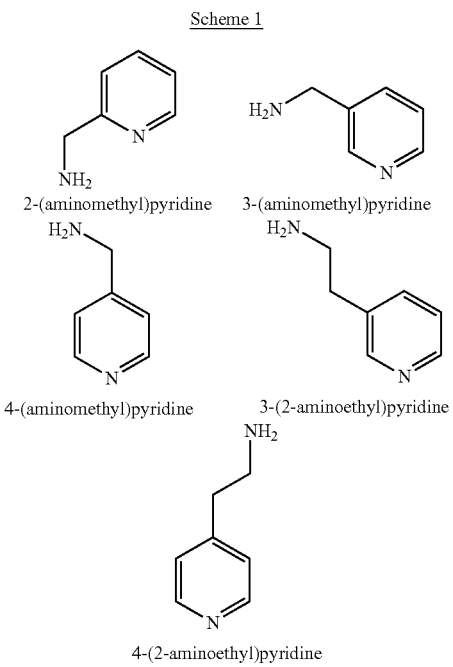

Referring again to FIG. 4, a perovskite layer 530 includes an A-cation (reference numeral 110 in FIG. 1), which may include at least one of an alkylammonium and/or formamidinium (FA). Examples of alkylammonium A-cations include methylammonium (MA), ethylammonium, and dimethylammonium. Inorganic cations that may also be included in a perovskite composition include cesium and rubidium. Without wishing to be bound by theory, when treating the surface of a perovskite containing FA with 3-APy, the following reaction (Reaction 1) may occur, an ammonia condensation reaction between a primary amine, e.g., 3-(aminomethyl)pyridine (3-APY), and formamindinium ($FA^+$, simplified herein to just FA) to form a larger cation, N(3-methylpyridine)formamidinium ($MPyFA^+$):

Reaction 1

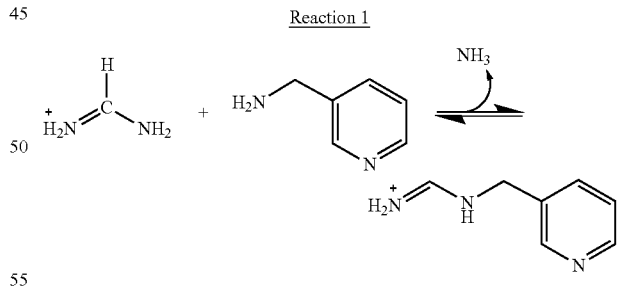

Similar reactions with the other pyridine compounds illustrated in Scheme 1, will result in the formation of N(2-methylpyridine)formamidinium, N(4-(methyl)pyridine)formamidinium, N(3-(2-ethyl)pyridine)formamidinium, and N(4-(2-ethyl)pyridine)formamidinium, respectively.

Figure 5:
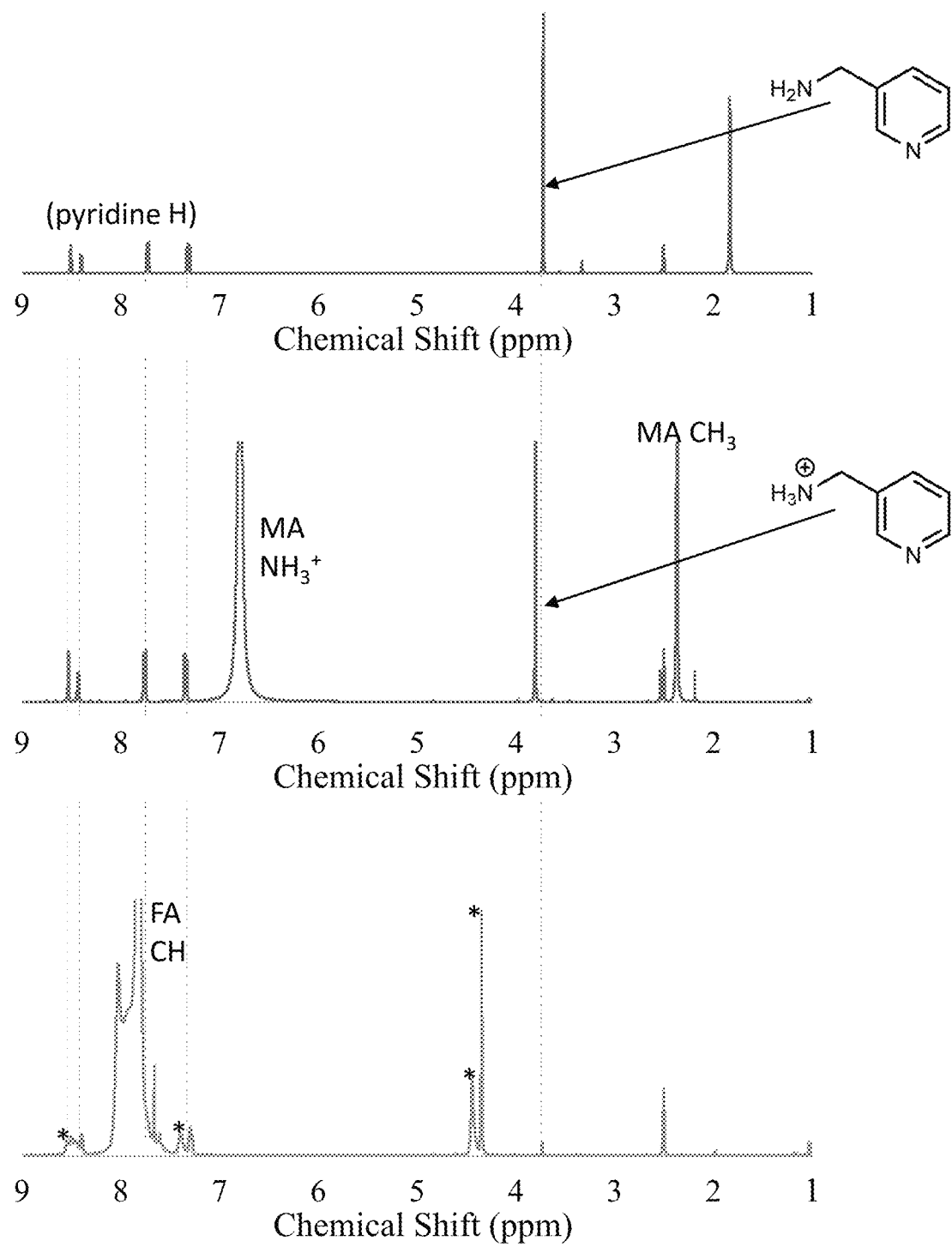
FIG. 5 illustrates $^1$H-NMR spectra of (top to bottom) 3-APy (0.01 M), MAI with 3-APy (0.1 M and 0.01 M, respectively), and FAI with 3-APy (0.1 M and 0.01 M, respectively), according to some embodiments of the present disclosure. Reactions resulting in large proton peak shifts or new peaks (marked with *) are only observed for FAI+3-APy. 400 MHz in DMSO-d6 stored on sieves (ultra-dry).

$^1$H-NMR was performed to support the proposed reaction products for 3-APy. FIG. 5 illustrates the spectra of 3-APy, MAI+3-APy, and FAI+3-APy in DMSO-d6. It is clear from these data that $FA^+$ and 3-APy react to form a unique product, whereas MAI and 3-APy simply exchange acidic NH protons. Our results show that a reaction has nearly fully occurred between FA⁺ and 3-APy within 10 minutes at room temperature, which does not rule out a faster reaction time, as this is the minimum amount of time it takes to go from sample preparation to completing the measurement.

Before concluding these data as direct evidence for the proposed surface mechanism, quantitative integration proving a 1:2:3 H-shift ratio of the protons involved in the condensation reaction product was desired (MPyFA, see Reaction 1 above). Unfortunately, clean integration of chemical shifts ascribed to these protons is complicated by the FA "formic" CH peak and broad NH proton peaks overlapping with the MPyFA formic proton. Additionally, the $NH_3$ chemical shifts are un-resolvable at this pH and temperature given how rapidly proton exchange is occurring.

To overcome the inability to resolve $NH_3$ shifts under these conditions, as well as sharpen each fingerprint proton shift to allow for clean integration, an HI spiking technique was employed. $NH_3/NH_4^+$ would otherwise be invisible to ¹H-NMR due to rapid acidic proton exchange enabled by the addition of amine (3-APy). The HI caused the protonation of all species in solution, including $NH_3$, to form $NH_4^+$, so it could then be detected due to reduced proton exchange rate.

Figure 6:
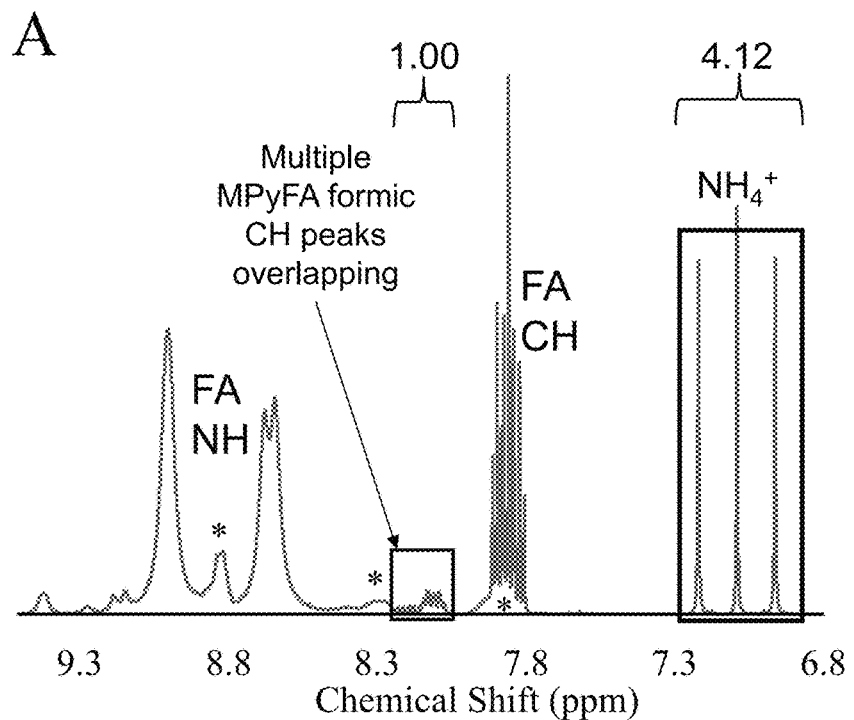
FIG. 6 illustrates (Panel A) downfield and (Panel B) upfield $^1$H-NMR of the FAI+3-APy after spiking with 2 μL HI, according to some embodiments of the present disclosure. The "formic" C—H protons in the products are identified slight downfield from the FA CH, and display the similar fine-splittings as the FA CH. The NH$_4^+$ is visible as a triplet with ~51 Hz splitting centered near 7.1 ppm. The methylene —CH$_2$— protons corresponding to different isomers for the MPyFA product are located 4.6-4.9 ppm in (b). 400 MHz in DMSO-d6. *=pyridine peaks.
Figure 6:
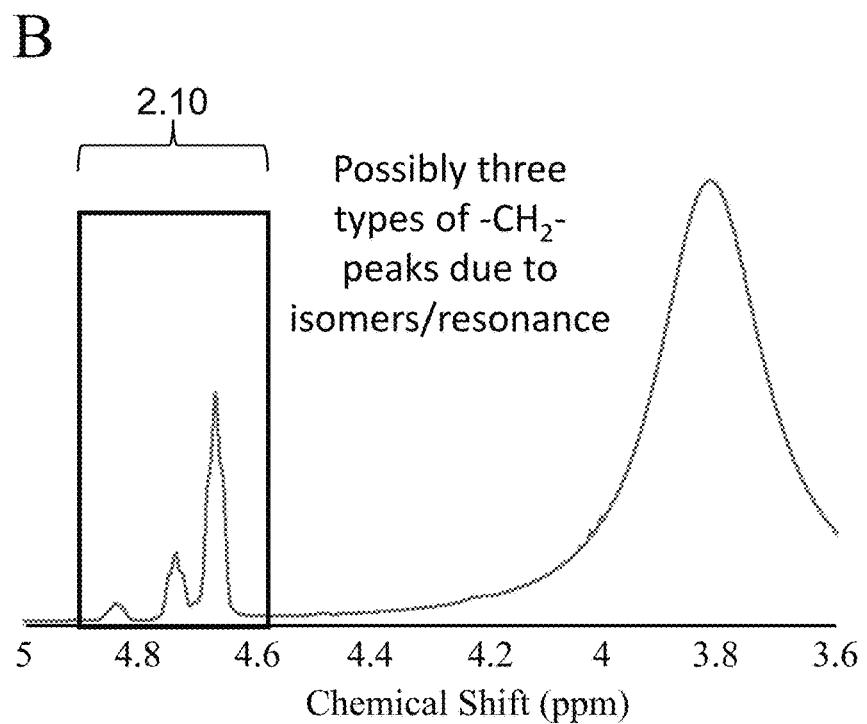

The results from the HI spiking method for FAI (0.1 M)+3-APy (0.01 M) in DMSO-d6 are illustrated in FIG. 6. The peaks are highly split with better separations, and $NH_4^+$ is clearly visible in large amounts, proving the condensation reaction. The integration for the assignment of the MPyFA formic CH, —$CH_2$—, and $NH_4^+$ hydrogens are shown at the top of the figure. These results quantitatively agree with the expected ratio of $CH:CH_2:NH_4=1:2:4$ to within expected uncertainty of this measurement (note the ammonia H ratio is not 3 because it is protonated by HI).

For reference, and to justify the integration of three different —$CH_2$— peaks, the three possible isomers of MPyFA are illustrated in Reaction 2, acknowledging both the possibility for resonance and isomers to manifest in the spectra when the proton exchange rate is negligible.

Reaction 2

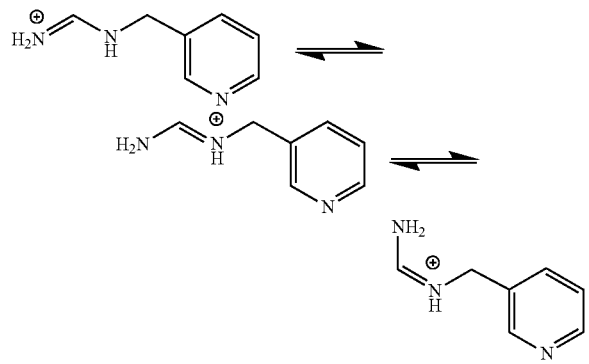

Figure 7:
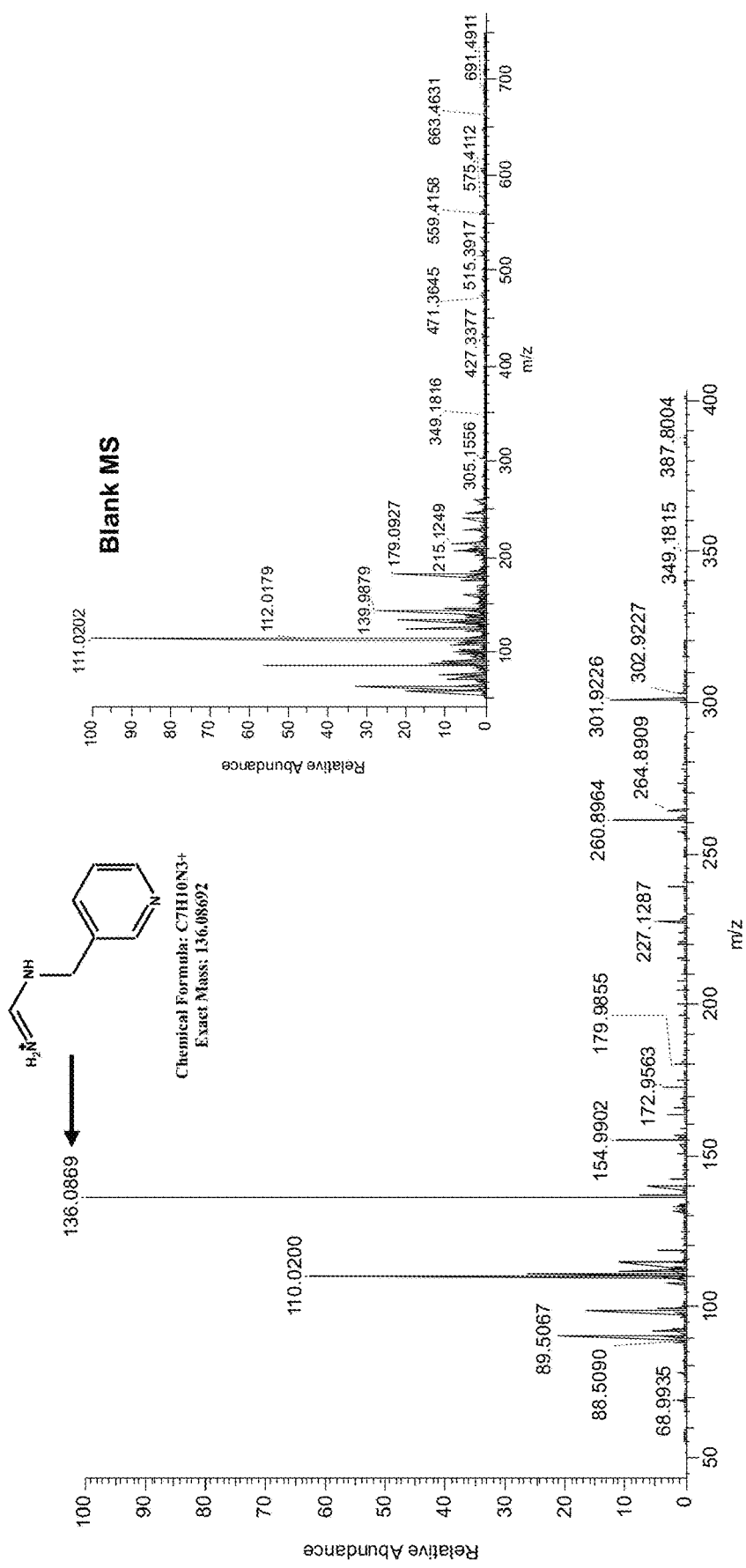
FIG. 7 illustrates electrospray ionization mass spectrometry (ESI-MS) of a sample of FAI (0.1 M)+3-APy (0.02 M), according to some embodiments of the present disclosure.

Further, a set of samples were characterized my ¹H NMR to check for the unlikely event of a reaction between FA⁺ and the pyridine (Py) nitrogen, e.g., investigate the possibility of chemistries occurring besides the ammonia condensation reaction we propose. This demonstrated that the peaks for pyridine in the presence of excess FAI were unchanged from the control, demonstrating the amine nitrogen is the reactive group toward the FA⁺ molecule. In addition, electrospray ionization mass spectrometry (ESI-MS) of a sample of FAI (0.1 M)+3-APy (0.02 M), and detected a major peak at 136.087 m/z, which exactly matches the molecular mass of the MPyFA compound (136.087 amu). The results are illustrated in FIG. 7.

As shown herein, the treating of a perovskite surface with molecules like those shown in Structure 1 and Scheme 1 affects the surface of the perovskite in measurable ways. First, it affects the surface morphology/topography of the perovskite surface by smoothing or "polishing" it as measured by atomic force microscopy (AFM), which measures the height variation of the perovskite surface, and/or as measured by Kelvin probe force microscopy (KPFM), which measures the potential variation of the perovskite surface. In some embodiments of the present disclosure, the surface height variation (as measured by AFM) of a perovskite surface treated with an amine-functionalized pyridine molecule may be a maximum variation of less than or equal to about 1.0 nm, whereas the surface height variation of an untreated perovskite surface may be a maximum variation of greater than about 1.0 nm, up to about 5.0 nm. In some embodiments of the present disclosure, the surface potential variation (as measured by KPFM) of a perovskite surface treated with an amine-functionalized pyridine molecule may have a maximum variation of less than about 10 mV or less than about 20 mV, whereas the surface potential variation of an untreated perovskite surface may have a maximum variation of greater than about 50 mV. These surface potential variations are for a length scale between about 10 nm and about 20 nm. So, both the AFM and KPFM measurements measure local variations in surface roughness and surface potential.

Referring again to FIG. 4, in some embodiments of the present disclosure, a first electrode 510 may be constructed of a transparent conducting oxide (TCO) such as indium-doped tin oxide (ITO), fluorine-doped tin oxide, indium zinc oxide, and/or cadmium stannate. In some embodiments of the present disclosure, an HTL 520 may include a self-assembling monolayer such as at least one of [2-(3,6-dimethoxy-9H-carbazol-9-yl)ethyl]phosphonic acid (MeO-2PACZ), ([4-(3,6-dimethyl-9H-carbazol-9-yl)butyl]phosphonic acid) (Me-4PACZ), (4-(4-(3,6-dimethoxy-9H-carbazol-9yl)butyl)phosphonic acid (MeO-4PACZ), and/or ([2-(9H-carbazol-9-yl)ethyl]phosphonic acid (2PACZ). Other suitable HTM that are non-self-assembling include poly[bis(4-phenyl)(2,4,6-trimethylphenyl)amine (PTAA), poly(N,N'-bis-4-butylphenyl-N,N'-bisphenyl)benzidine (Poly-TPD), and nickel oxide (NiO).

In some embodiments of the present disclosure, an ETL 550 may be constructed of at least one of LiF, $C_{60}$ fullerene, bathocuproine (BCP), and/or $SnO_2$. In some embodiments of the present disclosure, a second electrode 560 may be constructed of at least one of gold, silver, molybdenum, copper, carbon, graphene, indium tin oxide (ITO), and/or indium zinc oxide (IZO).

The methods and devices described herein were developed at least partially because of the realization that during the synthesis of a perovskite-containing device, the top surface of a perovskite layer is prone to defect formation. Thus, methods capable of improving the surface of a perovskite layer is important, and is particularly important for improving the quality, stability, and performance of p-i-n PSCs. An ideal perovskite surface treating method would: (1) not negatively affect the bulk quality of the perovskite layer; (2) not produce materials hindering charge transfer; (3) reduce the density of unwanted defects; and/or (4) have a surface region that creates a built-in electric field, ensuring effective electron extraction and/or reducing carrier recombination. As shown herein, the method of exposing a perovskite surface to a functionalize pyridine molecule (see Structure 1 and Scheme 1 above) such as 3-APy can achieve all of these outcomes and, consequently, improve the typical performance metrics of the complete device (reference numeral 500 in FIG. 4). For example, as shown herein, p-i-n devices were constructed demonstrating improvements for PCE from values less than 23% for devices not treated with 3-APy to values greater than 25% for devices treated with 3-APy, while also exhibiting good operational stability, i.e., retaining 87% of the initial PCE while maintained at a temperature of about 55° C. for over 2400 hours.

Figure 8A:
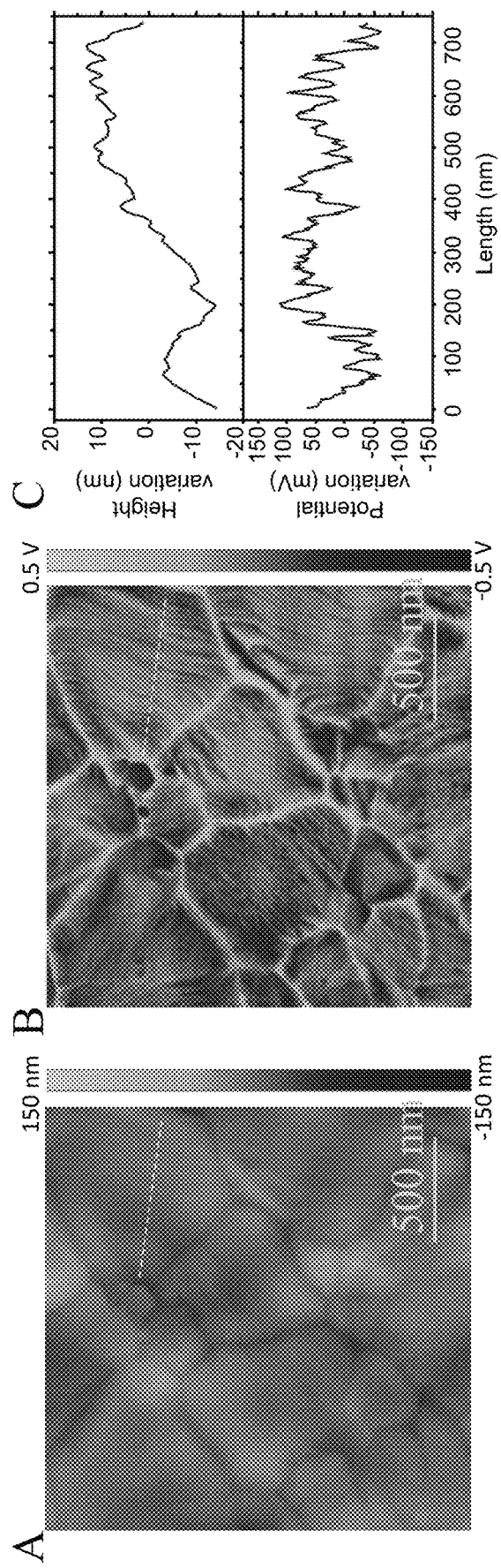
FIG. 8A illustrates atomic force microscopy (AFM) topography image (Panel A), Kelvin probe force microscopy (KPFM) surface potential image (Panel B), and the corresponding line profiles (Panel C) for a perovskite film without surface treatment, according to some embodiments of the present disclosure.
Figure 8B:
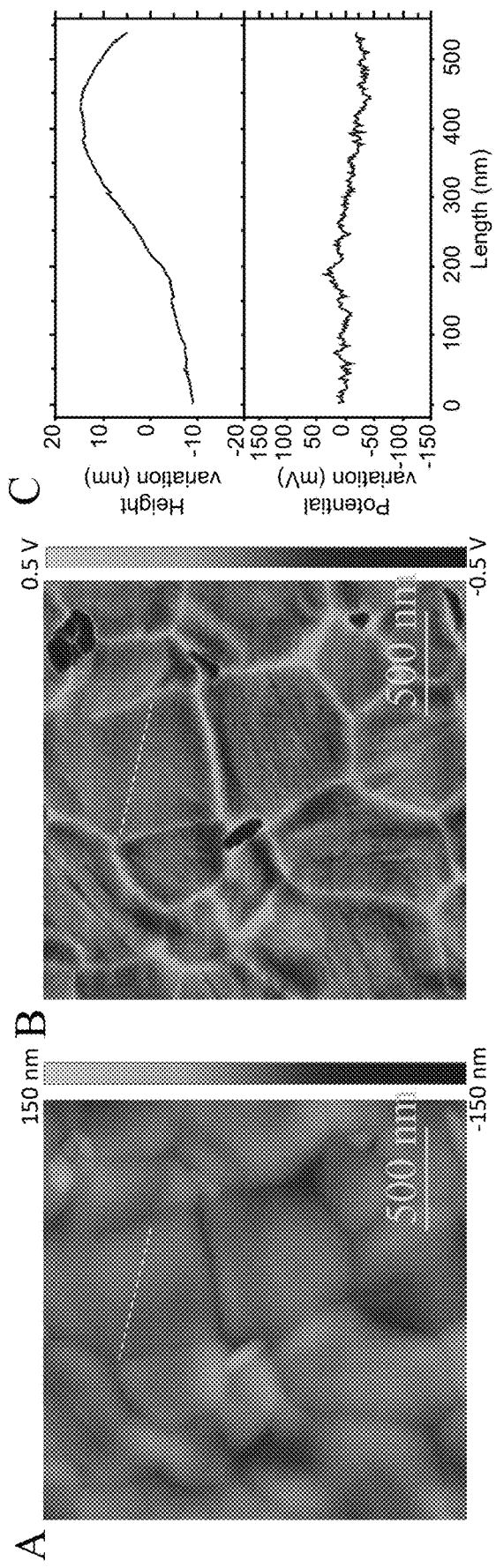
FIG. 8B illustrates (Panels A-C), AFM, KPFM, and line profile comparison, respectively, for a perovskite film with a 3-(aminomethyl)pyridine (3-AP) surface treatment, according to some embodiments of the present disclosure.

Due to their strong tendency to capture a proton, organic amine small molecules, e.g., functionalize pyridine molecules, are good choices for surface modification; these molecules can react with FA 1+ and MA 1+ cations to form other 1+ cations having slightly larger sizes. For example, formamindium has an ionic radius of about 2.79 Å and methylammonium has an ionic radius of about 2.70 Å. The product of the reaction of either of these starting cations with a pyridine compound will result in a product cation having an ionic radius of at least 5 Å or at least about 10 Å. These new 1+ cations, e.g., N-(3-methylpyridine) formamidinium (MPyFA$^+$), can replace FA 1+ and MA 1+ cations in the perovskite lattice, displaying no barrier to charge transfer. Among other organic amine small molecules, 3-APy is able to modify the surface of perovskite layers having compositions that include formamidinium (FA) and at least one of cesium, rubidium, and methylammonium (MA). This composition may be generally represented by $Rb_{1-x-y-z}Cs_xMA_y$-$FA_zPb[I_{1-v-w}Br_vCl_w]_3$. A specific exemplary composition is $Rb_{0.05}Cs_{0.05}MA_{0.05}FA_{0.85}Pb[I_{0.95}Br_{0.05}]_3$, which was used in the devices experimentally tested and described herein. The 3-APy solution was applied to the perovskite surface by spin coating. Atomic force microscopy (AFM) and Kelvin probe force microscopy (KPFM) were performed to examine the impact of 3-APy treatment on the surface topography and potential distribution. Panel A of FIG. 8A shows that for the control sample (e.g., no treatment using 3-APy), the perovskite surface consists of clear steps (or terraces, edges), which are normally an indication of a highly crystalline perovskite. However, the corresponding surface potential map shows that the steps cause strong potential fluctuations on the surface (see Panel B of FIG. 8A). Panel C of FIG. 8A compares the line scan of the topography and surface potential from a typical perovskite region, as shown in Panels A and B of FIG. 8A. These potential fluctuations can be up to about 50-100 mV over a length scale of about 10-20 nm. The steps on the perovskite surface are also likely to be more active/reactive and surface defects may cause variations in local surface charge. In contrast, the 3-APy treatment drastically smoothed out these steps and suppressed the surface potential variations (see Panels A-C of FIG. 8B).

Figure 9:
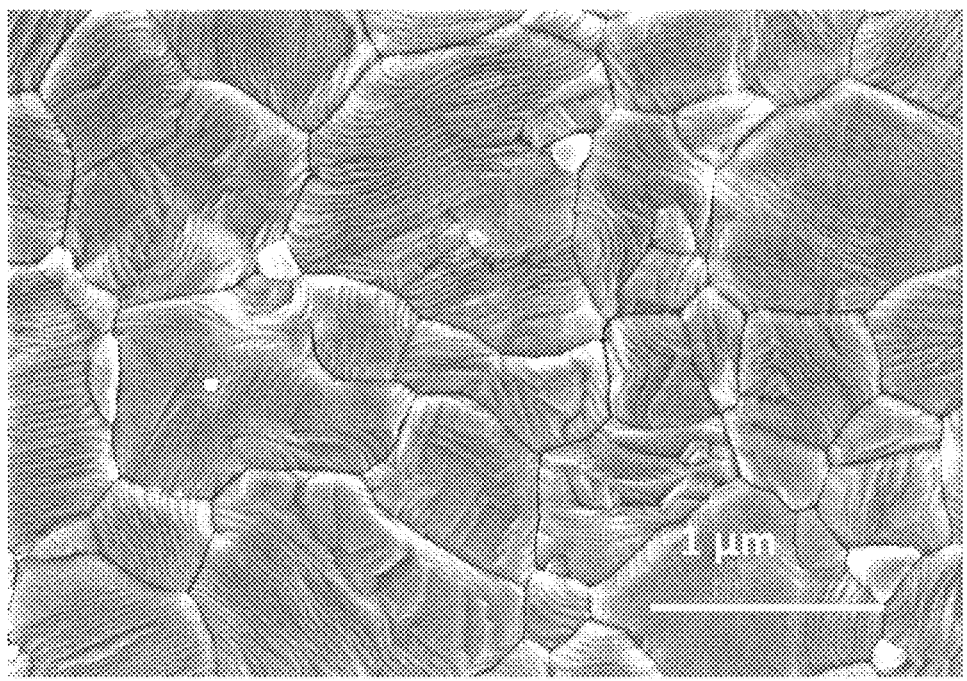
FIG. 9 illustrates scanning electron microscopy (SEM) images of perovskite surface before (Panel A) and after (Panel B) 3-AP treatment, according to some embodiments of the present disclosure.
Figure 9:
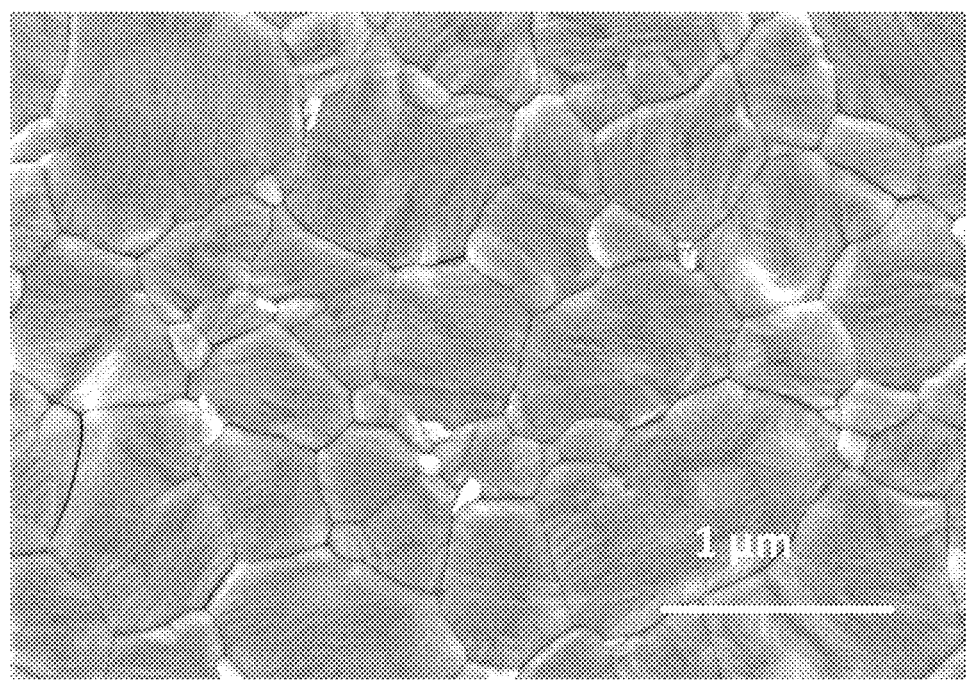
Figure 10:
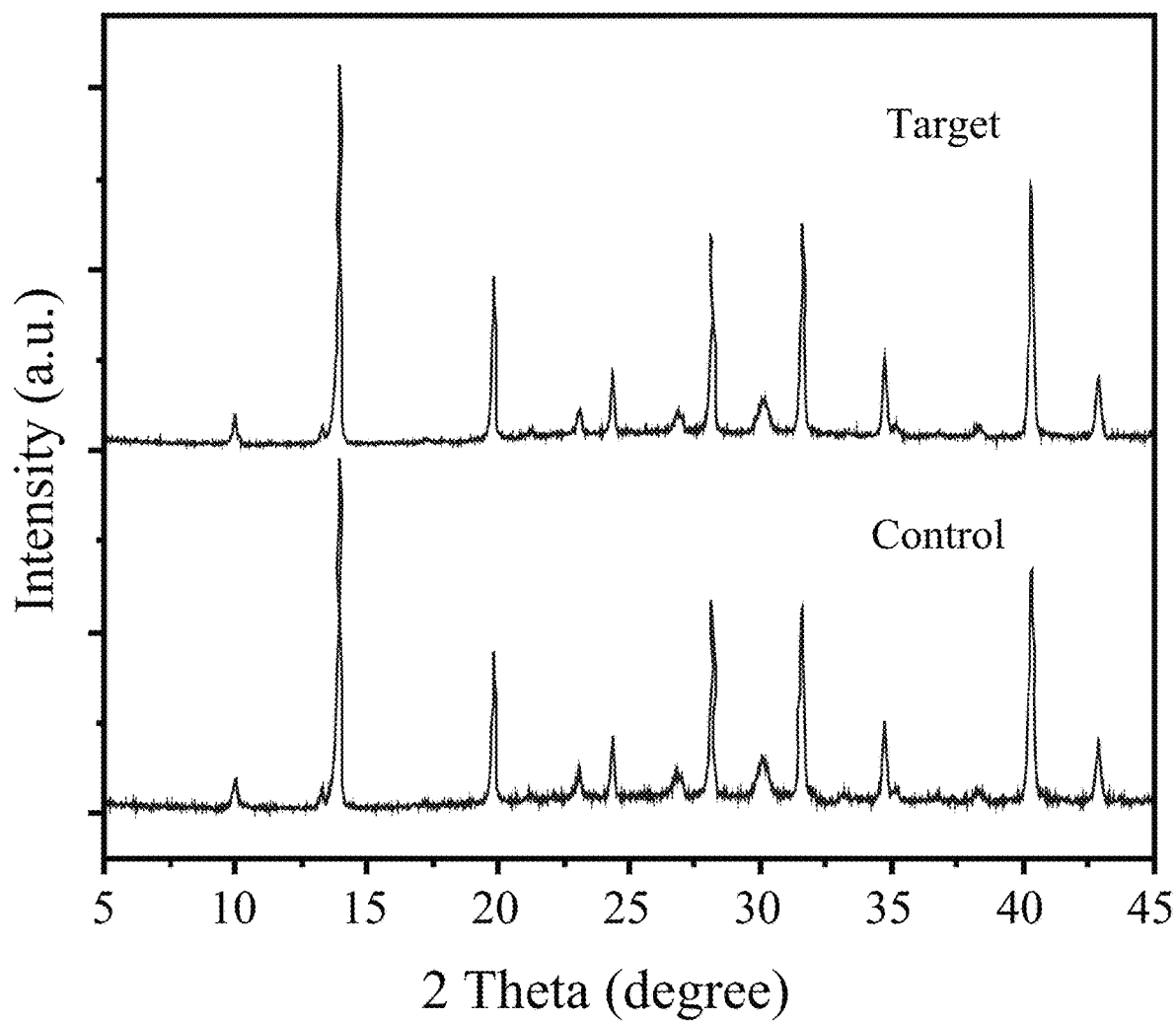
FIG. 10 illustrates X-ray diffraction (XRD) comparison of the perovskite films without (control) and with (target) 3-AP treatment, according to some embodiments of the present disclosure.
Figure 11:
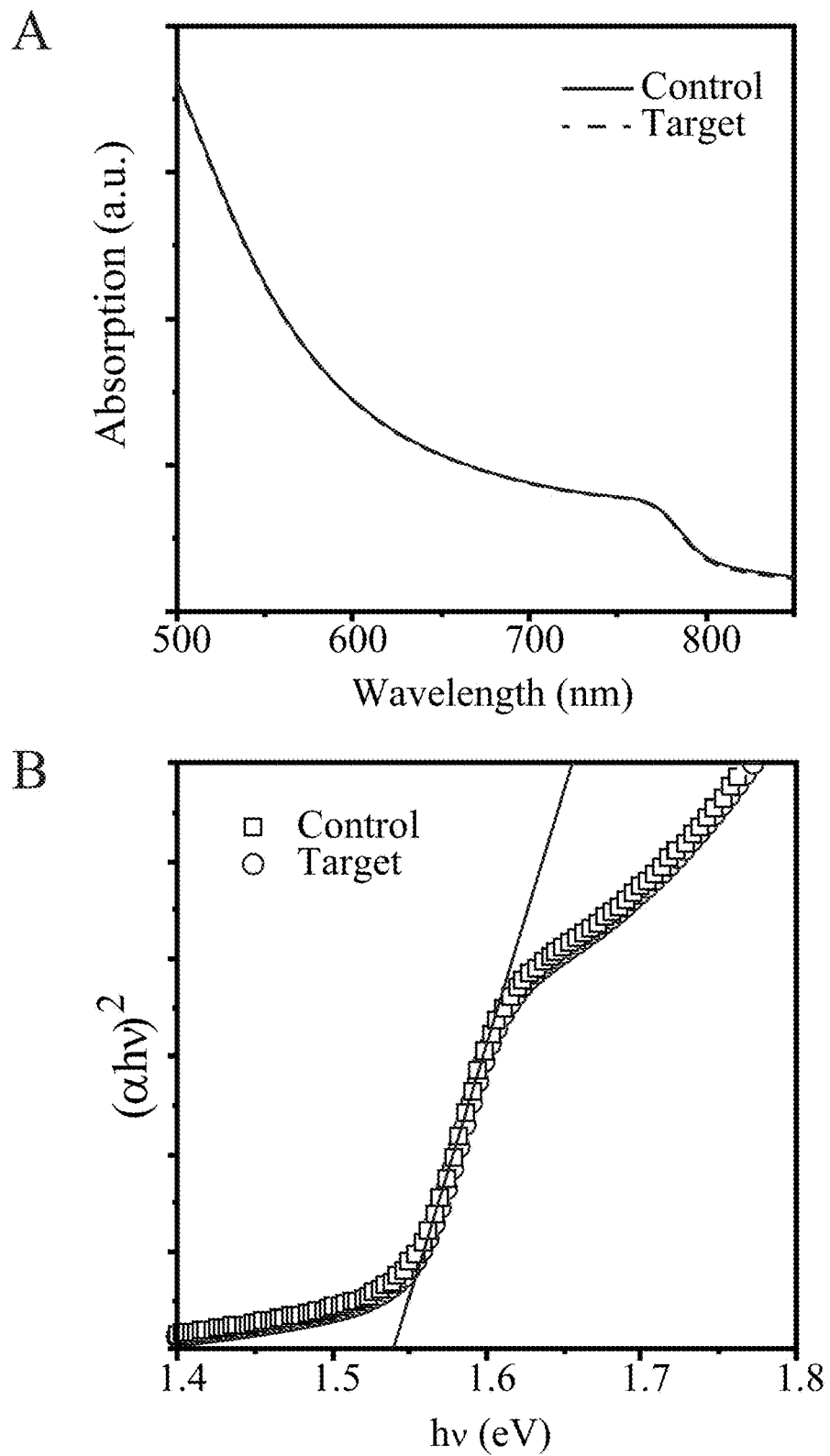
FIG. 11 illustrates ultraviolet-visible (UV-vis) absorption spectra (Panel A) and the corresponding $T_{auc}$ analyses (Panel B) of perovskite films without (control) and with (target) 3-AP treatment, according to some embodiments of the present disclosure. The perovskite bandgap was about 1.53 eV.

FA can be reactive toward primary amines via nucleophilic attack of the C, producing a more highly substituted and stable imidinium cation. Reaction 1 (above) illustrates a condensation reaction between 3-APy and FA. Indeed, density functional theory (DFT) calculations revealed a reaction energy of 0.72 eV, supporting a spontaneous reaction (Reaction 1). Note that treating a perovskite surface with an amine-functionalized pyridine, possibly at least partially due to Reaction 1, can result in a "polishing" effect, as verified by scanning electron microscopy (SEM) images (see FIG. 9). The perovskite surface without a 3-APy treatment clearly exhibits terraced structures, whereas the perovskite surface treated with 3-APy exhibits a much smoother surface, which is consistent with the topography results illustrated in Panel A of FIG. 8A and Panel A of FIG. 8B. Further, the 3-APy treatment resulted in negligible impact on X-ray diffraction (XRD) (see FIG. 10) and ultraviolet-visible (UV-vis) absorption (see FIG. 11) measurements, which is consistent with the 3-APy treatment being primarily a surface modification. Thus, treating a perovskite surface with an amine-functionalized pyridine, can result in very beneficial consequences, as a smoother, more defect-free surface is expected to be beneficial for, among other things, improving the perovskite/ETL interface, resulting in a better performing junction.

Figure 12A:
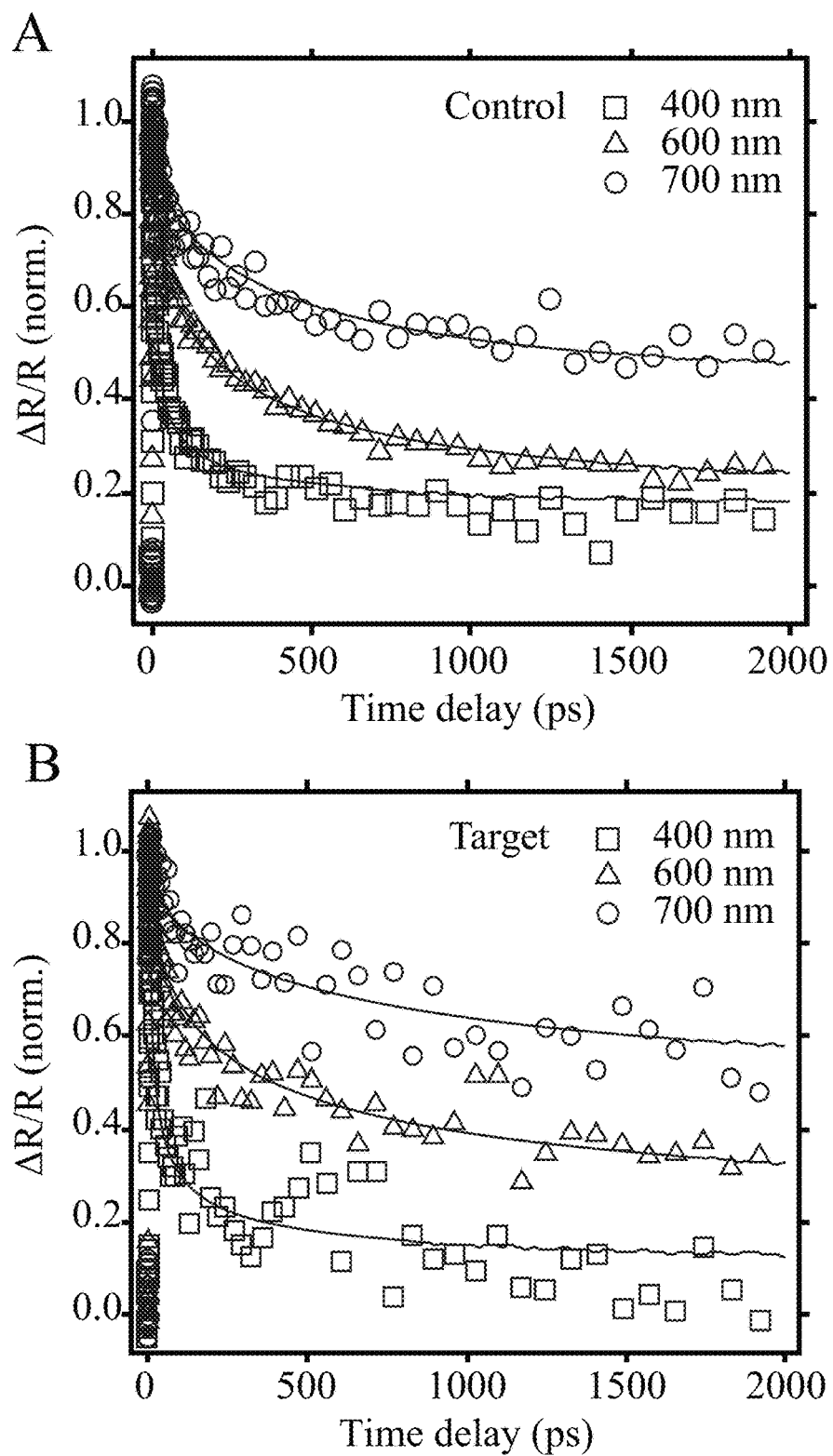
FIG. 12A illustrates a comparison of transient reflection (TR) spectroscopy measurements of the control perovskite film (Panel A) and the target perovskite film with 3-AP surface reaction (Panel B) to study the carrier diffusion and surface recombination dynamics, according to some embodiments of the present disclosure.

In addition, it was found that the 3-APy treatment can modify the energetics of a perovskite surface, creating a built-in electric field that favors electron extraction and reduces charge recombination. Ultraviolet photoelectron spectroscopy (UPS) was implemented to characterize the energetics of perovskite film with and without 3-APy treatment. The secondary electron cutoff (SECO) and the valence band maximum (VBM) spectra are illustrated in Panel A of FIG. 12A. The 3-APy treatment reduced the work function from about 4.77 eV to 4.21 eV and shifted the VBM from about 0.80 eV to 1.51 eV, creating favorable surface energetics/band bending for extracting electrons and blocking holes.

Figure 13:
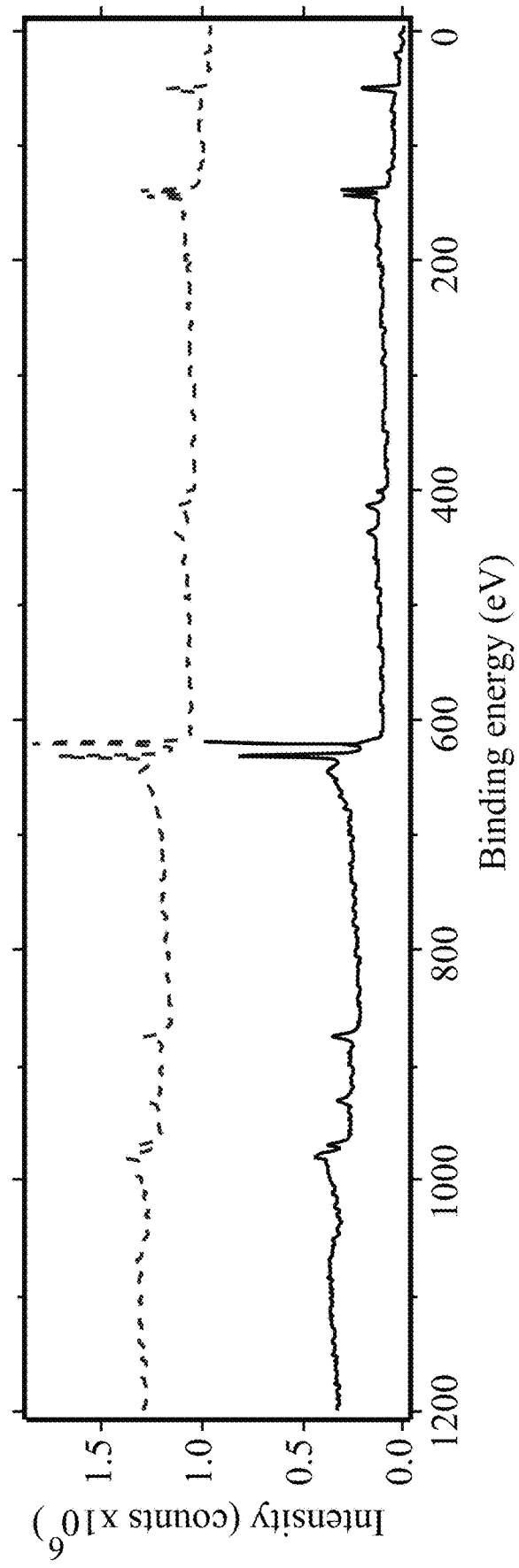
FIG. 13 illustrates X-ray photoelectron spectroscopy (XPS) survey spectra of perovskite film without 3-AP (solid) and with 3-AP (dashed), according to some embodiments of the present disclosure.
Figure 14:
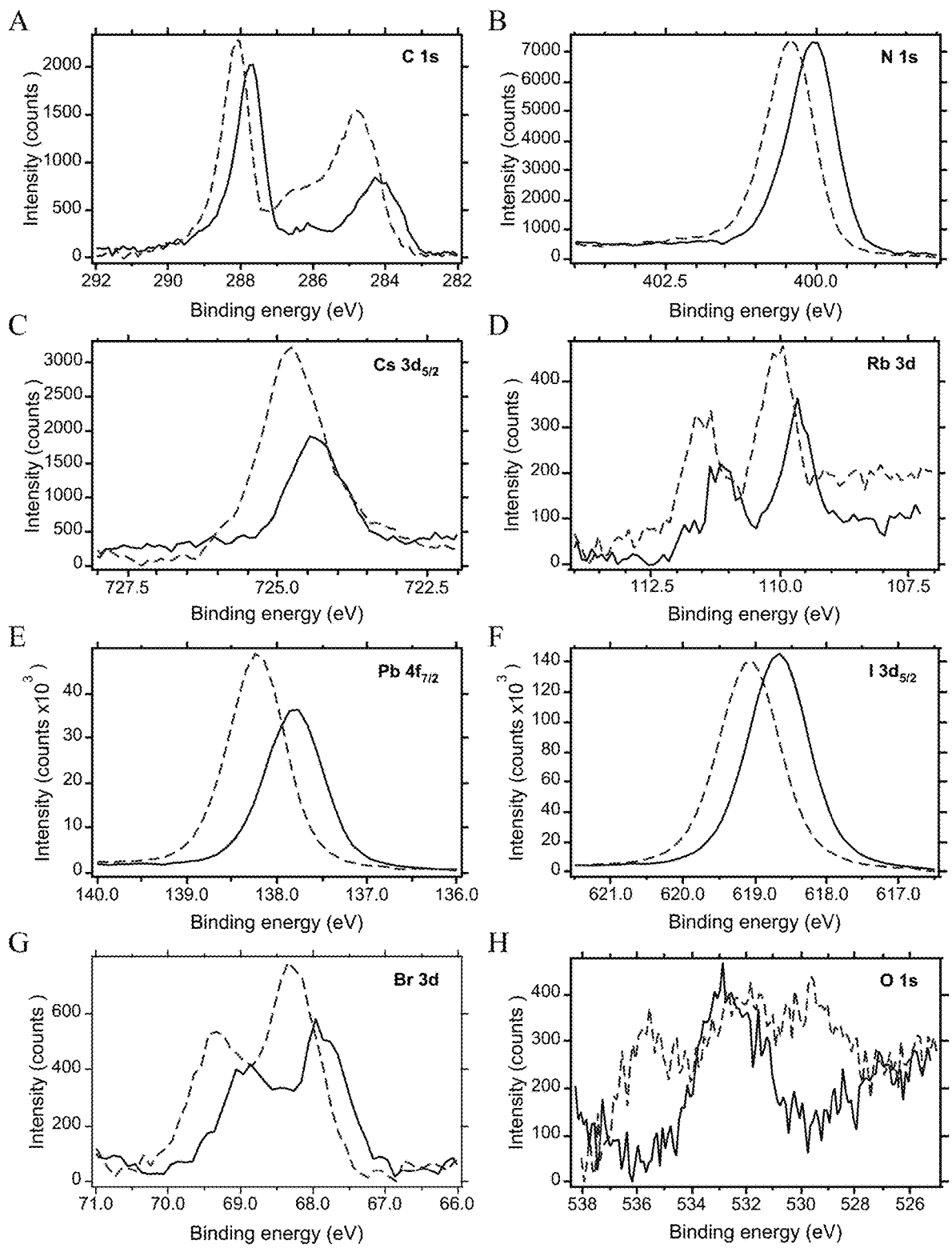
FIG. 14 illustrates high-resolution XPS core-level spectra for all elements identified in the survey scan, according to some embodiments of the present disclosure. (Control is solid; Target dashed.)

X-ray photoelectron spectroscopy (XPS) measurements were conducted to understand chemical changes at the surface. Survey spectra, core-level spectra, and compositional ratios are illustrated in FIGS. 13 and 14. The 3-APy surface treatment decreased the concentration of halide at the surface from 42.3% (3.4 I:Pb) to 36.4% (2.5 I:Pb), increased carbon from 19.1% to 25.5%, and slightly reduced nitrogen from 22.8% to 20.6%, consistent with Reaction 1, with some of the proposed reaction product anchoring to the perovskite surface, with some washing away. Results are summarized in Table 1. All percentages are mole percentages.

TABLE 1

| | Elemental Summary from FIG. 14 | | | | | | | | | | |
|---|---|---|---|---|---|---|---|---|---|---|---|
| | Br % | Cs % | C % | I % | N % | O % | Pb % | Rb % | Pb:I | N:I | C:I |
| Control | 1.3 | 0.4 | 19.1 | 42.3 | 22.8 | 1.3 | 12.4 | 0.4 | 0.29 | 0.54 | 0.45 |
| Additive | 1.6 | 0.9 | 25.5 | 36.4 | 20.6 | 0.2 | 14.4 | 0.5 | 0.39 | 0.57 | 0.70 |

Figure 15:
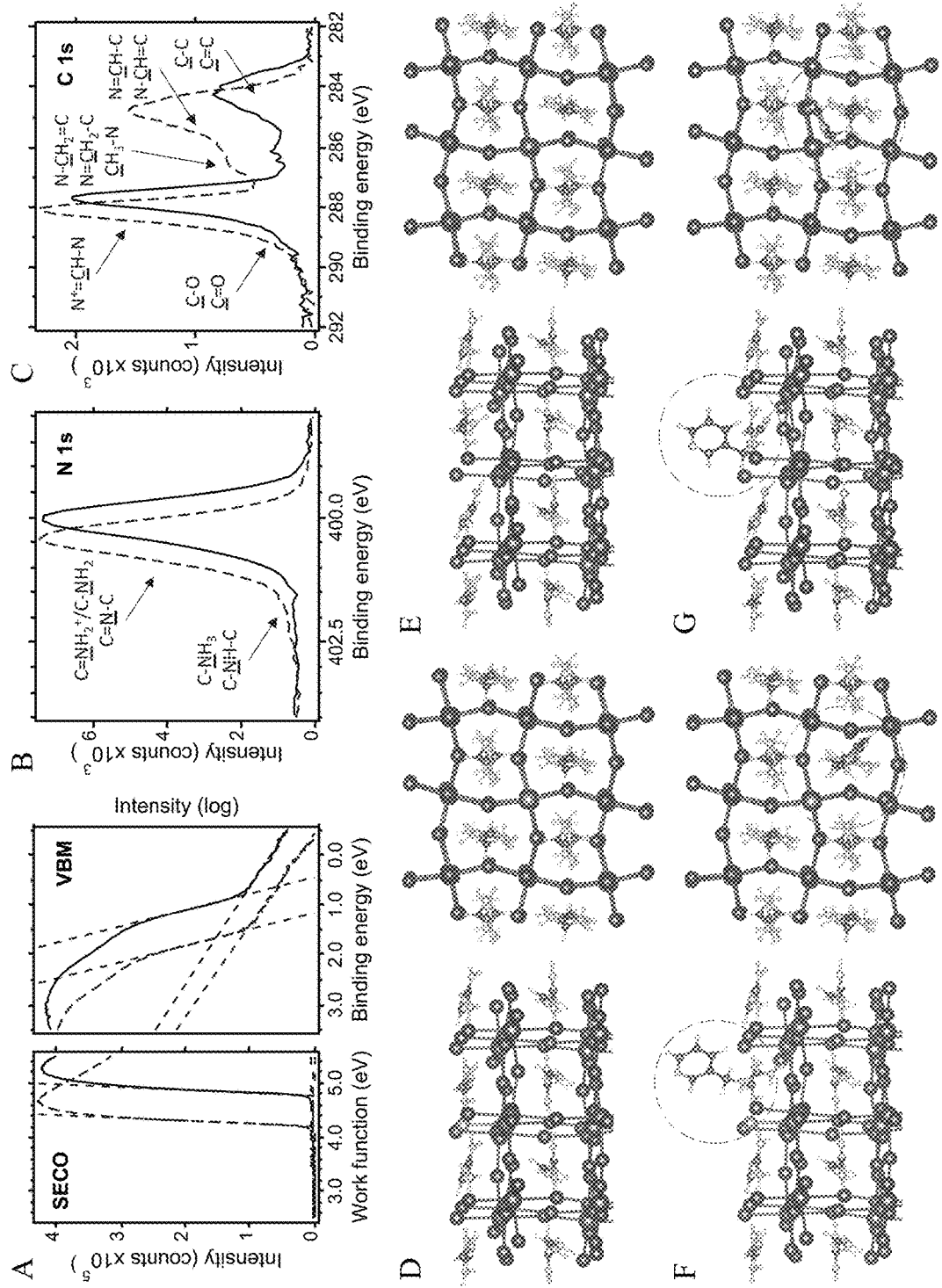
FIG. 15 illustrates surface chemistry and energetics data, according to some embodiments of the present disclosure. Panel A illustrates ultraviolet photoelectron spectroscopy (UPS) measurements for perovskite films without (control, solid) and with (target, dashed) 3-AP treatment (SECO control 4.77 eV; target 4.21 eV: VBM control 0.80 eV; target 1.51 eV). The work function (WF) and valence band maximum (VBM) results are indicated. A comparison of the X-ray photoelectron spectroscopy (XPS) spectra of N is (Panel B) and C is (Panel C) core levels for the control (black) and the 3-AP treated (red) perovskite films. Panels D-G illustrate density functional theory (DFT) modeling of the impact of 3-AP and perovskite interaction on the charged I-vacancy formation. Side view (left) and top view (right) of the atomic structures of the pristine perovskite without (Panel D) and with (Panel F) 3-AP modification, and the corresponding atomic structures with one I-atom removed (Panels E and G).
Figure 16:
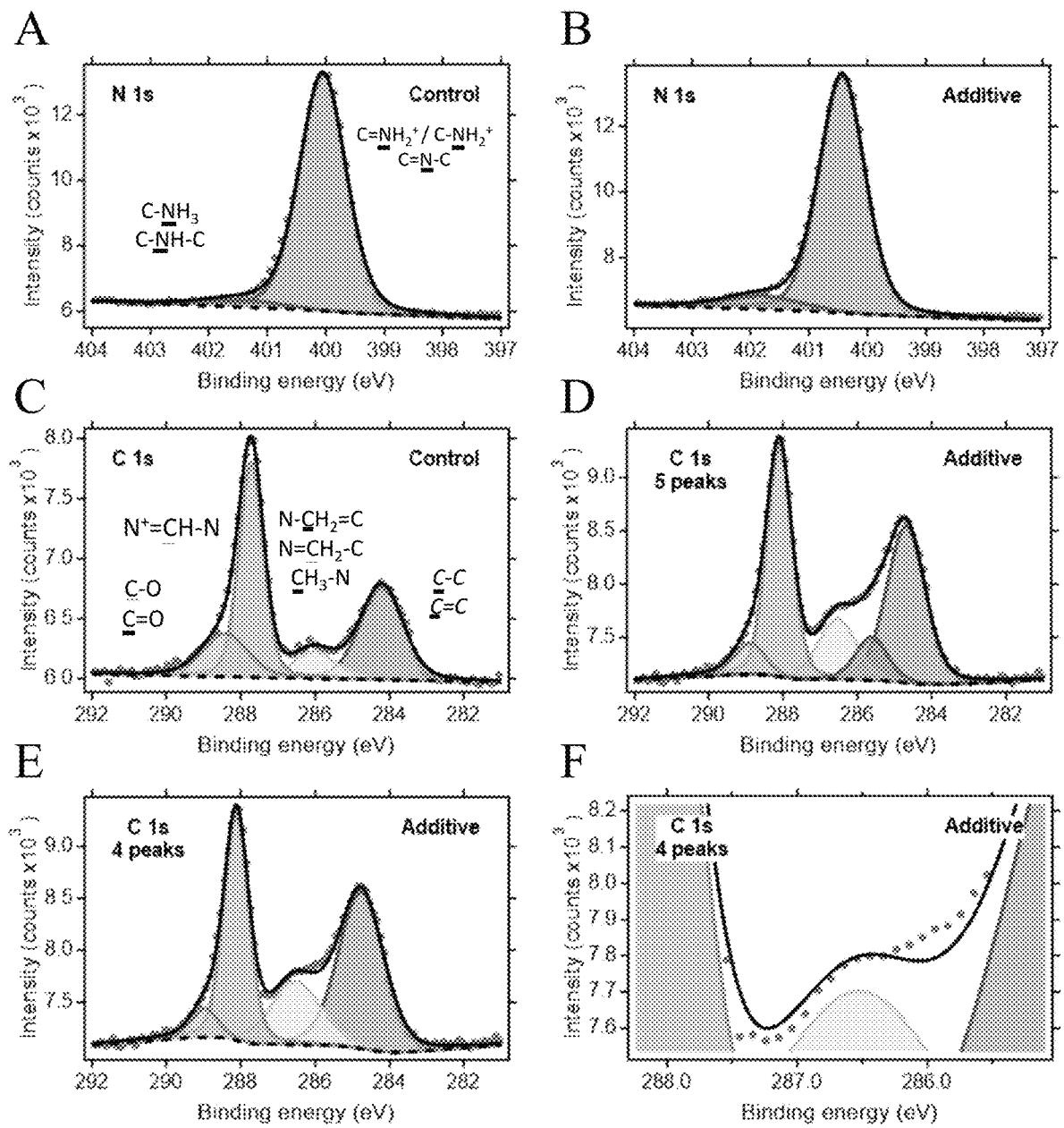
FIG. 16 illustrates XPS core-level spectral fits for N is (Panels A and B) and C is (Panels C and D), plus an additional fitting attempt utilizing only four peaks (Panel E) with its variance from the best fit line (Panel F), according to some embodiments of the present disclosure. As can be seen, the control sample's C is spectra can be easily fit with four peaks, but the 3-AP-treated sample requires a fifth peak. For all fits, the full width half maximum (FWHM) was constrained between 0.7 and 1.5 eV. Relative peak location constraints for the N 1s are $N_1=x$ and $N_2=x+1.35$ to 1.45 eV. Relative peak location constraints for C is are $C_1=x$, $C_2=x+1.75$ to 1.85 eV, $C_3=x+3.3$ to 3.5 eV, and $C_4=x+4.2$ to 4.3 eV. For Panel D, a fifth peak was added at $C_5=x+0.85$ to 0.95. For Panels E and F, $C_2$ constraints in FWHM and position were removed.

The 3-APy treatment also caused changes in the C 1s and N 1s core levels, which are displayed qualitatively (with expected peak locations of relevant bonding environments labeled) in Panels B and C of FIG. 15; fits are displayed in Panels A-D of FIG. 16. The control sample has a C 1s bonding environment dominated by the N$^+$=CH—N amidine bonds from FA (~288 eV), with smaller contributions from CH$_3$—N (~286 eV) bonds from MA, adventitious carbon (C—C/C=C) bonds (~285 eV), and carboxyl (C—O/C=O) bonds (~286 to 289 eV). Both the MA and FA bonds are also visible in the N 1s spectrum at ~402 eV and ~400.5 eV, respectively. Upon 3-APy treatment, a general increase in signal across the C 1s environment is observed, particularly at lower binding energy (BE), where bonds with fewer N groups and lower coordination may be expected. This increase is dominated by enhancements to the signals at ~285 eV and ~287 eV that are consistent with the C—C/C=C and N—CH$_2$—C bonds of 3-APy, respectively, and the emergence of a new peak between them that is likely from the C=CH—N/C—CH=N pyridinic bonds of 3-APy (see Panels E and F of FIG. 16). Turning to the N 1s, a slight increase in the higher BE peak is observed due to the proposed reaction, which converts one of the lower BE C=NH$_2$$^+$/C—NH$_2$ amidine bonds from FA to a pyrrolic C—NH—C bond, with no significant change to the peak at a lower BE peak due to the aforementioned reaction being compensated by signals from the pyridinic C—N=C group of 3-APy.

The iodine (I) deficiency is consistent with the observed effective n-type doping and reduced work function associated with 3-APy treatment, because an I-vacancy is a shallow donor. DFT calculations were also performed to understand the mechanism leading to the observed n-type Fermi-level shift induced by the 3-APy surface modification. For simplification, FAPbI$_3$ was chosen for DFT modeling, as it represents the main component used in this study. The DFT results are shown in Panels D-G of FIG. 15. The DFT modeling determined that replacing an FA cation with a 3-APy cation on the surface can reduce the formation energy of a charged I-vacancy by 0.19 eV. This reduction in formation energy is significant and is consistent with the observed I-deficiency and effective n-type doping in the surface region upon 3-APy treatment. The formation energy reduction is mainly due to the electrostatic attraction between the positive charge of the I-vacancy and the negative charge at the C-ring side of the 3-APy cation, which is consistent with the significant rearrangement of the 3-APy cation (see Panels F and G of FIG. 15).

Transient reflection (TR) spectroscopy was also conducted to study the effect of 3-APy surface reactive treatment on surface charge carrier dynamics. By exciting samples with a high-energy pump pulse and then probing the change in reflectance at the surface of the material using a temporally delayed probe pulse, it is possible to analyze the kinetics of the change in reflectance over time to extract the effective surface recombination velocity (SRV). With the 3-APy surface modification, the effective SRV values decreased one order of magnitude, from about $1.9 \times 10^3$ cm/s for the control to $0.2 \times 10^3$ cm/s for the target films. The 10× reduction of SRV with 3-APy treatment is consistent with the improved surface potential distribution and the surface field induced by the n-type Fermi-level shift associated with the treatment, as discussed in connection with FIGS. 8A, 8B, and 15. Furthermore, time-resolved microwave conductivity (TRMC) measurements showed an improved average weighted carrier lifetime (from about 1.7 µs to 2.1 µs) with the 3-APy treatment (see FIG. 12B). TMRC results are summarized in Table 2 below.

TABLE 2

Figure 12B:
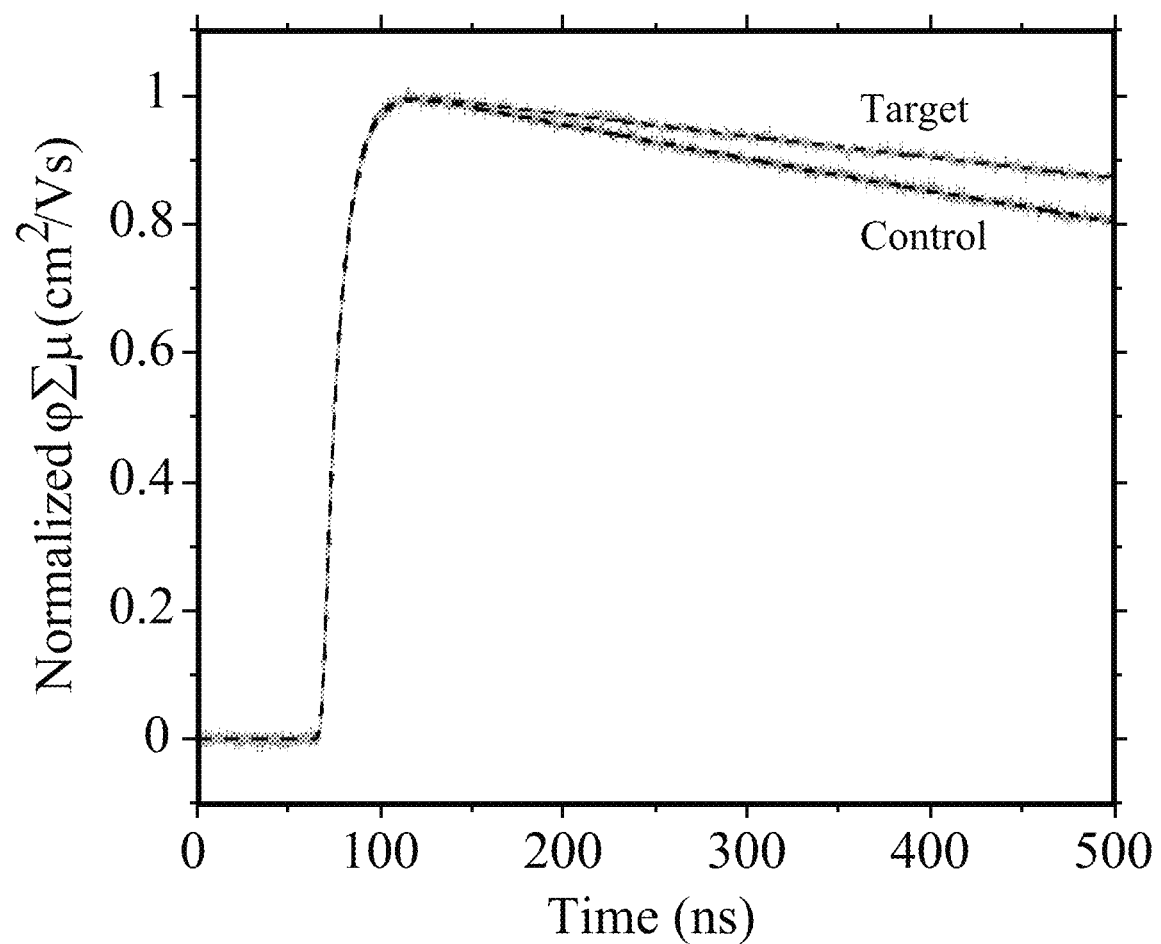
FIG. 12B illustrates a comparison of normalized time-resolved microwave conductivity (TRMC) transients of the control and target perovskite films, according to some embodiments of the present disclosure. Dashed lines are the best fits to a biexponential function that includes the 5-ns pulse width generation term.

Fitting results for TRMC transients shown in FIG. 12B

| Sample | A$_1$ | τ$_1$ (ns) | A$_2$ | τ$_2$ (µs) | τ$_{avg}$ (µs) |
|---|---|---|---|---|---|
| Control | 2.585 | 8.02 | 48.449 | 1.75 | 1.66 |
| Target | 16.63 | 1.95 | 46.816 | 2.78 | 2.06 |

Figure 12C:
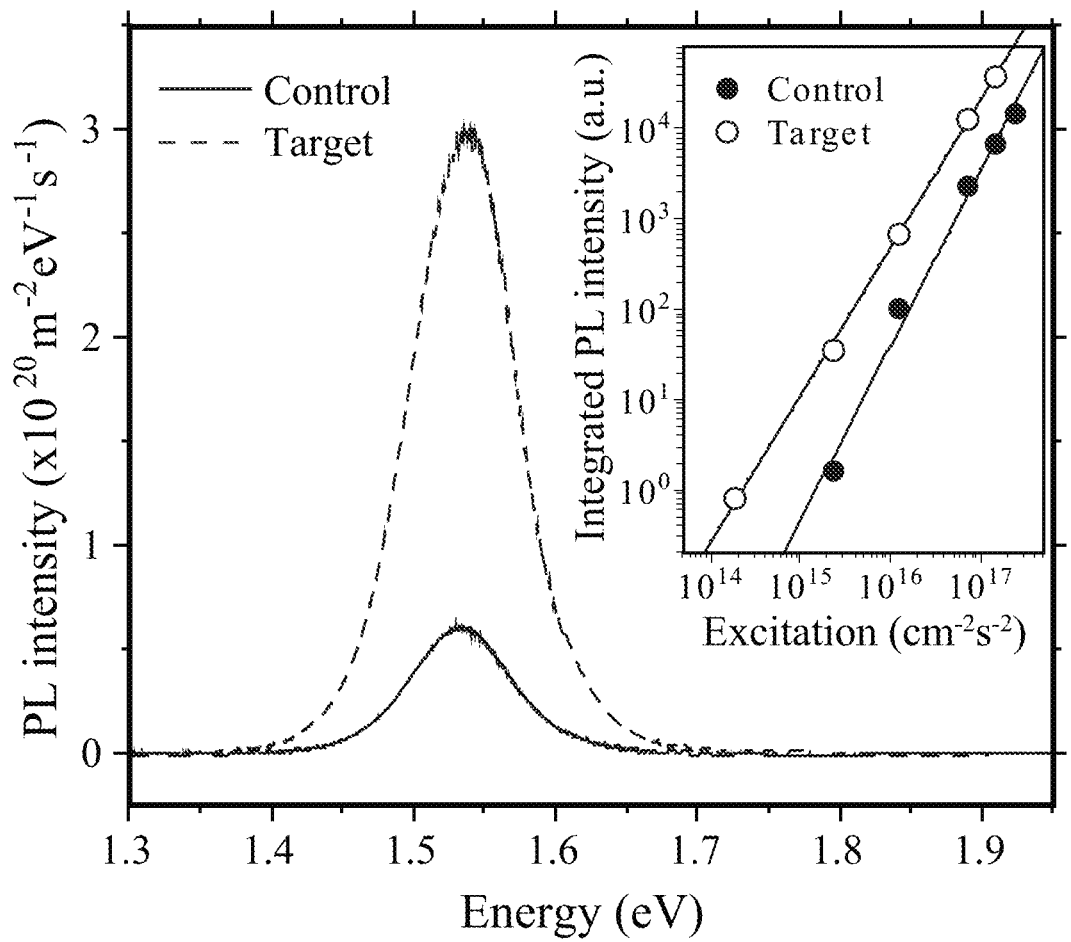
FIG. 12C illustrates a comparison of absolute intensity photoluminescence (PL) spectra at about one sun (~1.7× $10^{17}$ photons cm$^{-2}$s$^{-1}$), along with the intensity dependence (inset), of representative p-i-n devices based on the control and target perovskite films, according to some embodiments of the present disclosure.

Another good way to investigate optoelectronics properties is to measure the absolute photoluminescence (PL) of the devices. The PL intensity is a direct measure of the carrier density in the perovskite absorber and the corresponding quasi-Fermi level splitting (QFLS). FIG. 12C compares the absolute intensity PL of the control and target perovskite films in the p-i-n device configuration (details in the device characteristics section). The external radiative efficiency (ERE) increased from about 0.4±0.1% for the control sample to 2.0±0.1% for the target sample at about one-sun equivalent photon fluence (~$1.7 \times 10^{17}$ cm$^{-2}$s$^{-1}$). This corresponds to about a 42-mV gain in QFSL, which is associated with the reduction of nonradiative recombination enabled by the 3-APy treatment. The inset of FIG. 12C shows that after the 3-APy treatment, the slope of integrated PL intensity vs. excitation fluence decreased from about 1.9±0.1 to 1.6±0.1, indicating reduced interface recombination.

Figure 17:
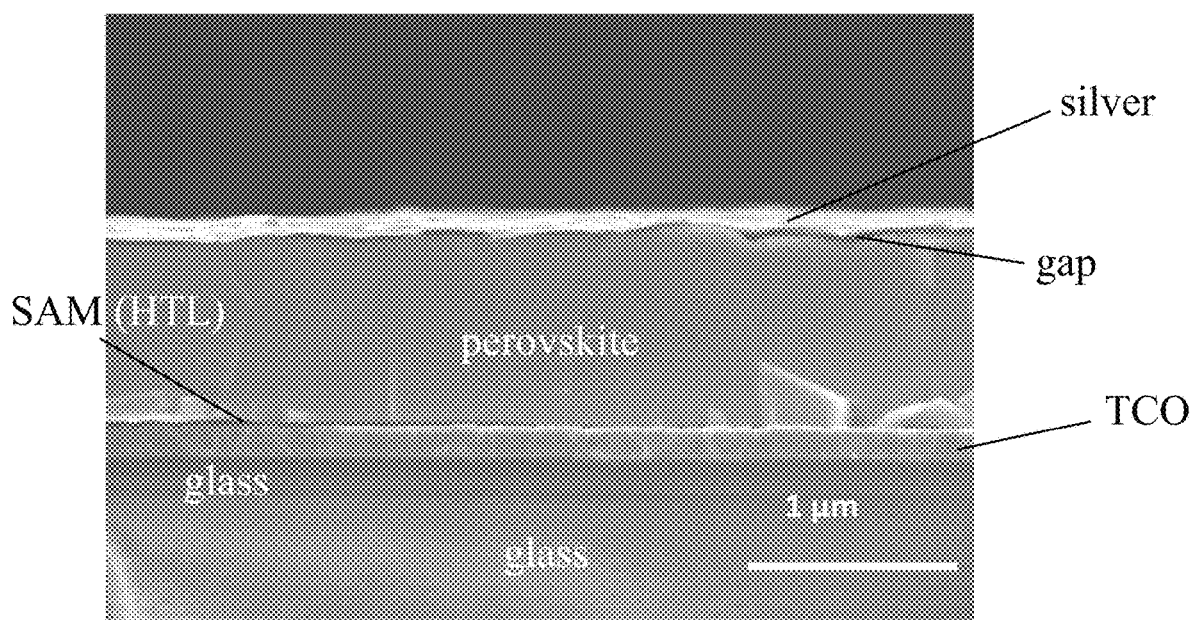
FIG. 17 illustrates a cross-sectional SEM image of the p-i-n device with a typical device stack of glass/(TCO)ITO/MeO-2PACZ/$Rb_{0.05}Cs_{0.05}MA_{0.05}FA_{0.85}Pb(I_{0.95}Br_{0.05})_3$/3-AP/LiF/C60/BCP/Ag, according to some embodiments of the present disclosure. The thickness of the perovskite layer is about 860 nm. The 3-AP/LiF/C60/BCP layers are too thin to be visible.
Figure 18A:
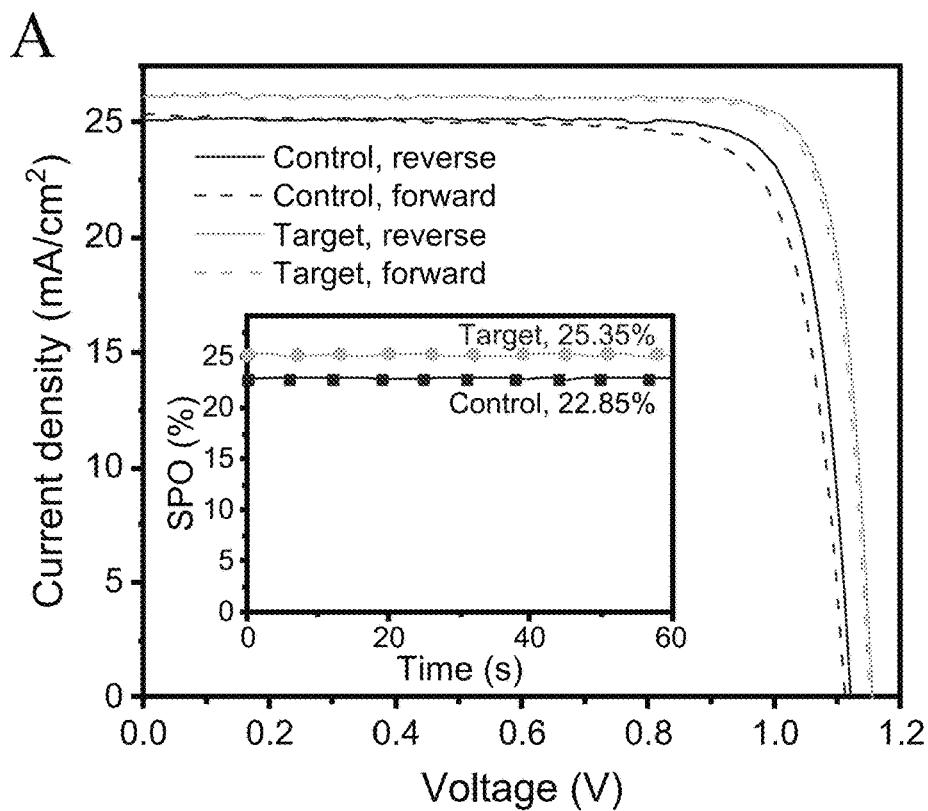
FIG. 18A illustrates device characteristics, according to some embodiments of the present disclosure. Panel A illustrates photocurrent density-voltage (J-V) curves of the champion control and target (with 3-AP surface treatment) p-i-n PSCs under one-sun (100 mW/$cm^2$) illumination. The inset shows the corresponding stabilized power output (SPO) efficiencies. Panel B illustrates a comparison of the external quantum efficiency (EQE) spectra with the integrated short-circuit current density ($J_{sc}$) of 25.4 mA/$cm^2$ and 25.74 mA/$cm^2$ for the control and target, respectively.
Figure 18A:
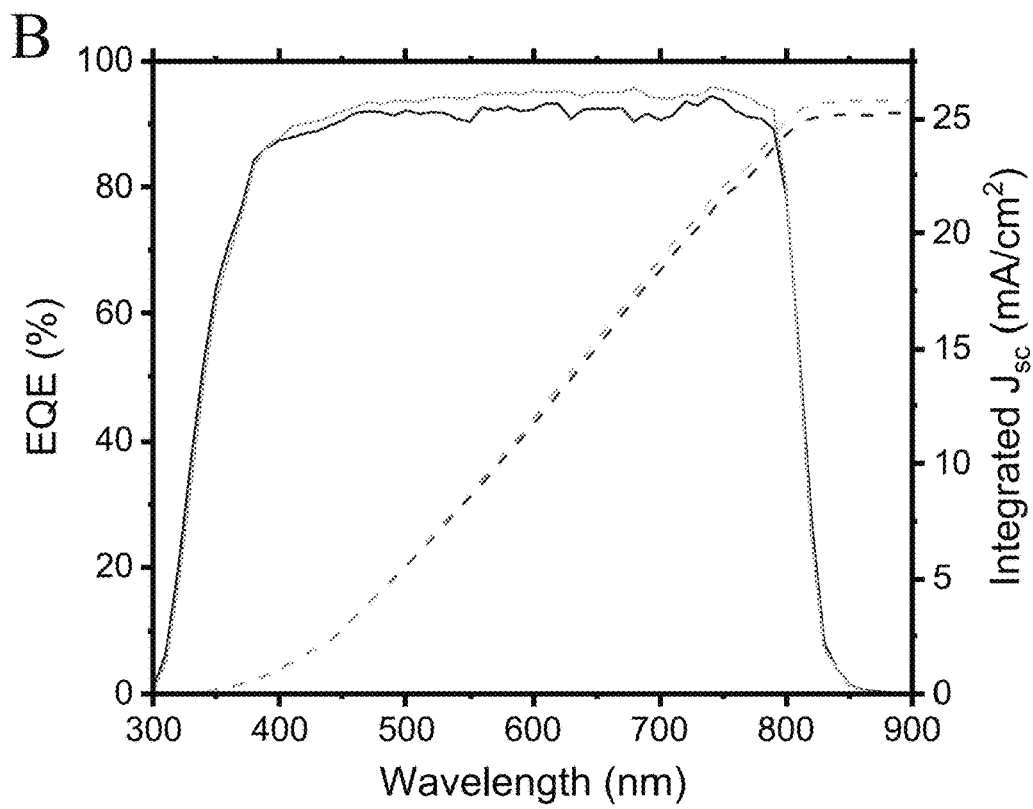
Figure 19:
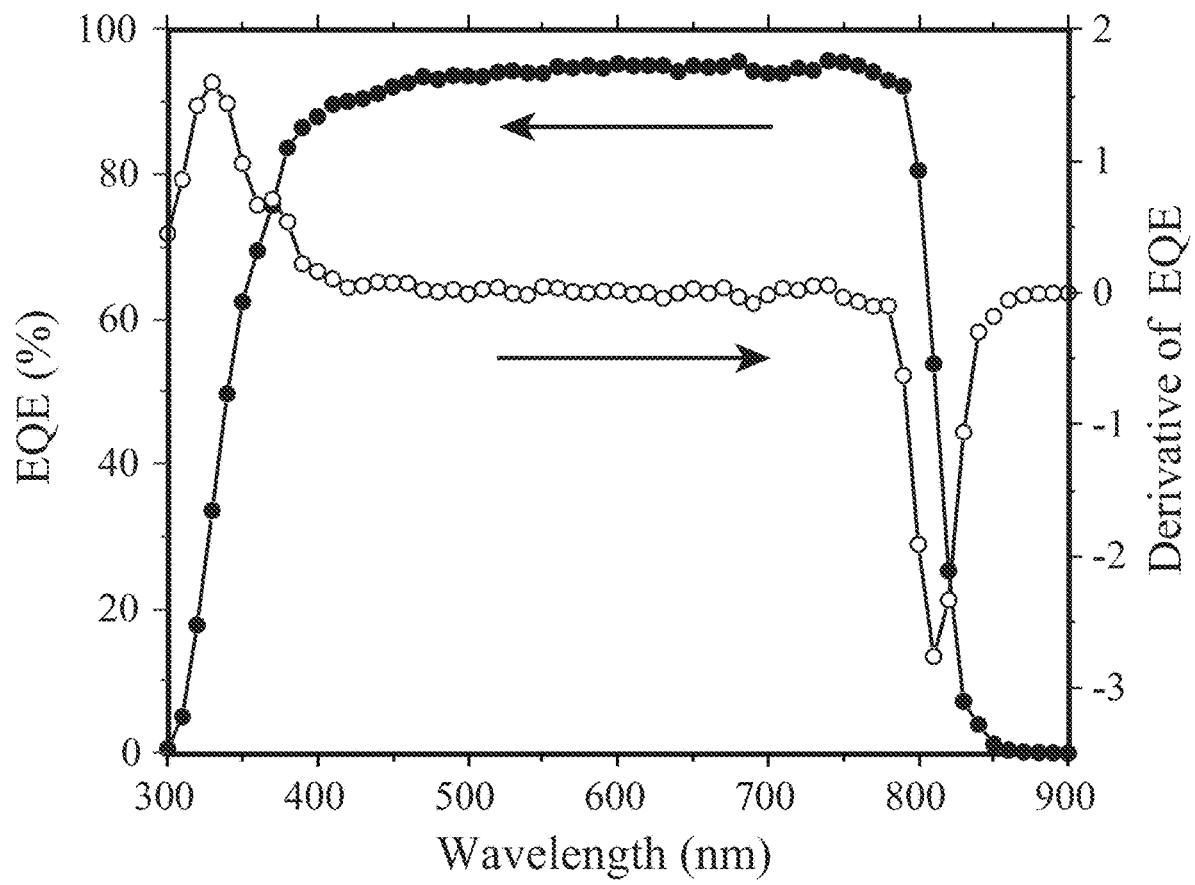
FIG. 19 illustrates an analysis of perovskite bandgap from the external quantum efficiency (EQE) spectrum by taking its derivative spectrum, according to some embodiments of the present disclosure. The bandgap was estimated to be about 1.53 eV.

The impact of 3-APy treatment on the device characteristics was studied using a typical p-i-n cell stack: glass/ITO/MeO-2PACZ/Rb$_{0.05}$Cs$_{0.05}$MA$_{0.05}$FA$_{0.85}$Pb(I$_{0.95}$Br$_{0.05}$)$_3$/LiF/C60/bathocuproine (BCP)/Ag, where MeO-2PACZ is a self-assembled monolayer (SAM) for providing a hole-selective contact (substrate/first electrode/HTL/perovskite layer/ETL/second electrode). A typical cross-sectional SEM of the device stack is shown in FIG. 17. The perovskite film thickness is about 860 nm, with grains spanning across the entire film thickness. Panel A of FIG. 18A compares the PSCs based on the pristine perovskite (control) and 3-APy-treated perovskite (target). The 3-APy treatment (versus without the treatment) increased the reverse scan PCE from 23.39% to 25.49% and increased the forward scan from 22.18% to 25.27%, due to improvements in all parameters (see Table 1). The corresponding stable power output (SPO) were found to be 22.85% and 25.35% for the control (i.e., not 3-APy treatment) and target devices (with 3-APy treatment), respectively (see inset of Panel A of FIG. 18A). Moreover, J$_{sc}$ reached >26 mA/cm$^2$ for the target cell, which is consistent with the external quantum efficiency (EQE) results (see Panel B of FIG. 18A). Analysis of the EQE spectrum also suggests a bandgap of about 1.53 eV (see FIG. 19), which is consistent with the optical absorption measurement (see FIG. 11).

TABLE 3

PV parameters of champion control and target (with 3-APy surface treatment) p-i-n PSCs.

| Device | | J$_{sc}$ (mA/cm$^2$) | V$_{oc}$ (V) | FF (%) | PCE (%) | SPO (%) |
|---|---|---|---|---|---|---|
| Control | Reverse | 25.19 | 1.12 | 82.9 | 23.39 | 22.85 |
| | Forward | 25.35 | 1.11 | 78.8 | 22.18 | |
| Target | Reverse | 26.13 | 1.15 | 84.6 | 25.49 | 25.35 |
| | Forward | 26.19 | 1.15 | 83.9 | 25.27 | |

Figure 20:
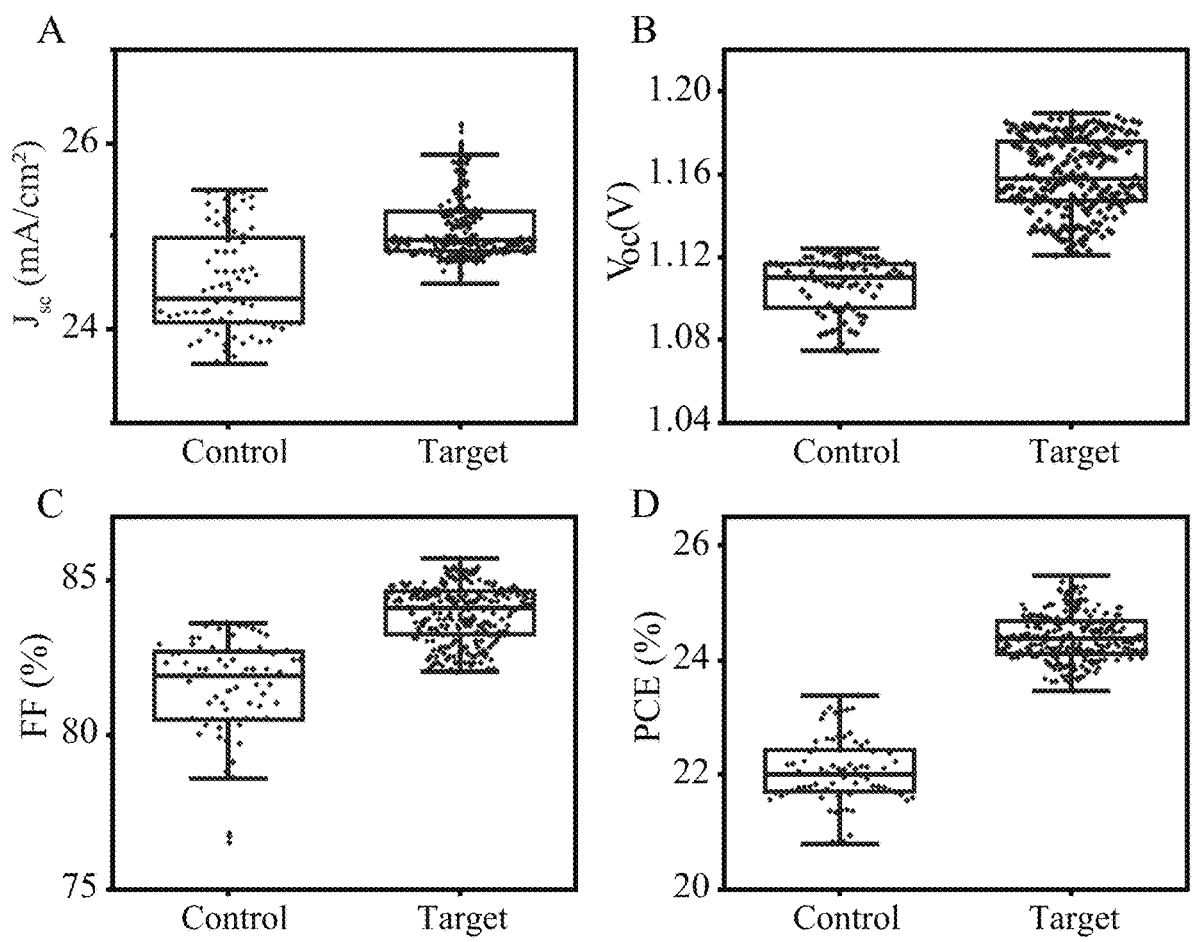
FIG. 20 illustrates a statistical comparison of PV parameters of p-i-n devices based on perovskite films without (control) and with (target) 3-AP treatment, according to some embodiments of the present disclosure. Plots of the box chart graphs containing the mean value, maximum/minimum values, and 25%-to-75%-region data of short-circuit current density ($J_{sc}$) (Panel A), open-circuit voltage ($V_{oc}$) (Panel B), fill factor (FF) (Panel C), and power conversion efficiency (PCE) (Panel D), based on 72 control and 246 target devices.
Figure 23:
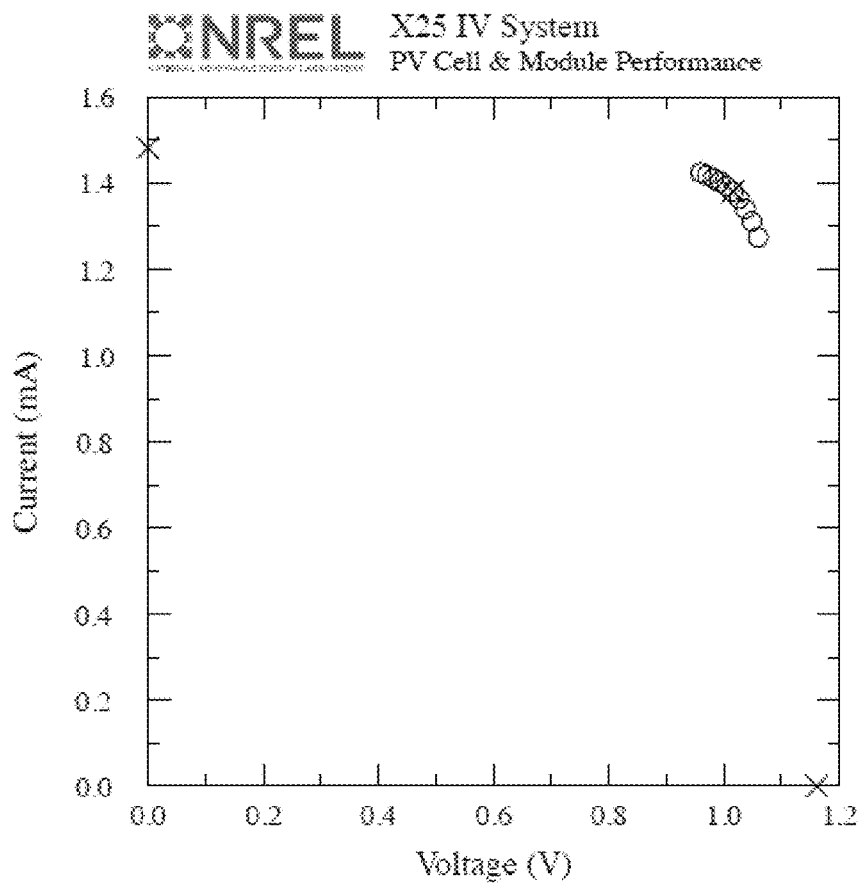
FIG. 23 illustrates certification data of stabilized photovoltaic (PV) performance of a p-i-n device, according to some embodiments of the present disclosure. The certification was conducted using the 11-point-asymptotic $P_{max}$ scan protocol, where the stabilized asymptotic scans are measured by holding the cell at 11 different voltages near $V_{max}$ until the current change per minute is less than 0.1% before changing to the next voltage point.
Figure 24:
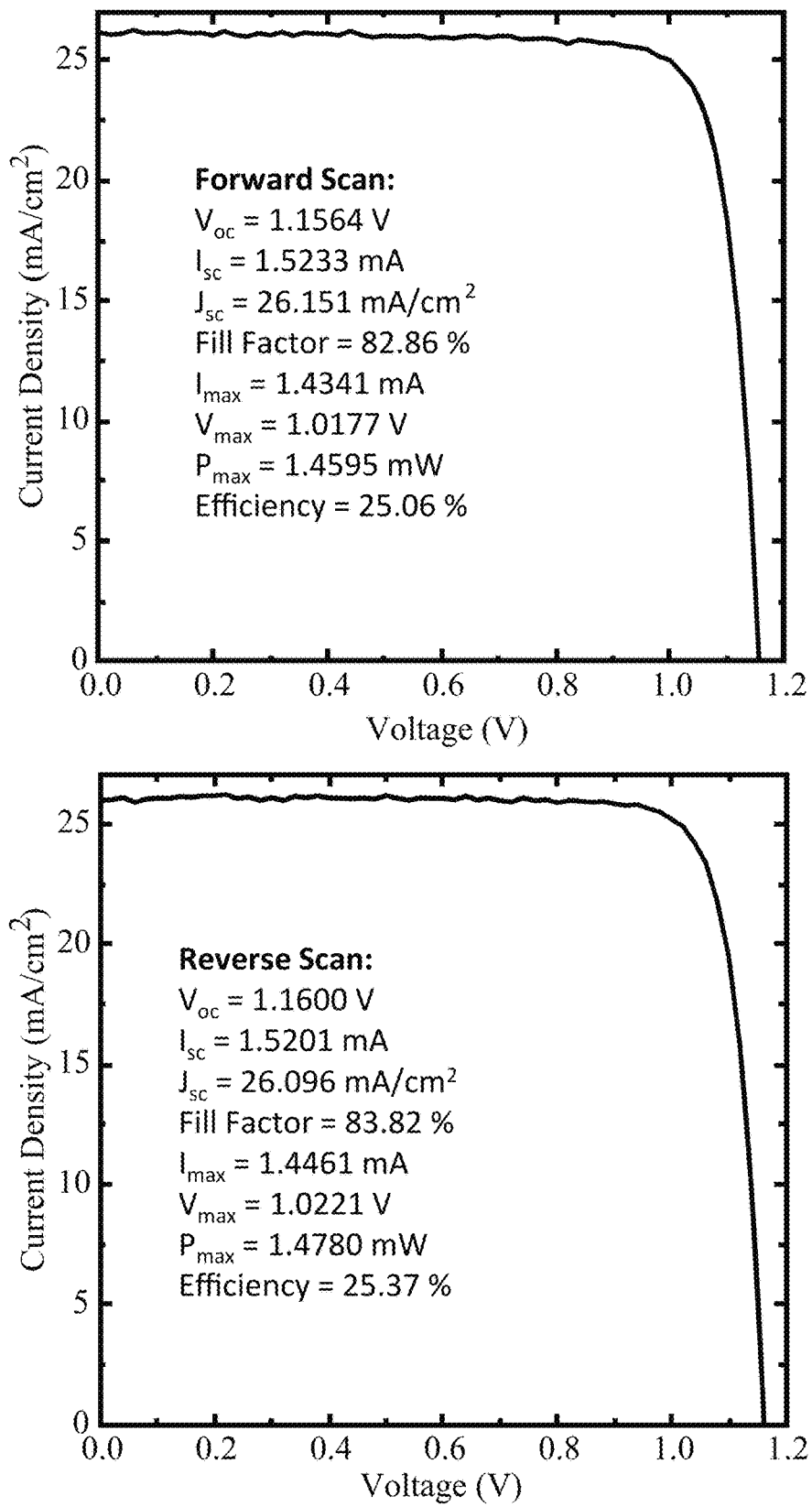
FIG. 24 illustrates J-V characteristics measured on the same device with the certification of the stabilized PV performance as shown in FIG. 22, according to some embodiments of the present disclosure.

The improvements in these PV parameters validate the hypothesis that the observed enhancement in structural/interfacial/optoelectronic properties associated with 3-APy treatment, as discussed in connection with FIGS. 8A, 8B, 12A-12C, and 15, is directly relevant to PV performance. The combination of the improved J$_{sc}$, open-circuit voltage (V$_{oc}$), and fill factor (FF) was further verified based on a statistical comparison of the PV parameters from 72 control and 246 target devices, with an average PCE enhancement from about 22% to 24.4% (see FIG. 20). Note that among these target devices, a maximum V$_{oc}$ of about 1.19 V (see FIG. 21) and a maximum FF of near 86% (see FIG. 22) were achieved, both with PCEs of about 25%. These results further attest to the effectiveness of the reactive surface modification with 3-APy in improving the interface for enhancing charge extraction with reduced recombination loss. One such device was measured by an accredited PV laboratory, obtaining a certified stabilized PCE of 24.05±0.48% using an 11-point Asymptotic P. Scan protocol (see FIG. 23), along with J-V scans yielding a reverse-scan PCE of 25.37% and forward-scan PCE of 25.06% (see FIG. 24). Tables 4 and 5 summarize the performance metrics illustrated in FIGS. 21 and 22, respectively.

TABLE 4

Figure 21:
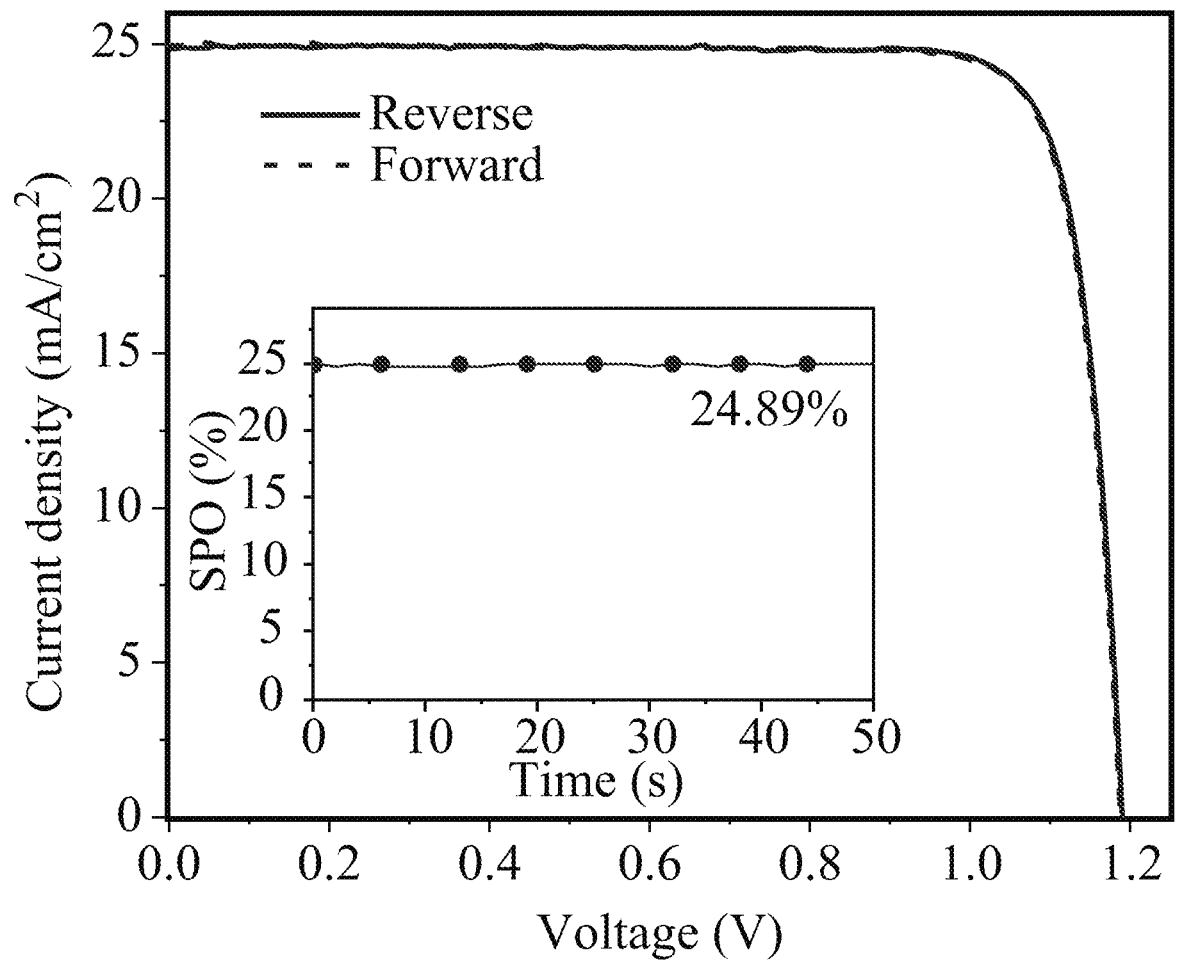
FIG. 21 illustrates J-V curves with SPO, according to some embodiments of the present disclosure.

PV parameters of device J-V curve illustrated in FIG. 21.

| Scan | $J_{sc}$ (mA/cm$^2$) | $V_{oc}$ (V) | FF (%) | PCE (%) |
|---|---|---|---|---|
| Reverse | 24.953 | 1.187 | 84.3 | 24.975 |
| Forward | 24.888 | 1.190 | 84.4 | 24.982 |

TABLE 5

Figure 22:
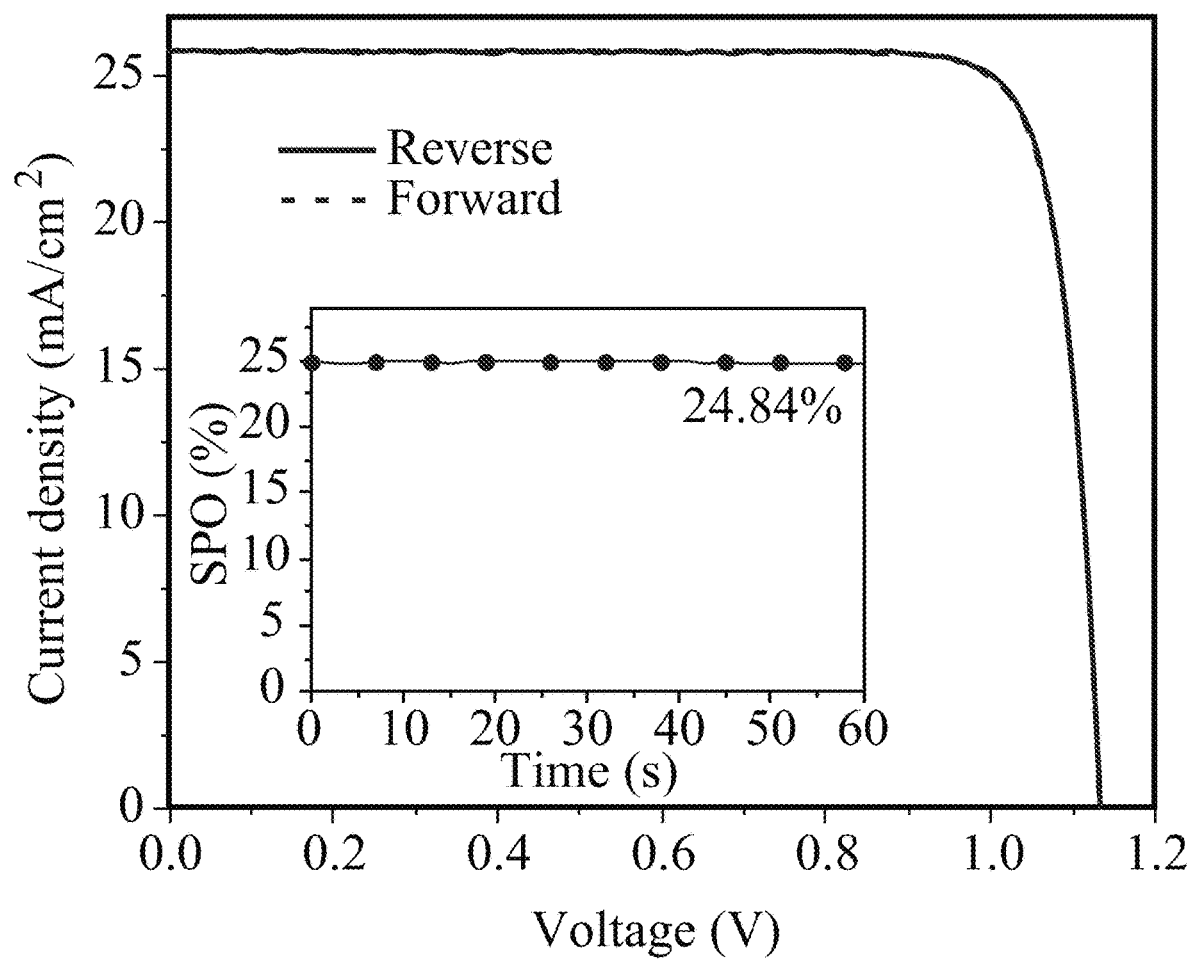
FIG. 22 illustrates J-V curves with SPO, according to some embodiments of the present disclosure.

PV parameters of device J-V curve illustrated in FIG. 22.

| Scan | $J_{sc}$ (mA/cm$^2$) | $V_{oc}$ (V) | FF (%) | PCE (%) |
|---|---|---|---|---|
| Reverse | 25.833 | 1.133 | 85.3 | 24.976 |
| Forward | 25.788 | 1.133 | 85.7 | 25.039 |

Figure 18B:
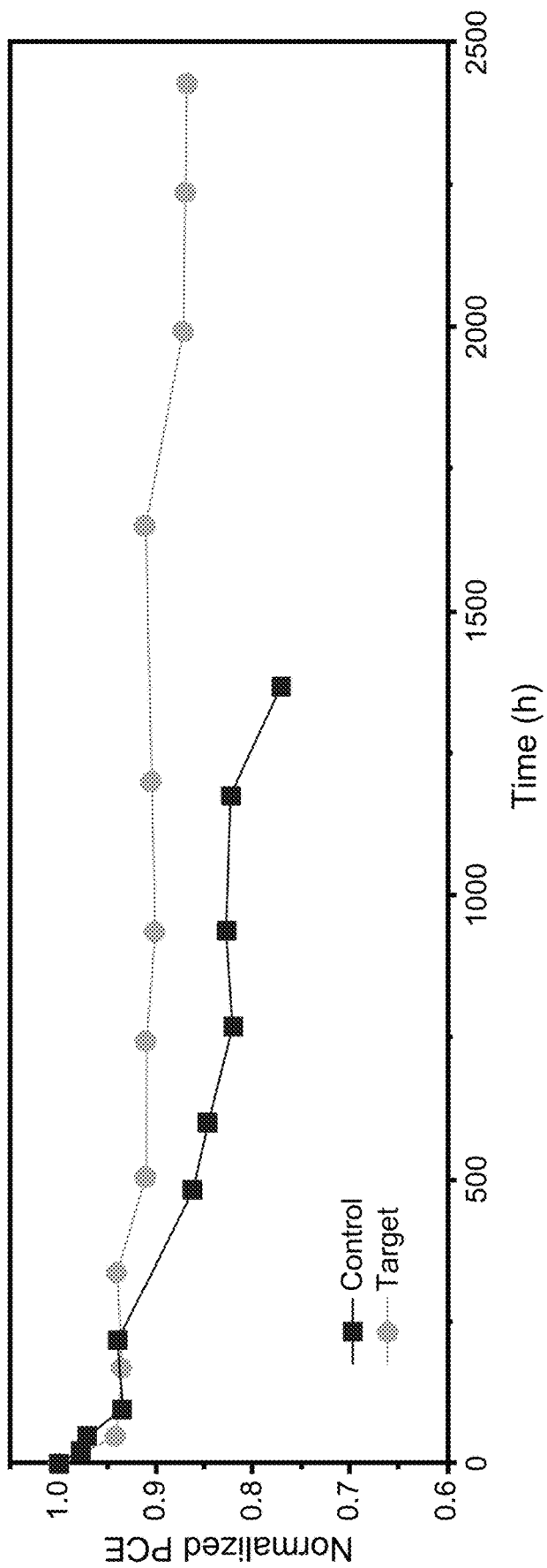
FIG. 18B illustrates the stability of encapsulated control and target devices biased near the maximum power point under continuous light illumination at about 55° C. in ambient air, according to some embodiments of the present disclosure.
Figure 25:
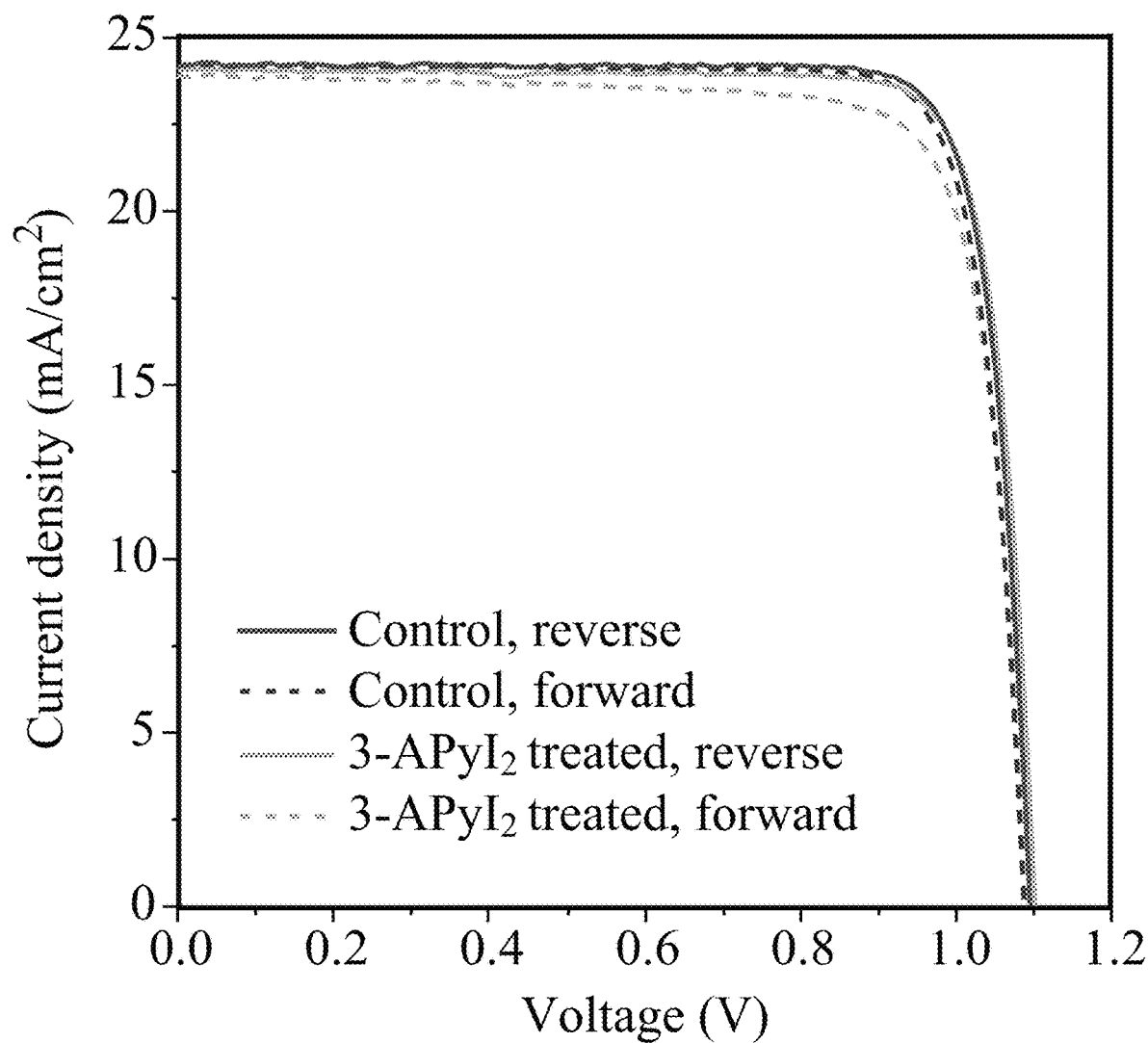
FIG. 25 illustrates J-V curves of p-i-n cells based on perovskite films without (control) and with (treated) 3-$API_2$ surface treatment, according to some embodiments of the present disclosure. 3-$API_2$ was dissolved in 2-propanol (IPA).
Figure 26:
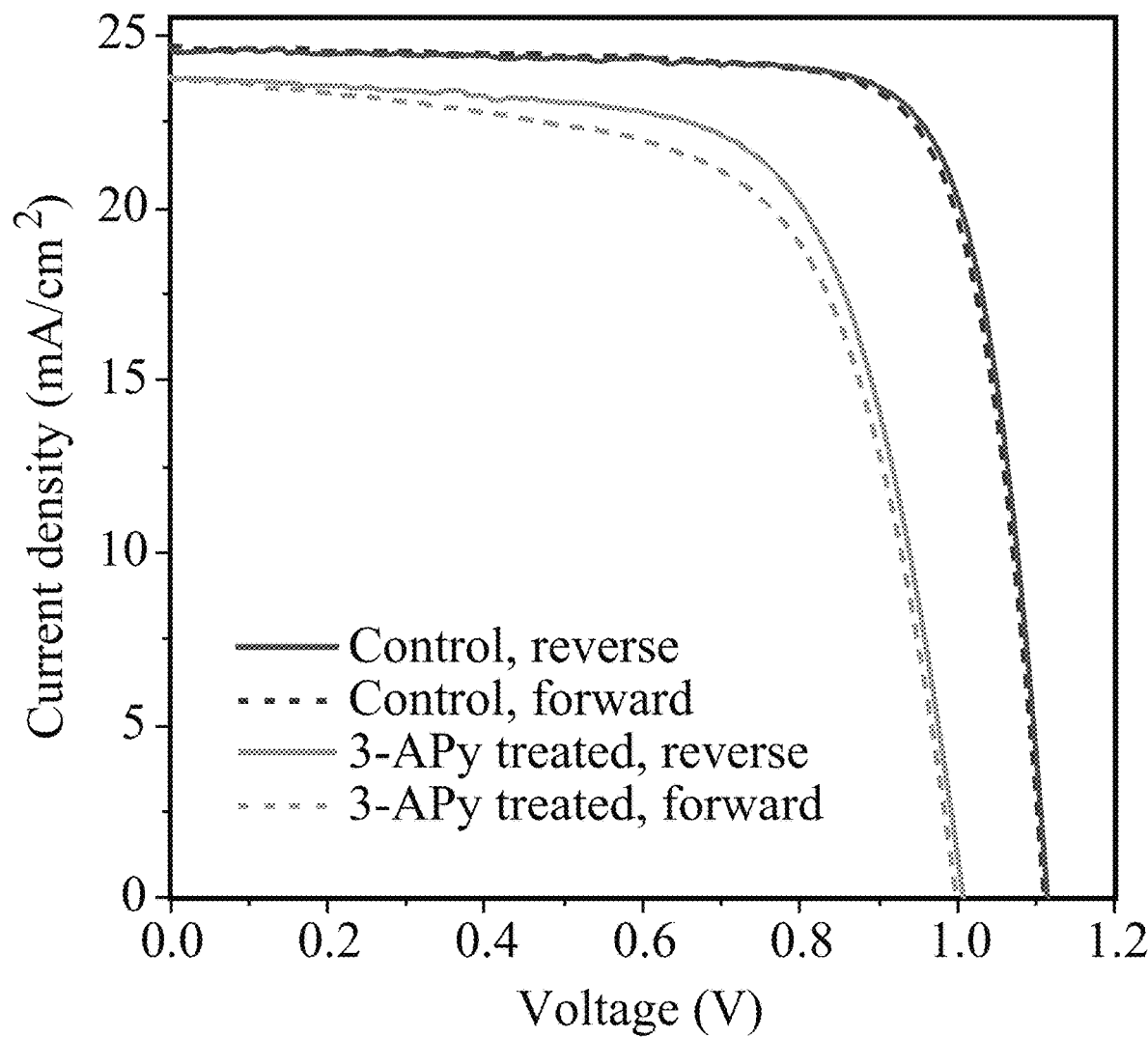
FIG. 26 illustrates J-V curves of n-i-p cells based on perovskite films without (control) and with (treated) 3-AP surface treatment, according to some embodiments of the present disclosure. The n-i-p device stack is glass/ITO/$SnO_2$/$FA_{0.93}MA_{0.07}PbI_3$/Spiro-OMeTAD/Au.
Figure 27:
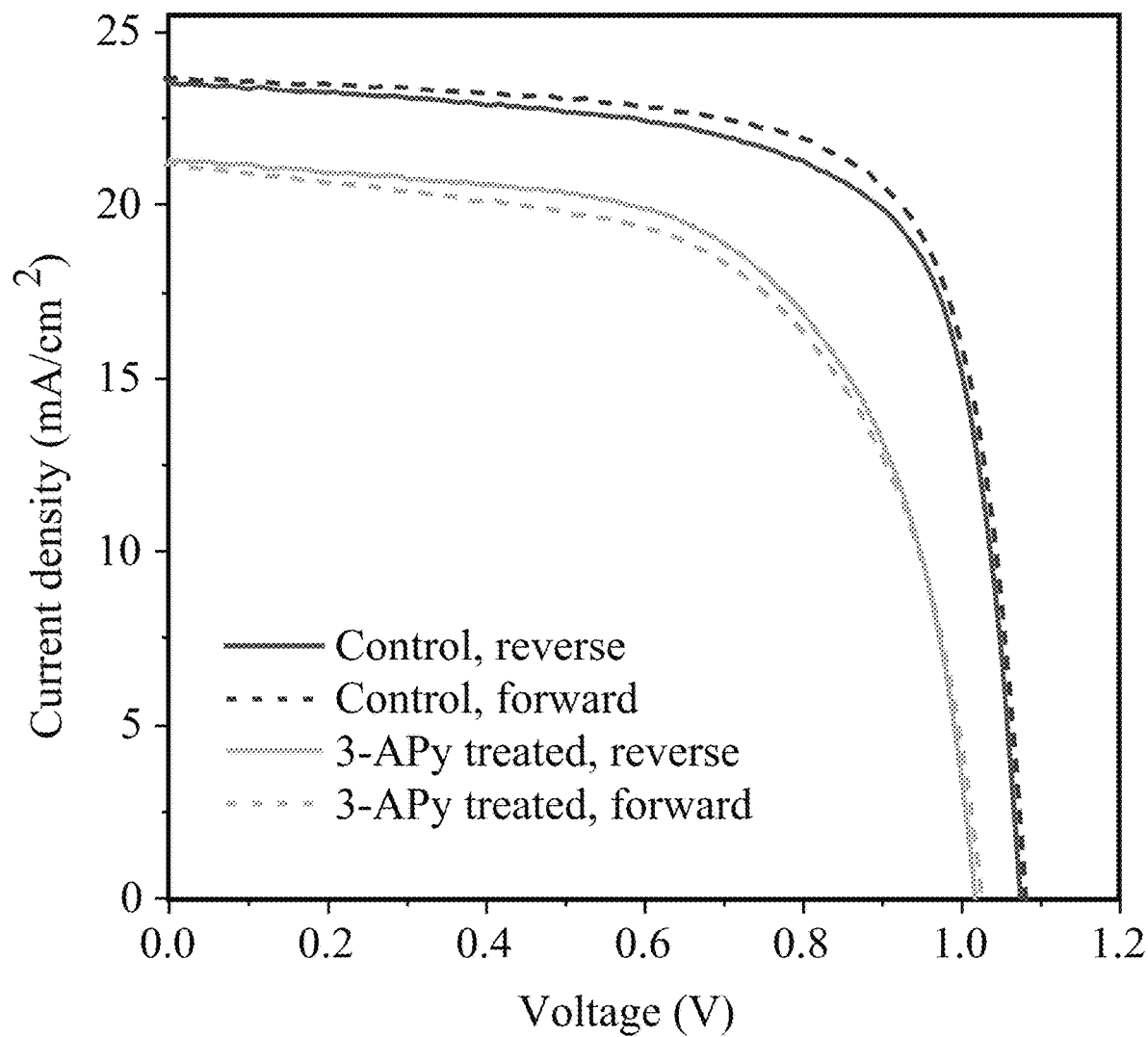
FIG. 27 illustrates J-V curves of n-i-p cells based on perovskite films without and with 3-APy treatment, according to some embodiments of the present disclosure. Device structure: glass/ITO/$SnO_2$/$Rb_{0.05}Cs_{0.05}MA_{0.05}FA_{0.85}Pb(I_{0.95}Br_{0.05})_3$/Spiro-OMeTAD/Au.

The operational reliability of encapsulated devices was also studied, aged under continuous light illumination at about 55° C. in ambient air (see FIG. 18B). These devices were biased with fixed resistance loads near the maximum power point during illumination. The target device retained about 87% of its initial PCE after 2428 hours, whereas the control kept only 76% of its initial PCE over 1368 hours. It is worth noting that surface treatment using the 3-APy-based iodide salt (3-APyI$_2$) (see Experimental section below) did not improve p-i-n device performance (see FIG. 25). In addition, 3-APy surface treatment in an n-i-p device (glass/ITO/SnO$_2$/FA$_{0.93}$MA$_{0.07}$PbI$_3$/Spiro-OMeTAD/Au) significantly decreased device performance (see FIG. 26 and FIG. 27). Taken together, these results suggest that treating a perovskite surface with an amine-functionalized pyridine, e.g., 3-APy, is an effective approach to significantly enhancing p-i-n PSC performance to new state-of-the-art levels of efficiency and operational reliability.

Figure 28:
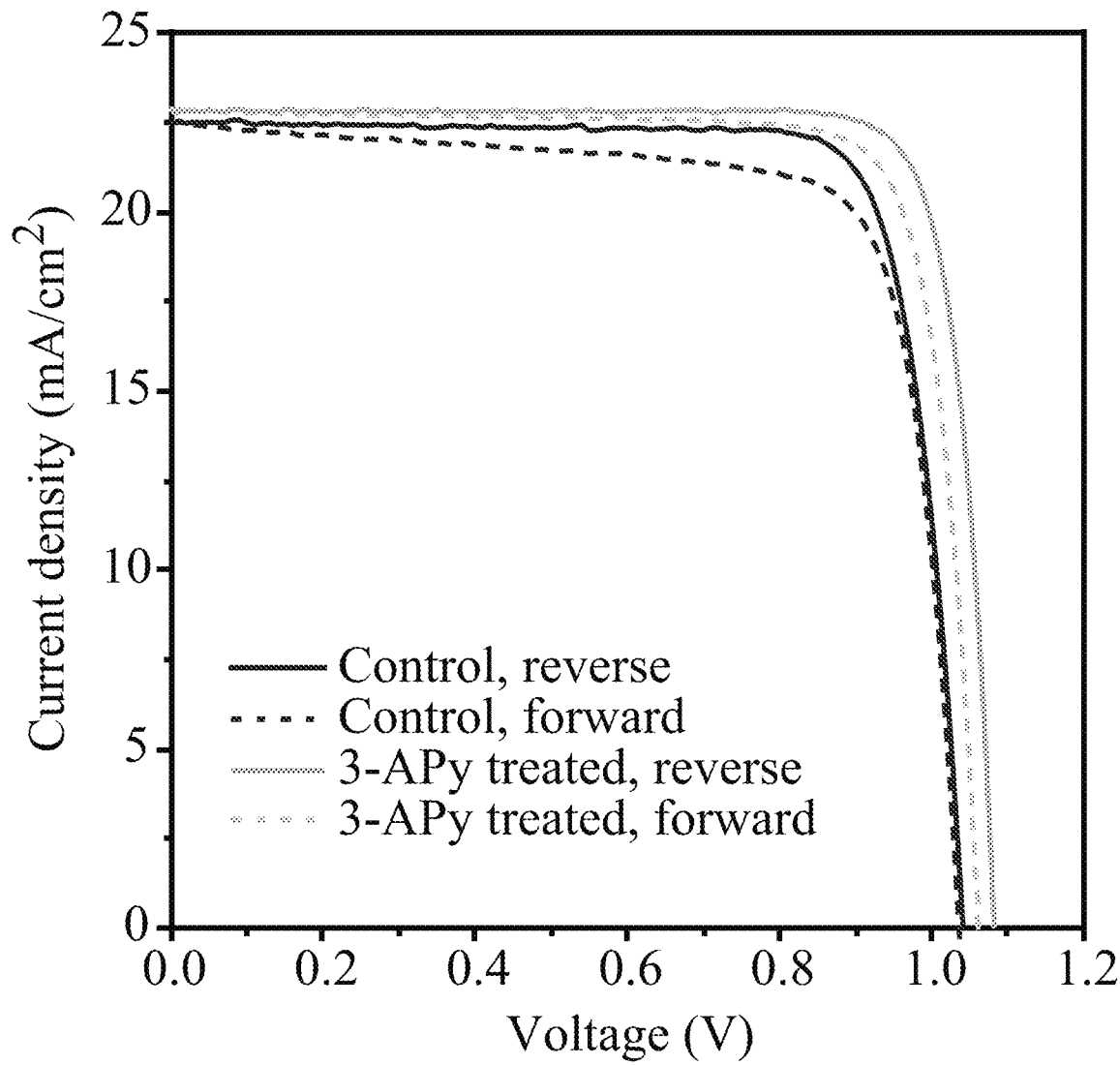
FIG. 28 illustrates J-V curves of devices without (control) and with 3-APy treatment, according to some embodiments of the present disclosure. The device structure is ITO/MeO-2PACZ/$Cs_{0.13}FA_{0.87}Pb(I_{0.95}Br_{0.05})_3$/$C_{60}$/BCP/Ag. The MA-free $Cs_{0.13}FA_{0.87}Pb(10.95Br_{0.05})_3$ perovskite has a bandgap of 1.63 eV.
Figure 29:
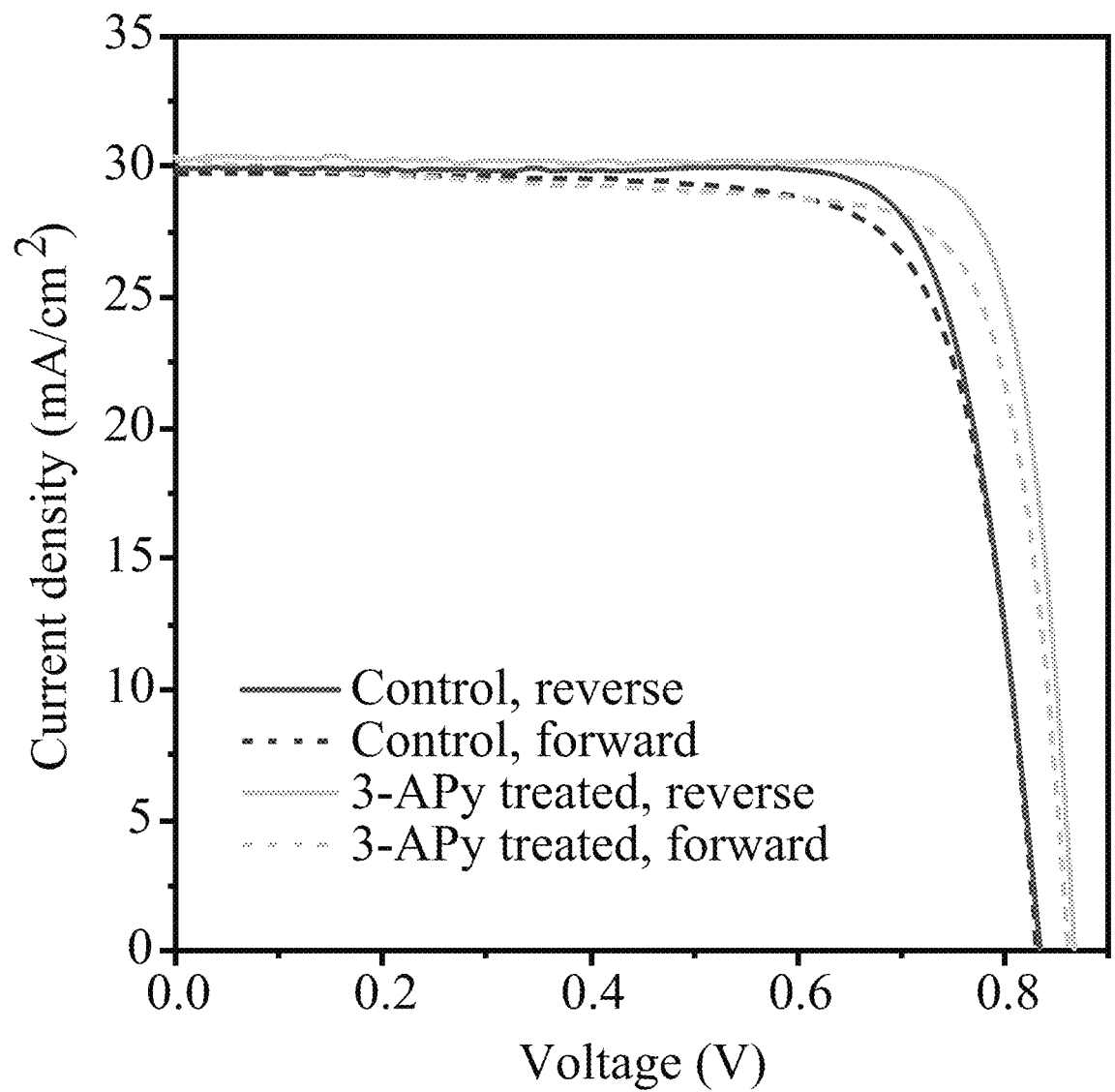
FIG. 29 illustrates J-V curves of devices without (control) and with 3-APy treatment, according to some embodiments of the present disclosure. The device structure is ITO/PEDOT:PSS/$FA_{0.6}MA_{0.4}Sn_{0.6}Pb_{0.43}$/$C_{60}$/BCP/Ag. The Sn—Pb-based $FA_{0.6}MA_{0.4}Sn_{0.6}Pb_{0.4}I_3$ perovskite has a bandgap of 1.25 eV.
Figure 30:
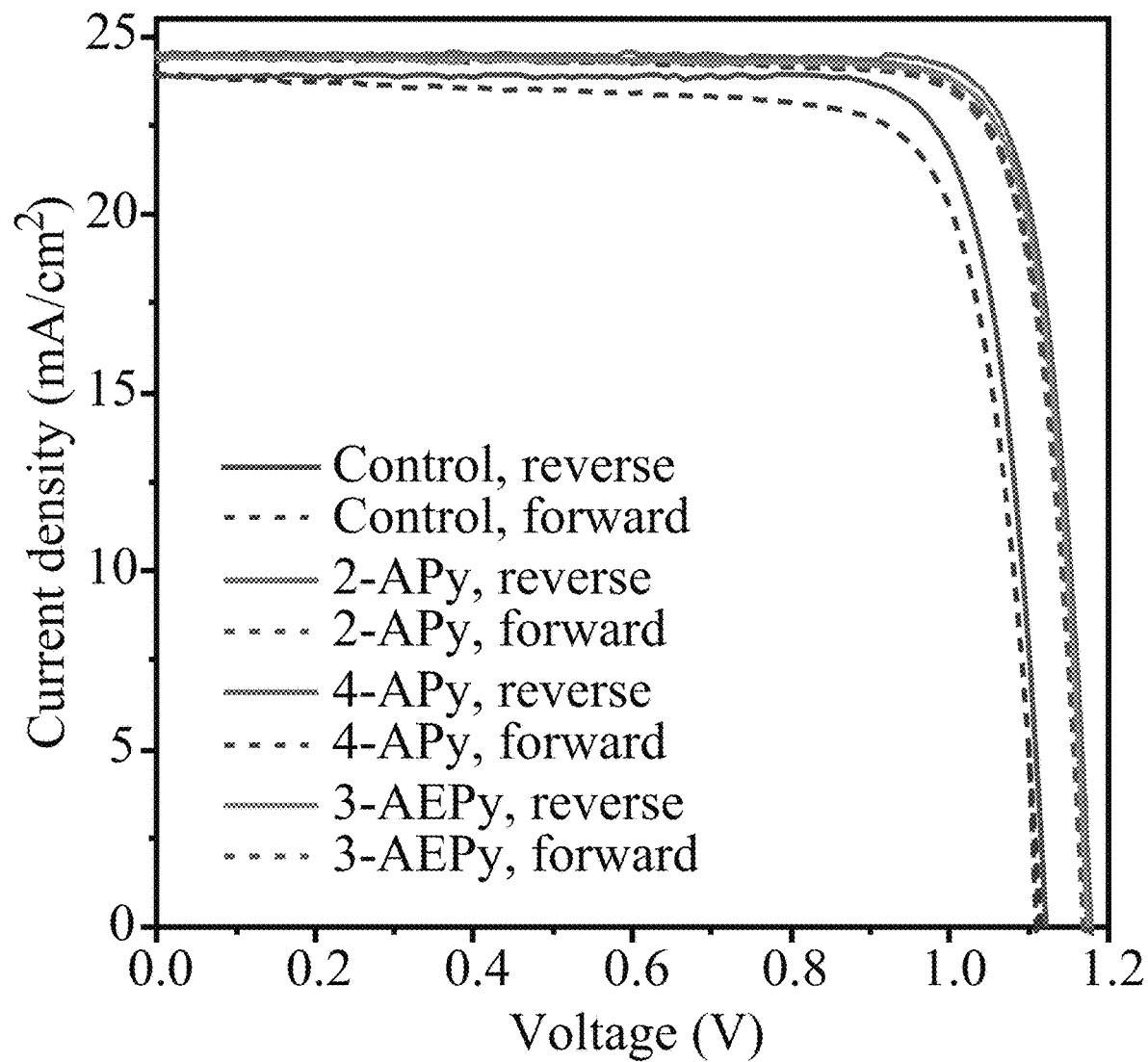
FIG. 30 illustrates J-V curves of devices without (control) and with surface treatment using a few different molecules (as indicated), including 2-APy (2-(aminomethyl)pyridine), 4-APy (4-(aminomethyl)pyridine), and 3-AEPy (3-(2-aminoethyl)pyridine), according to some embodiments of the present disclosure.

The surface treatments described above were found to work effectively for other FA-based perovskites (see FIGS. 28 and 29) as well as various 3-APy-related molecules (see FIG. 30) making the methodology described herein feasible as a general strategy for improving p-i-n perovskite-containing device performance. The performance metrics for FIGS. 28, 29, and 30 are summarized in Tables 6, 7, and 8, respectively. The abbreviations for each pyridine are as follows (see Scheme 1): 2-(aminomethyl)pyridine (2-APy), 3-(aminomethyl)pyridine (3-APy), 4-(aminomethyl)pyridine (4-APy), and 3-(2-aminoethyl)pyridine (3-AEPy).

TABLE 6

PV parameters of device J-V curve illustrated in FIG. 28.

| Scan | $V_{oc}$ (V) | $J_{sc}$ (mA/cm$^2$) | FF (%) | PCE (%) |
|---|---|---|---|---|
| Control, forward | 1.04 | 22.50 | 77.1 | 17.99 |
| Control, reverse | 1.04 | 22.48 | 81.5 | 19.09 |
| 3-APy treated, forward | 1.06 | 22.87 | 81.7 | 19.85 |
| 3-APy treated, reverse | 1.08 | 22.85 | 84.4 | 20.89 |

TABLE 7

PV parameters of device J-V curve illustrated in FIG. 29.

| Scan | $V_{oc}$ (V) | $J_{sc}$ (mA/cm$^2$) | FF (%) | PCE (%) |
|---|---|---|---|---|
| Control, forward | 0.83 | 29.80 | 75.6 | 18.72 |
| Control, reverse | 0.83 | 29.92 | 78.9 | 19.68 |
| 3-APy treated, forward | 0.86 | 30.36 | 76.7 | 20.06 |
| 3-APy treated, reverse | 0.87 | 30.36 | 82.7 | 21.75 |

TABLE 8

PV parameters of device J-V curve illustrated in FIG. 30.

| Scan | $V_{oc}$ (V) | $J_{sc}$ (mA/cm$^2$) | FF (%) | PCE (%) |
|---|---|---|---|---|
| Control, forward | 1.115 | 23.980 | 78.2 | 20.909 |
| Control, reverse | 1.122 | 23.912 | 82.4 | 22.107 |
| 2-APy treated, forward | 1.178 | 24.449 | 81.9 | 23.607 |
| 2-APy treated, reverse | 1.178 | 24.449 | 83.4 | 24.014 |
| 4-APy treated, forward | 1.172 | 24.433 | 83.0 | 23.767 |
| 4-APy treated, reverse | 1.176 | 24.526 | 84.4 | 24.361 |
| 3-AEPy treated, forward | 1.169 | 24.488 | 83.0 | 23.743 |
| 3-AEPy treated, reverse | 1.174 | 24.402 | 84.0 | 24.054 |

Figure 31:
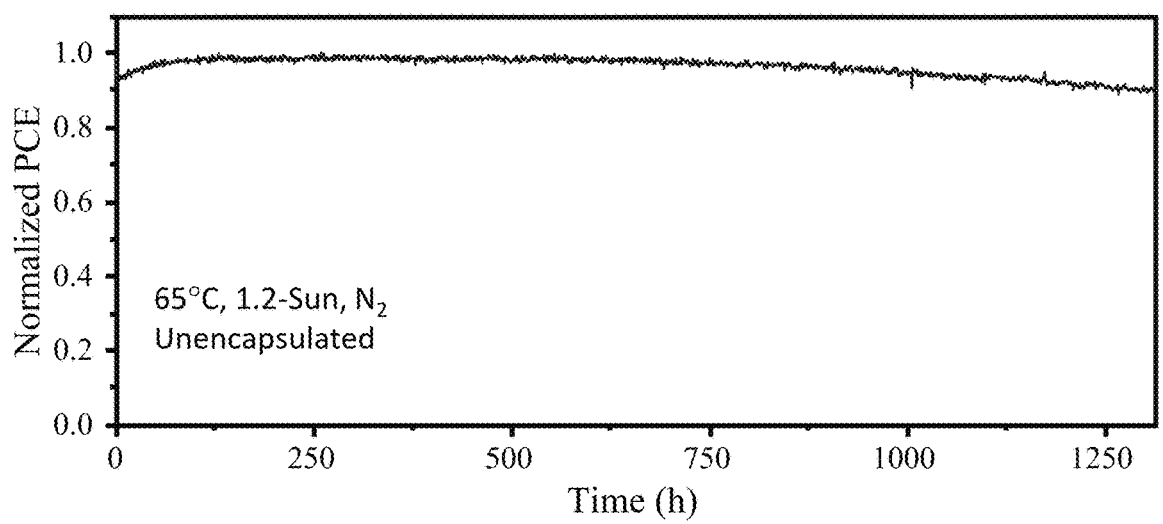
FIG. 31 illustrates (Panel A) Stability evolution of unencapsulated 3-APy-treated target device held at 65° C. under continuous 1.2-sun illumination in $N_2$, according to some embodiments of the present disclosure. After 1315 hours, the device retained 90% of its maximum PCE. (Panel B) Stability measurements of encapsulated device aged under 85% RH and 85° C. in the dark. After 850 hours, the device retained ~94% of its maximum PCE.
Figure 31:
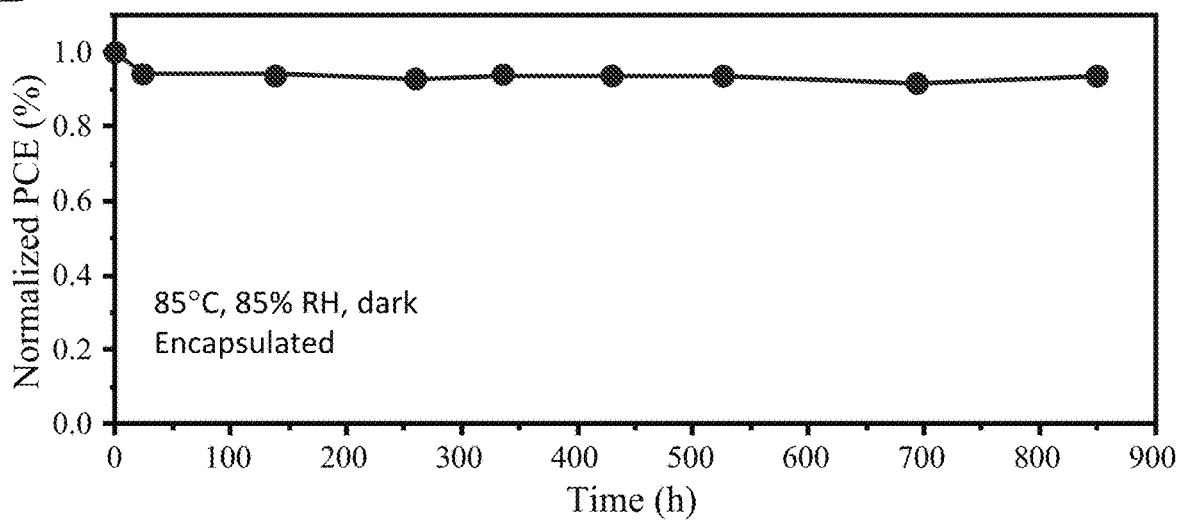

Finally, we investigated the operational reliability of encapsulated devices aged under continuous light illumination at ~55° C. in ambient air (see FIG. 18B). These devices were biased with fixed resistance loads near the maximum power point during illumination. The target device retained ~87% of its initial maximum PCE after 2428 hours, whereas the control kept only 76% over 1368 hours. We further examined the operation stability of unencapsulated target device at 65° C. under 1.2-sun continuous illumination in N$_2$ (ISOS-L-2I). The device retained 90% of its maximum PCE after 1315 hours (see Panel A of FIG. 31). Moreover, the damp heat (85° C. and 85% RH; ISOS-D-3) test showed that the device retained 94% of its maximum PCE after 850 hours (see Panel B of FIG. 31). Taken together, our results suggest that the reactive surface engineering using 3-APy is an effective approach to significantly enhance p-i-n PSC performance to new state-of-the-art levels of efficiency and operational reliability.

Experimental

Materials

RbI (99.99%), CsI (99.99%), PbI$_2$ (99.999%), and 3-APy were purchased from Sigma-Aldrich. Organic salts of FAI and MABr were purchased from Greatcell Solar Materials (Australia); PbBr$_2$ and MeO-2PACZ were purchased from Tokyo Chemical Industry (TCI). Dimethylformamide (DMF, 99.8%, anhydrous), dimethyl sulfoxide (DMSO, 99.9%, anhydrous), chlorobenzene (99.9%, anhydrous), and toluene (99.9%, anhydrous) were purchased from Sigma- Aldrich. For evaporating materials, LiF was purchased from Alfa Aesar, C60 was purchased from Lumtec, and BCP was purchased from Sigma-Aldrich. All chemicals were used directly as received.

Perovskite Precursor Solution

The perovskite composition is $Rb_{0.05}Cs_{0.05}MA_{0.05}FA_{0.85}Pb(I_{0.95}Br_{0.05})_3$. The perovskite precursor was prepared in mixed solvents of DMF:DMSO (volume ratio 4:1). The chemical molar ratio of CsI, RbI, FAI, $PbI_2$, $PbBr_2$, MABr is 0.05, 0.05, 0.85, 0.95, 0.05, 0.05, and the concentration is 1.5M.

Synthesis of 3-picolyamine Iodide Salt (3-APyI$_2$)

A mixture of 3-picolyamine (1.50 mL, 14.7 mmol) and ethanol (50 mL) was added to a round-bottom flask and cooled in an ice bath. While rapidly stirring, a slight excess of concentrated hydroiodic acid (4.75 mL, 31.0 mmol) was slowly added. After stirring for 1 h, a precipitate had formed and was removed from the mixture via vacuum filtration and washed with diethyl ether (4×50 mL). The product was then dried overnight at 55° C. under vacuum.

Device Fabrication

The patterned transparent conducting oxide glass substrates (ITO or FTO) were washed with acetone and isopropanol for 15 minutes each. After UV Ozone treatment for 15 minutes, a 0.5 mg/mL MeO-2PACZ SAM solution dissolved in ethanol was spin-coated on substrates at 3000 r.p.m. for 30 seconds in a nitrogen glovebox, followed by annealing at 100° C. for 10 minutes. The perovskite composition is $Rb_{0.05}Cs_{0.05}MA_{0.05}FA_{0.85}Pb(I_{0.95}Br_{0.05})_3$, and the initial stock perovskite solution is 1.5 M. In detail, CsI (19.5 mg), RbI (15.9 mg), MABr (8.4 mg), FAI (219.5 mg), $PbI_2$ (656.9 mg) and $PbBr_2$ (27.5 mg) were dissolved in 1 mL mixed solvent of DMF:DMSO (v:v=4:1), shaken by a Vortex Shaker for about 1-2 hours to make it fully dissolved. The 1.5-M perovskite precursor solution, without filtering and dilution, was used for preparing perovskite films. Perovskite precursor solutions prepared on the same day or aged within about two weeks (in sealed vials) can be used, without noticeable impact on device performance. We used SCS G3 Spin Coater (Model: G3P8) for spin-coating. No intentional acceleration steps were used during spin-coating; the target spin speed can be reached within 1 second. Specifically, the substrate was first spinning at 1000 rpm (within 1 second from 0 to 1000; no slow acceleration steps) for 10 seconds, and then at 3000 rpm (no slow acceleration steps) for 40 seconds. After 15 seconds into the second stage (3000 rpm, 40 s), 150 µL chlorobenzene antisolvent was dropped on top of the spinning substrates (~1 cm distance). The perovskite sample was subsequently annealed at 100° C. for 10 minutes. For 3-APy treatment, the diluted toluene solution of 3-APy (0.1 mM) was spin-coated on the perovskite surface at 5000 r.p.m. for 30 seconds, followed by annealing at 70° C. for 5 minutes. Afterward, samples were transferred to an Angstrom evaporator for LiF (1 nm)/C60 (30 nm)/BCP (6 nm)/Ag (100 nm) deposition. The device area by evaporation was 0.112 cm². Unless otherwise stated, the devices were masked with metal aperture masks (0.059 cm²) during the J-V measurement.

Characterization

The optical properties of the perovskite films were measured using UV-vis spectroscopy (Cary 6000i). The crystal structures of perovskite films were recorded using an X-ray diffractometer (D-Max 2200, Rigaku). The morphologies and microstructures of the perovskite films and cross-sectional structures of the solar cells were investigated using a Hitachi S-4800 scanning electron microscope. The J-V curves were measured in a nitrogen glovebox using a Newport Oriel Sol3A class solar simulator with a xenon lamp that was calibrated before use with a silicon cell under a KG2 filter. The SPOs of the devices were measured by monitoring the photocurrent density output evolution under the biased voltage set near the maximum power point. EQE measurements were performed in ambient air using a Newport Oriel IQE200 with monochromatic light focused on the device pixels and a chopper frequency of 37 Hz.

Kelvin Probe Force Microscopy (KPFM) Characterizations

KPFM measurements were performed on a D5000 atomic force microscope inside an Ar-filled glovebox. A Pt—Ir-coated silicon probe (PPP-EFM) was used in tapping mode. The plane-view samples were scanned in at least three random locations to ensure reliable measurements. The mapping contains 1024 pixels in the fast-scan axis and 256 lines in the slow-scan axis. The scan rate is 0.35 Hz.

X-Ray and Ultraviolet Photoelectron Spectroscopy (XPS and UPS) Measurement

XPS and UPS measurements were performed on a Kratos AXIS-Supra in the Surface Science Facility at the UC Irvine Materials Research Institute (IMRI). X-ray radiation was produced by a monochromatic Al Kα excitation centered at 1486.6 eV. UPS radiation was produced by ionizing helium I (energy 21.22 eV). XPS survey spectra were collected using a step size of 1 eV and pass energy of 160 eV; core-level spectra were collected using a step size of 0.1 eV and pass energy of 20 eV; and UPS spectra were conducted using a step size of 0.02 eV and pass energy of 10 eV. The electron binding energy scale was calibrated using the Fermi edge and core levels of gold and silver substrates cleaned with argon-ion bombardment. To ensure that important energetic information was preserved, UPS scans and I $3d_{5/2}$ low-power XPS (1.5 W versus 225 W) scans were conducted at the beginning of analysis, each on unanalyzed locations. To attempt to account for energetic shifts arising from the beam damage that is unavoidable in the high-power core-level scans, all core levels were shifted back such that their high-power I $3d_{5/2}$ peak (225 W, 0.5 min) overlapped with the low-power peak (1.5 W, 4 min). UPS spectra were numerically corrected for satellite peaks that arose from the polychromic He radiation. XPS peaks were fit using a Gaussian-Lorentzian peak-fitting algorithm with a Shirley background using the XPST package on Igor WaveMetrics. Work functions were determined using the intersection between the baseline and a linear fit to the SECO. VBMs were calculated using linear extrapolation of the valence band feature to the background signal on a semi-log plot.

Transient Reflectance (TR) Measurement

TR measurements were performed with a Coherent laser (800-nm fundamental beam, 1-kHz rep rate, 3-mJ/pulse, and 100-fs pulse width). The fundamental beam was split into a pump and probe pulse. The probe pulse was used to generate a white light supercontinuum via a sapphire crystal that was then sent through a delay line with a time scale up to 2.5 ns. The pump pulse was tuned using a Palitra Duo optical parametric amplifier (OPA) to obtain varying excitation wavelengths. The pump and probe pulses were aligned spatially onto the sample at an approximately 45° angle to the sample surface. A Helios ultrafast spectrometer was used for detection, with the spectrometer at a 90° angle to the incident pump and probe beams. The excitation density for all TR measurements was kept so that the initial number of photogenerated charge carriers directly after pump excitation did not exceed ~4×10$^{17}$ charge carriers/cm. A global fit analysis was performed on the measurements in accordance with previously reported protocols.

Time Resolved Microwave Conductivity (TRMC) Measurement

Perovskite target and control films were prepared in an identical manner to those used in devices, except onto precleaned 25×11×1-mm quartz plates (Technical Glass Products, Inc.). Microwave conductivity measurements were conducted using previously described protocols[3]. In brief, a 5-ns pulse width, 10-Hz laser at 643 nm was coupled into an X band resonant cavity to photo-generate carriers in each perovskite film, the power from which was measured before and after each measurement using a photothermal detector placed at the sample position and masked by the optical widow and waveguide sections when the sample was present. Each sample was positioned inside the microwave cavity such that excitation was always incident to the quartz side, and continuous nitrogen purge was applied to the cavity during all measurements. Neutral density filters were used to attenuate the beam power over one order of magnitude to below $10^{10}$ cm$^{-2}$ absorbed photon flux. For analysis, each sample's fraction of absorbed light was measured inside an integrating sphere diffuse reflectance accessory (Cary 7000i), whereas the beam attenuation profiles of the filter combinations were extracted from the measured specular transmission data for each neutral density filter at the excitation wavelength.

Photoluminescence (PL) Characterization

Excitation at 632.8 nm (HeNe laser) was used to measure PL emission spectra. A Princeton Instruments HRS300 spectrograph with Si CCD (Pixis F100) and InGaAs (PyLoN IR) detectors was used. The spectral response of the detectors and spectrometer system was corrected using calibration sources (IntelliCal for vis and IR ranges, Princeton Instruments) and placing calibration sources at the sample position. Excitation beam size was determined with a CCD camera. Data was measured in absolute photon numbers using Spectralon reflectance standards (LabSphere Inc.) and assuming that one-sun equivalent fluence for 1.53-eV bandgap is about $1.73 \times 10^{17}$ photons/(cm$^2$s).

Density Functional Theory Calculations

The structural relaxation and static self-consistent energy calculations are performed by CP2K package at the PBE level A 6-layer FAPbI$_3$ perovskite slab model is constructed for the cases before and after 3-APy treatment with typical (001) orientation selected on the surface, which is terminated by FAI. The double-ξ valence polarization basis set trained from optimized molecular geometries is used in the calculations with only the gamma point considered, and the energy cutoff of 550 Ry is set.

Mass Spectrometry (MS) Measurements

The sample was diluted 1:1000 v/v in acetonitrile and analyzed with a Thermo Scientific Q-Exactive mass spectrometer equipped with a heated electrospray ionization (HESI) source. The sample was directly infused via a syringe pump at 10 μL/min, with the following source conditions: Sheath gas flow—10 arbitrary units, Aux gas flow—0 arbitrary units, spray voltage—+2.9 kV, capillary temperature—320° C., S-lens RF level—50 V, Aux gas heater—0° C. Spectra were collected with a resolution of 140,000 at m/z 200 and an AGC target of 1 million. Full scan spectra were collected from m/z 50-700 and MS/MS data were collected by quadrupole isolation of m/z 136±2 and fragmented with Normalized Collision Energy (NCE) values of 10 and 60 to yield the full fragmentation profile. Quasi-MS data was collected by inducing fragmentation in the source region, and isolating m/z 92±2, followed by fragmentation at 60 NCE. Molecular formula assignments were based on accurate mass and $^{13}$C isotopic fine structure.

Examples

Example 1. A composition comprising a perovskite having a surface, wherein the surface comprises a pyridine compound.

Example 2. The composition of Example 1, wherein the pyridine compound comprises an amine functional group.

Example 3. The composition of either Example 1 or Example 2, wherein: the pyridine compound is selected from the group consisting of N(2-methylpyridine)A, N(3-methylpyridine)A, N(4-(methyl)pyridine)A, N(3-(2-ethyl)pyridine)A, and N(4-(2-ethyl)pyridine)A, A comprises a cation, and the pyridine compound has an ionic radius larger than 10 Å.

Example 4. The composition of any one of Examples 1-3, wherein A is selected from the group consisting of methylammonium, ethylammonium, diethylammonium, guanidinium, or formamidinium.

Example 5. The composition of any one of Examples 1-4, wherein the pyridine compound comprises at least one of N(2-methylpyridine)formamidinium, N(3-methylpyridine)formamidinium, N(4-(methyl)pyridine)formamidinium, N(3-(2-ethyl)pyridine)formamidinium, or N(4-(2-ethyl)pyridine)formamidinium.

Example 6. The composition of any one of Examples 1-5, wherein the pyridine compound comprises at least one of

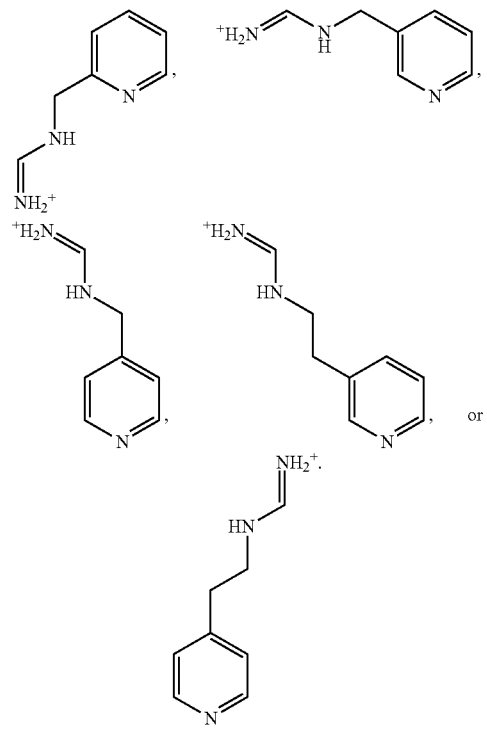

Example 7. The composition of any one of Examples 1-6, wherein the presence of the pyridine compound is determined by proton nuclear magnetic resonance ($^1$H-NMR) spectroscopy.

Example 8. The composition of any one of Examples 1-7, wherein the surface is n-type as determined by at least one of X-ray photoelectron spectroscopy (XPS) or ultraviolet photoelectron spectroscopy (UPS).

Example 9. The composition of any one of Examples 1-8, wherein the perovskite is shaped as a layer.

Example 10. The composition of any one of Examples 1-9, wherein the layer has a thickness between 50 nm and 5000 nm.

Example 11. The composition of any one of Examples 1-10, wherein the thickness is between 30 nm and 1000 nm.

Example 12. The composition of any one of Examples 1-11, wherein the pyridine compound is present at the surface of the perovskite layer as a layer.

Example 13. The composition of any one of Examples 1-12, wherein pyridine compound layer has a thickness greater than 5 Å.

Example 14. The composition of any one of Examples 1-13, wherein the surface has a surface roughness of less than or equal to 1 nm, as measured over a length scale between 10 nm and 20 nm, as measured by atomic force microscopy (AFM).

Example 15. The composition of any one of Examples 1-14, wherein the surface has a surface potential fluctuation of less than 20 mV, as measured over a length scale between 10 nm and 20 nm, as measured by Kelvin probe force microscopy (KPFM).

Example 16. The composition of any one of Examples 1-15, wherein the perovskite comprises at least one of a three-dimensional (3-D) network, a two-dimensional (2-D) network, a one-dimensional (1-D), or a zero-dimensional (0-D) network.

Example 17. The composition of any one of Examples 1-16, wherein the perovskite comprises $ABX_3$, B comprises a second cation, and X comprises an anion.

Example 18. The composition of any one of Examples 1-17, wherein A further comprises at least one of cesium or rubidium.

Example 19. The composition of any one of Examples 1-18, wherein B comprises at least one of lead or tin.

Example 20. The composition of any one of Examples 1-19, wherein X comprises a halide.

Example 21. The composition of any one of Examples 1-20, wherein: the perovskite comprises by $Rb_{1-x-y-z}Cs_xMA_yFA_zPb[I_{1-v-w}Br_vCl_w]_3$, each of v, w, x, y, and z are between zero and one, inclusively.

Example 22. The composition of any one of Examples 1-21, wherein the perovskite has a composition approximately equal to $Rb_{0.05}Cs_{0.05}MA_{0.05}FA_{0.85}Pb[I_{0.95}Br_{0.05}]_3$.

Example 23. A device comprising: a perovskite layer; and an electron transfer layer (ETL), wherein: the surface of the perovskite layer forms an interface with the ETL, the surface comprises a pyridine compound, and the surface has a surface roughness less than or equal to 1 nm, as measured over a length scale between 10 nm and 20 nm, as measured by atomic force microscopy (AFM).

Example 24. The device of Example 23, wherein the surface is characterized by surface potential fluctuations of less than 20 mV, as measured over a length scale between 10 nm and 20 nm.

Example 25. The device of either Example 23 or Example 24, further comprising: a hole transport layer (HTL), wherein: the perovskite layer is positioned between the HTL and the ETL.

Example 26. The device of any one of Examples 23-25, wherein the ETL comprises at least one of one of LiF, $C_{60}$ fullerene, bathocuproine (BCP), or $SnO_2$.

Example 27. The device of any one of Examples 23-26, wherein the ETL comprises at least one of a self-assembling monolayer (SAM), poly[bis(4-phenyl)(2,4,6-trimethylphenyl)amine (PTAA), poly(N,N'-bis-4-butylphenyl-N,N'-bisphenyl)benzidine (Poly-TPD), or nickel oxide (NiO).

Example 28. The device of any one of Examples 23-27, wherein the SAM comprises at least one of [2-(3,6-dimethoxy-9H-carbazol-9-yl)ethyl]phosphonic acid (MeO-2PACZ), ([4-(3,6-dimethyl-9H-carbazol-9-yl)butyl]phosphonic acid) (Me-4PACZ), (4-(4-(3,6-dimethoxy-9H-carbazol-9yl)butyl)phosphonic acid (MeO-4PACZ), or ([2-(9H-carbazol-9-yl)ethyl]phosphonic acid (2PACZ).

Example 29. A method comprising: treating a surface of a perovskite layer with an amine-functionalized pyridine, wherein: the treating reduces at least one of the surface roughness of the surface as measured by atomic force microscopy (AFM) or the surface potential fluctuations as measured by Kelvin probe force microscopy (KPFM).

Example 30. The method of Example 29, wherein the surface roughness is less than or equal to 1 nm, as measured over a length scale between 10 nm and 20 nm.

Example 31. The method of either Example 29 or Example 30, wherein the surface potential fluctuations are less than 20 mV, as measured over a length scale between 10 nm and 20 nm.

Example 32. The method of any one of Examples 29-31, wherein the treating comprises contacting the surface with at least one of a solution, a vapor, or a gas comprising the amine-functionalized pyridine.

Example 33. The method of any one of Examples 29-32, wherein the amine-functionalized pyridine comprises at least one of 3-(aminomethyl)pyridine (3-APy), 4-(aminomethyl)pyridine (4-APy), 3-(2-aminoethyl)pyridine (3-AEPy), or 4-(2-aminoethyl)pyridine (4-AEPy).

Example 34. The method of any one of Examples 29-33, wherein the perovskite layer has an A-site cation that comprises at least one of an alkylammonium or formamidinium.

Example 35. The method of any one of Examples 29-34, wherein at least a portion of the A-site cation reacts with the amine-functionalized pyridine as determined by X-ray photoelectron spectroscopy (XPS).

Example 36. The method of any one of Examples 29-35, further comprising depositing a charge transport layer onto the perovskite layer.

Example 37. The method of any one of Examples 29-36, wherein: the contacting comprises applying a solution comprising the amine-functionalized pyridine to the perovskite layer, and the contacting forms a layer of the solution the surface of the perovskite layer.

Example 38. The method of any one of Examples 29-37, wherein the solution includes a solvent.

Example 39. The method of any one of Examples 29-38, wherein the amine-functionalized pyridine is present in the solution at a concentration between 0.01 mM and 1.0 mM.

Example 40. The method of any one of Examples 29-39, further comprising, after the contacting: heating the perovskite layer and the layer of the solution, wherein: the heating removes the solvent.

Example 41. The method of any one of Examples 29-40, wherein the heating is performed at a temperature between 30° C. and 100° C.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A composition comprising:
   a perovskite comprising a stoichiometry of $ABX_3$; and
   a pyridine compound, wherein:
   A is a first cation comprising formamidinium, B is a second cation, and X is an anion,
   the perovskite is in a form of a layer comprising a thickness and a surface,
   the pyridine compound is located primarily at the surface of the layer, and
   the pyridine compound comprises at least one of

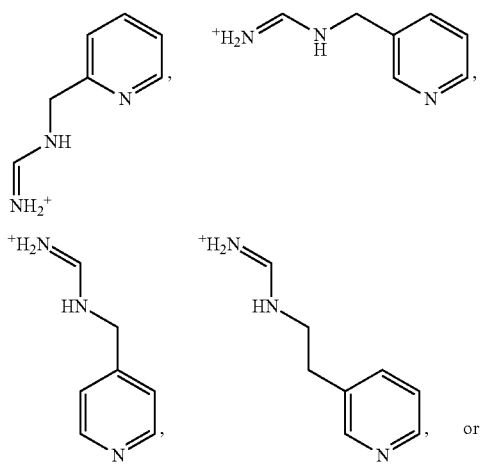

or

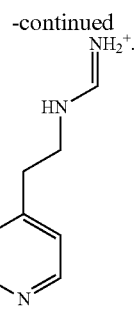

2. The composition of claim 1, wherein A further comprises at least one of methylammonium, ethylammonium, diethylammonium, guanidinium, cesium or rubidium.

3. The composition of claim 1, wherein the layer has a thickness between 50 nm and 5000 nm.

4. The composition of claim 3, wherein the thickness is between 30 nm and 1000 nm.

5. The composition of claim 3, wherein the pyridine compound is present as a layer positioned on the layer of the perovskite.

6. The composition of claim 5, wherein the layer of the pyridine compound has a thickness greater than 5 Å.

7. The composition of claim 1, wherein the surface has a surface roughness of less than or equal to 1 nm, as measured over a length scale between 10 nm and 20 nm.

8. The composition of claim 1, wherein the surface has a surface potential fluctuation of less than 20 mV, as measured over a length scale between 10 nm and 20 nm.

9. The composition of claim 1, wherein B comprises at least one of tin or lead.

10. The composition of claim 1, wherein X comprises a halogen.

11. A device comprising:
    a pyridine compound;
    a perovskite layer comprising a stoichiometry of $ABX_3$; and
    a charge transport layer (CTL), wherein:
    the surface of the perovskite layer forms an interface with the CTL,
    A is a first cation comprising formamidinium, B is a second cation, and X is an anion,
    the perovskite layer has a layer having a thickness and a surface,
    the pyridine compound is located primarily at the interface,
    the surface has a surface roughness less than or equal to 1 nm, as measured over a length scale between 10 nm and 20 nm, and
    the pyridine compound comprises at least one of

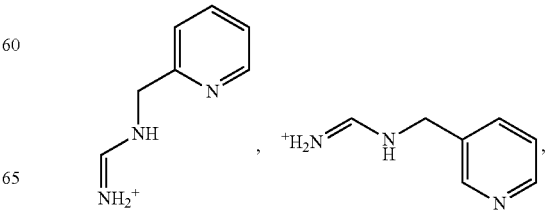

-continued

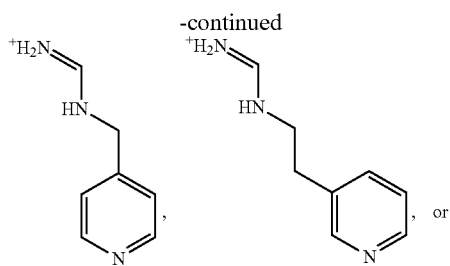

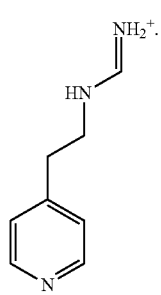

12. The device of claim 11, wherein the surface is characterized by surface potential fluctuations of less than 20 mV.

13. A method comprising:

treating a surface of a perovskite layer with an amine-functionalized pyridine, wherein:

the perovskite layer comprises a stoichiometry of $ABX_3$:

A is a first cation comprising formamidinium, B is a se and cation, and X is an anion, the treating converts the amine-functionalize pyridine to a pyridine compound comprising at least one of

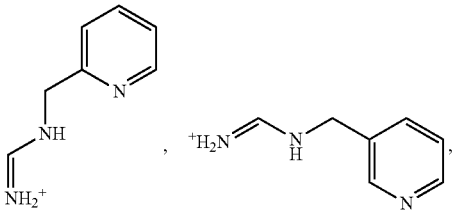

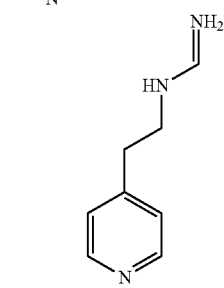

the pyridine compound is located primarily at the surface of the perovskite layer, and the treating reduces at least one of a surface roughness of the surface or a surface potential fluctuation.

14. The method of claim 13, wherein the surface roughness is less than or equal to 1 nm, as measured over a length scale between 10 nm and 20 nm.

* * * * *